US007259943B2

(12) United States Patent
Furukawa et al.

(10) Patent No.: US 7,259,943 B2
(45) Date of Patent: Aug. 21, 2007

(54) MAGNETIC HEAD HAVING A CURRENT-PERPENDICULAR-TO-THE-PLANE STRUCTURE AND USING A MAGNETO-RESISTIVE EFFECT

(75) Inventors: Akio Furukawa, Miyagi (JP); Yoshihiko Kakihara, Kanagawa (JP)

(73) Assignee: Sony Corporation, Tokyo (JP)

( * ) Notice: Subject to any disclaimer, the term of this patent is extended or adjusted under 35 U.S.C. 154(b) by 278 days.

(21) Appl. No.: 10/826,127

(22) Filed: Apr. 16, 2004

(65) Prior Publication Data
US 2004/0257721 A1 Dec. 23, 2004

Related U.S. Application Data

(60) Division of application No. 10/218,247, filed on Aug. 14, 2002, which is a continuation-in-part of application No. PCT/JP01/09734, filed on Nov. 7, 2001.

(30) Foreign Application Priority Data
Nov. 8, 2000 (JP) ............................ P2000-340636

(51) Int. Cl.
*G11B 5/39* (2006.01)
(52) U.S. Cl. .................................... 360/324.2
(58) Field of Classification Search ............. 360/324.1, 360/324.11, 324.12, 324.2
See application file for complete search history.

(56) References Cited

U.S. PATENT DOCUMENTS 5,729,410 A * 3/1998 Fontana et al. .......... 360/324.2
6,108,177 A * 8/2000 Gill ....................... 360/324.12
6,157,524 A * 12/2000 Nakazawa et al. ...... 360/324.12
6,262,869 B1 * 7/2001 Lin et al. ................ 360/324.11

FOREIGN PATENT DOCUMENTS

| DE | 19848776 | 4/1999 |
|---|---|---|
| JP | 10-162327 | 6/1998 |
| JP | 2000-216456 | 8/2000 |
| JP | 2000-228004 | 8/2000 |
| KR | 1999-037273 | 5/1999 |

* cited by examiner

*Primary Examiner*—Brian E. Miller
(74) *Attorney, Agent, or Firm*—Sonnenschein Nath & Rosenthal LLP

(57) ABSTRACT

A magnetic head using magnetoresistive effect comprising a magnetic sensing portion formed of a magnetoresistive effect element. The magnetic sensing portion includes a lamination layer structure portion which includes at least a free layer, a fixed layer made of a ferromagnetic material, an antiferromagnetic layer and a spacer layer interposed between the free layer and the fixed layer are laminated with each other. The lamination layer structure portion includes a magnetic flux introducing layer. The lamination layer structure portion has at its lamination layer direction opposing side surfaces formed of one flat surface or continuous one curved surface over at least the free layer, the spacer layer and the fixed layer. A hard magnetic layer for maintaining a magnetic stability of the free layer is disposed in direct contact with the opposing surfaces or through an insulating layer.

7 Claims, 38 Drawing Sheets

MAGNETIC HEAD HAVING A CURRENT-PERPENDICULAR-TO-THE-PLANE STRUCTURE AND USING A MAGNETO-RESISTIVE EFFECT

RELATED APPLICATION DATA

The present application claims priority to Japanese Application No. P2000-340636 filed Nov. 8, 2000 and is a divisional of U.S. application Ser. No. 10/218,247 filed Aug. 14, 2002 which is a continuation-in-part of PCT/JP01/09734 filed Nov. 7, 2001, all of which are incorporated herein by reference to the extent permitted by law.

TECHNICAL FIELD

The present invention relates to a magneto-resistive effect element (MR element) for detecting an external magnetic field and particularly relates to a magnetic head using magneto-resistive effect, that is, a magnetic head using magneto-resistive effect including a GMR (Giant Magneto-resistive) element having a spin-valve type magneto-resistive effect element (SVMR) configuration or an MR element having a tunnel type MR (TMR) configuration having a tunnel barrier film as a magnetic sensing portion and a manufacturing method thereof.

BACKGROUND ART

A spin-valve type magneto-resistive effect element or an MR element having a tunnel type MR (TMR) configuration including a tunnel barrier film includes a lamination layer structure portion in which a free layer made of a soft magnetic material of which the magnetization is rotated in response to an external magnetic field, a fixed layer made of a ferromagnetic material, an antiferromagnetic layer for fixing the magnetization of this fixed layer and a nonmagnetic conductive layer or tunnel barrier layer interposed between the free layer and the fixed layer are laminated with each other.

In this configuration, the magneto-resistive effect element having a so-called CIP (Current In Plane) type configuration in which a sense current, i.e., a detection current for detecting the change of resistance flows through the plane direction of the lamination layer structure portion inevitably needs a relatively large width, i.e., a large area in order to obtain a predetermined conducting sectional area by a cross-section in the film thickness direction.

Further, in the case of the CIP configuration, since upper and lower portions are sandwiched by insulating materials, heat radiation property is poor and hence there arises a problem of a reliability such as a risk in which the films will be fused when the magneto-resistive effect element or the magnetic head using magneto-resistive effect is being continuously used during a long period of time.

On the other hand, the magneto-resistive effect element has a so-called CPP (Current Perpendicular to Plane) type configuration in which a sense current flows through the lamination layer direction of the above-mentioned lamination layer structure portion, i.e., in the direction perpendicular to the lamination layer film can decrease its area. In a magnetic head, for example, since its magnetic sensing portion can be made compact in size, the whole of the magneto-resistive effect element can be reduced in size. In accordance therewith, this becomes advantageous in increasing a recording density.

Moreover, since the conducting electrodes are disposed at both surfaces of the lamination layer structure portion, this magneto-resistive effect type element is excellent in heat radiation property, can be operated stably and is highly reliable.

In the GMR effect element having the SVMR configuration or the MR effect element having the TMR configuration, the hard magnetic layer which is magnetized in the predetermined direction is disposed in order to maintain the magnetic stability of the free layer. This hard magnetic layer can cancel a magnetic domain produced at the end portion of the free layer and can suppress a Barkhausen noise due to discontinuity of magnetization rotation by a magnetic domain existing at the end portion of the free layer when an external magnetic field, i.e., a signal magnetic field from a magnetic recording medium is introduced into this free layer.

Since a hard magnetic layer having a high electric conductivity generally is used as this hard magnetic layer, in general, in the CPP type magnetic head, the hard magnetic layer is disposed so as to oppose only the free layer. This free layer is projected to the side of other lamination film having a conductivity comprising the lamination layer structure portion. In this projected portion, the free layer is brought in contact with the hard magnetic layer so that the occurrence of a leakage of a sense current which directly flows through this hard magnetic layer to other lamination layer film having a conductivity bypassing the free layer can be avoided. Thus, it is possible to avoid a magneto-resistive conversion efficiency from being lowered due to this leakage current.

However, as described above, when the width of the free layer is made large, since the width of the free layer is increased, the width of the magneto-resistive effect element cannot be reduced sufficiently and the external magnetic field cannot be concentrated sufficiently. Then, there arises a problem in which an efficiency of a magneto-resistive effect cannot be improved sufficiently.

The present invention is to provide a magnetic head using magneto-resistive effect having fundamentally an SVMR configuration or a TMR configuration and a manufacturing method thereof in which the above-mentioned disadvantages can be removed.

DISCLOSURE OF INVENTION

A magneto-resistive effect element according to the present invention has an SVMR or TMR lamination layer structure portion in which at least a free layer made of a soft magnetic material of which the magnetization is rotated in response to an external magnetic field, a fixed layer made of a ferromagnetic material, an antiferromagnetic layer for fixing the magnetization of this fixed layer, a spacer layer interposed between the free layer and the fixed layer, i.e., nonmagnetic conductive layer or a tunnel barrier layer are laminated with each other. In particular, the lamination layer structure portion has opposing side surfaces of one plane or continuous one surface formed over at least the free layer, the spacer layer and the fixed layer along its lamination layer direction.

Then, a hard magnetic layer of high resistance or low resistance for maintaining a magnetic stability of the free layer, i.e., a hard magnetic layer which is magnetized in order to apply a bias magnetic field to the free layer is disposed in direct contact with these opposing side surfaces or through an insulating layer.

Then, a sense current flows through nearly the lamination layer direction of the lamination layer structure portion comprising this SVMR or TMR, and an external magnetic field is applied to the direction extending along the plane direction of its lamination layer structure portion and in the direction substantially extending along the above-mentioned opposing side surfaces.

Moreover, the magneto-resistive effect element according to the present invention may have a dual type lamination layer structure portion in which SVMRs or TMRs are formed at both surfaces of a common free layer.

Specifically, in this case, the magneto-resistive effect element according to the present invention may have the lamination layer structure portion in which first and second fixed layers made of ferromagnetic materials, first and second antiferromagnetic layers for fixing the magnetizations of the fixed layers and first and second spacer layers interposed between the free layer and the above-described first and second fixed layers, i.e., nonmagnetic conductive layers or tunnel barrier layers are laminated with each other at both surfaces of a free layer made of a soft magnetic material of which the magnetization is rotated in response to an external magnetic field.

This lamination layer structure portion has a configuration in which opposing side surfaces of one flat surface or a continuous one curved surface are formed over at least the free layer, the first and second spacer layers disposed across this free layer and the first and second fixed layers in its lamination layer direction.

Then, a hard magnetic layer of high resistance or low resistance for maintaining a magnetic stability of the free layer is disposed in direct contact with these opposing side surfaces or through an insulating layer.

Then, a sense current flows nearly the lamination layer direction of the lamination layer structure portion having this SVMR configuration or TMR configuration, and the external magnetic field is applied to the direction extending along the plane direction of the lamination layer structure portion and in the direction extended substantially along the above-mentioned opposing side surfaces.

In a magnetic head using magneto-resistive effect according to the present invention, a magnetic sensing portion which generates the change of resistance by a signal magnetic field introduced from a magnetic recording medium has the configuration of each magneto-resistive effect element based upon the above-mentioned SVMR configuration or TMR configuration.

Then, in the magnetic heads according to the present invention, a free layer of a lamination layer structure portion which comprises the above-mentioned magnetic sensing portion is formed as a magnetic layer for introducing an external magnetic field and one end of the magnetic layer is opposed to a surface which is brought in contact with or which is opposed to a magnetic recording medium.

Alternatively, there is provided a side surface which crosses the side surface in which the hard magnetic layer is disposed and which also crosses the lamination layer direction, and this side surface is opposed to a surface which is directly brought in contact with or which is opposed to a magnetic recording medium.

A manufacturing method according to the present invention is a method of manufacturing a magneto-resistive effect element or a magnetic head using magneto-resistive effect according to the present invention. This magneto-resistive effect element or a magnetic sensing portion including this magneto-resistive effect element is made by the following method.

Specifically, a manufacturing method according to the present invention comprises the steps of a lamination layer film deposition process in which at least a free layer made of a soft magnetic material of which the magnetization is rotated in response to an external magnetic field, a fixed layer made of a ferromagnetic material, an antiferromagnetic layer for fixing the magnetization of this fixed layer and a spacer layer interposed between the free layer and the fixed layer, i.e., a nonmagnetic conductive layer or a tunnel barrier layer are deposited on a substrate to form a lamination layer deposited film, a patterning process in which a lamination layer structure portion in which opposing side surfaces are comprised of one plane or continuous one curved surface is formed by continuously patterning at least the above-described free layer and the above-described fixed layer with the same mask and in which side end faces of the free layer and the fixed layer are opposed to the side surface of the lamination layer structure portion and a process in which a hard magnetic layer of high resistance or low resistance for maintaining a magnetic stability of the free layer is formed in direct contact with the opposing side surfaces or through an insulating layer, thereby comprising the magneto-resistive effect element or the magnetic head including the magnetic sensing portion formed of this magneto-resistive effect element.

Further, a manufacturing method according to the present invention comprises a film deposition process in which at least a lamination layer deposited film of first and second fixed layers made of ferromagnetic materials, first and second antiferromagnetic layers for fixing the magnetizations of these fixed layers and first and second spacer layers interposed between the free layer and the first and second fixed layers, i.e., nonmagnetic conductive layers or tunnel barrier layers is deposited on a substrate across both surfaces of a free layer made of a soft magnetic material of which the magnetization is rotated in response to an external magnetic field is deposited on a substrate, a patterning process in which a lamination layer structure portion in which opposing side surfaces are comprised of one plane or continuous one curved surface is formed by continuously and simultaneously patterning respective layers over at least the free layer comprising this lamination layer deposited film, the first and second spacer layers disposed across this free layer and the first and second fixed layers and in which side end faces of the respective layers thus treated by patterning are opposed to the above-mentioned side surfaces and a process in which a hard magnetic layer of low resistance or high resistance for maintaining a magnetic stability of the free layer is disposed on opposing side surfaces through or not through the insulating layer, thereby comprising the magnetic head including the magnetic sensing portion formed of the magneto-resistive effect element according to the present invention.

In the above-mentioned magneto-resistive effect element and the above-mentioned magnetic head, the hard magnetic layer and the free layer are disposed with a positional relationship such that the central portions of the hard magnetic layer and the free layer in the film thickness directions may substantially agree with each other.

In the magnetic head including the magnetic sensing portion formed of the above-mentioned magneto-resistive effect element having the SVMR configuration or the TMR configuration according to the present invention, since opposing side surfaces are formed as one plane or one continuous curved surface and are substantially the same in width in at least the free layer into which the external magnetic field is introduced and the nearby portions, i.e., the nonmagnetic conductive layer serving as substantially the operation portion which can achieve the magneto-resistive effect or the tunnel barrier layer and the fixed layer, the width of this portion can be reduced necessarily and sufficiently and the sense current can be concentrated so that the magneto-resistive effect can be increased. Therefore, the magnetic head in which a detection output of a signal magnetic field from a magnetic recording medium can be increased can be comprised of the magneto-resistive effect element which can detect the external magnetic field with high sensitivity.

Further, as described above, in the magneto-resistive effect element and the magnetic head, when the positional relationship between the hard magnetic layer and the free layer is selected in such a manner that the central portion of both of the hard magnetic layer and the free layer in the film thickness directions may substantially agree with each other, the magnetic field from the hard magnetic layer can be effectively applied to the free layer and the stability of the free layer can be improved more.

Specifically, the hard magnetic layer, i.e., the hard magnetic layer which is bias-magnetized relative to the free layer is served as a bias hard magnetic layer in which a magnetic domain produced in the end portion of the free layer is canceled to improve a Barkhausen noise in which magnetization rotation in the free layer becomes discontinuous relative to the external magnetic field. In order to cancel the magnetic domain from the free layer, a product $Mr_H \times t_H$ of a residual magnetization $Mr_H$ of the hard magnetic layer and its thickness $t_H$ should be selected to be equal to or greater than a product $Ms_F \times t_F$ of a saturation magnetization $Ms_F$ of the free layer and its thickness $t_F$.

However, in general, since the residual magnetization $Mr_H$ of the hard magnetic layer material falls within a range of from approximately 300 to 700 emu/cm$^3$ and the saturation magnetization $Ms_F$ of the free layer falls within a range of from approximately 800 to 1300 emu/cm$^3$, it is inevitable that the thickness $t_H$ of the hard magnetic layer is considerably large as compared with the thickness $t_F$ of the free layer.

Therefore, assuming now that the free layer and the hard magnetic layer are flush with each other on the same plane, then when a magnetic field from the thick hard magnetic layer is applied to the thin free layer, the free layer is applied with substantially only the magnetic field from extremely one portion of the bottom surface, for example, of the hard magnetic layer. There is then the risk that a magnetic field cannot be applied with high efficiency. There arises a problem that a magnetic domain cannot be canceled satisfactorily.

On the other hand, when the positional relationship between the hard magnetic layer and the free layer is selected in such a manner that the central portions of both of the hard magnetic layer and the free layer in the film thickness directions substantially agree with each other, i.e., the planes in which both of the hard magnetic layer and the free layer are disposed are not flush with each other, the magnetic field from the hard magnetic layer can be applied to the free layer effectively and effects for canceling magnetic domains of other portions of the free layer can be improved more. Thus, the stability of the free layer and, accordingly, the improvement of the Barkhausen noise, can be increased.

Furthermore, according to the above-mentioned manufacturing method of the present invention, since this substantial operation portion can be formed by a series of patterning with the same pattern, i.e., the same mask, the manufacturing can be simplified.

BEST MODE FOR CARRYING OUT THE INVENTION

A magnetic head using magneto-resistive effect using a magneto-resistive effect element (GMR element) according to the present invention as a magnetic sensing portion according to several embodiments of the present invention will be described with reference to the drawings. Although the sheets of drawings illustrate a single magnetic head element, in actual practice, a plurality of magnetic head elements can be formed simultaneously on a common substrate, these magnetic head elements can be diced to provide respective magnetic head elements and a plurality of magnetic heads can be constructed at the same time.

FIRST EMBODIMENT

An embodiment will be described with reference to FIGS. 1 to 17 in conjunction with a manufacturing method according to an embodiment of the present invention.

In this embodiment, there are constructed a GMR element having an SVMR configuration and a magnetic head having this element.

Figure 1:
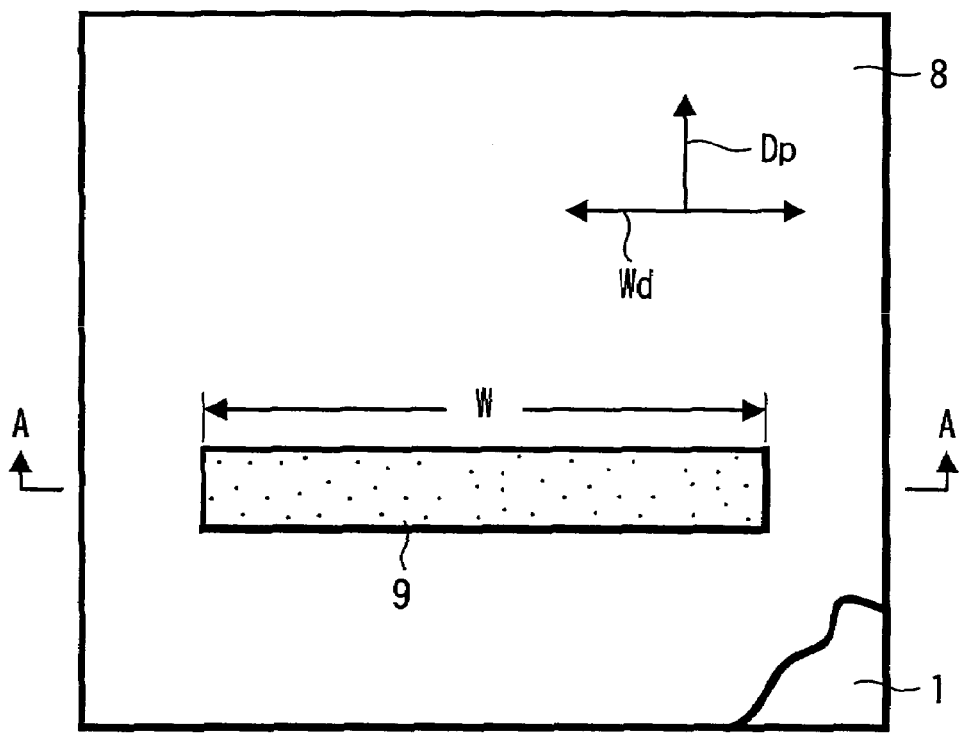
FIG. 1 is a schematic plan view in a process of an example of a manufacturing method according to the present invention.
Figure 2:
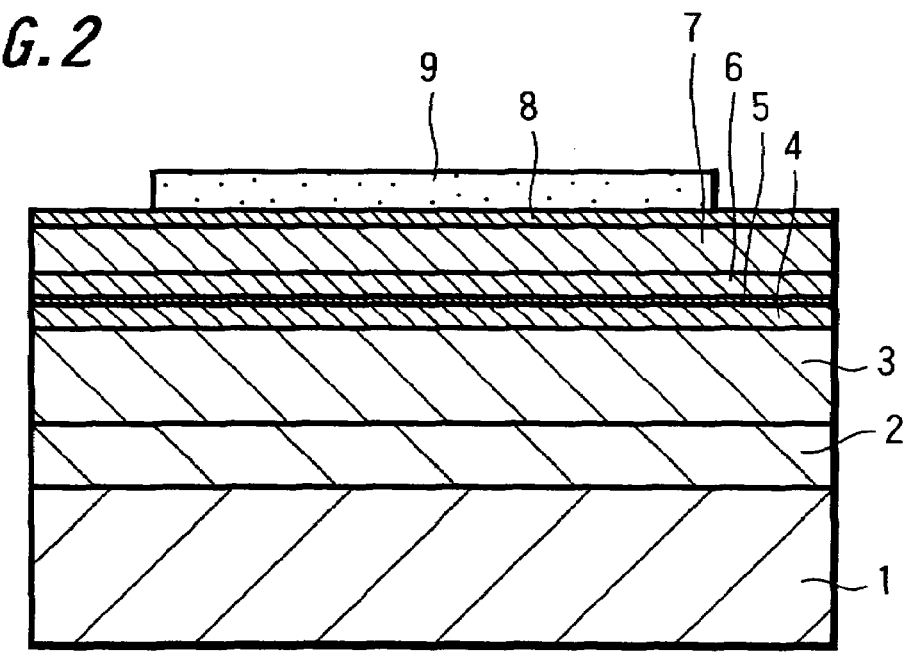
FIG. 2 is a schematic cross-sectional view taken along the line A-A in FIG. 1.

As FIG. 1 shows a schematic plan view and FIG. 2 shows a schematic cross-sectional view taken along the line A-A, there is prepared a substrate 1 made of AlTiC (AlTiC) having a thickness of 2 mm, for example, on which there is deposited a first shield and electrode layer 2 made of NiFe having a thickness of 2 µm serving as one magnetic shield layer of a finally obtained magnetic head and which constructs one electrode by plating.

Then, on the first shield and electrode layer 2, there are deposited and laminated a nonmagnetic layer 3 comprising a lower gap layer, a free layer and magnetic flux introducing layer 4 serving as a free layer in the SVMR configuration and which comprises an external magnetic field introducing layer, the spacer layer 5, a fixed layer 6, a antiferromagnetic layer 7, a protective layer, i.e., a capping layer 8, each having a conductivity, in that order, by sputtering.

The nonmagnetic layer 3 is made of a Cu having a thickness of 27 nm, for example, and the free layer and magnetic flux introducing layer 4 can be made up of a bilayer structure of an NiFe layer having a thickness of 5 nm and a CoFe layer having a thickness of 2 nm.

Moreover, according to the SVMR configuration in this example, the spacer layer 5 can be comprised of a nonmagnetic conductive layer made of a Cu layer having a thickness of 3 nm, for example.

The fixed layer 6 can be made up of a trilayer structure of a CoFe layer having a thickness of 2 nm, an Ru layer having a thickness of 1 nm and a CoFe layer having a thickness of 3 nm, for example.

The antiferromagnetic layer can be comprised of a PtMn layer having a thickness of 15 nm, and the protective layer 8 can be comprised of a Ta layer having a thickness of 3 nm, for example.

On this lamination layer film, i.e., on the protective layer 8, there is formed a finally-constructed stripe-like mask 9 which is extended in the width direction (Wd direction) of a magnetic head crossing the depth direction shown by an arrow Dp in FIG. 1.

This mask 9 serves as a mask for use in the later patterning on the lamination layer film and also serves as a mask for the later liftoff. This mask is formed as a stripe-like mask having a depth of 100 nm and a width W of 500 nm by coating a photoresist layer, photolithography, i.e., pattern exposure and development.

Figure 3:
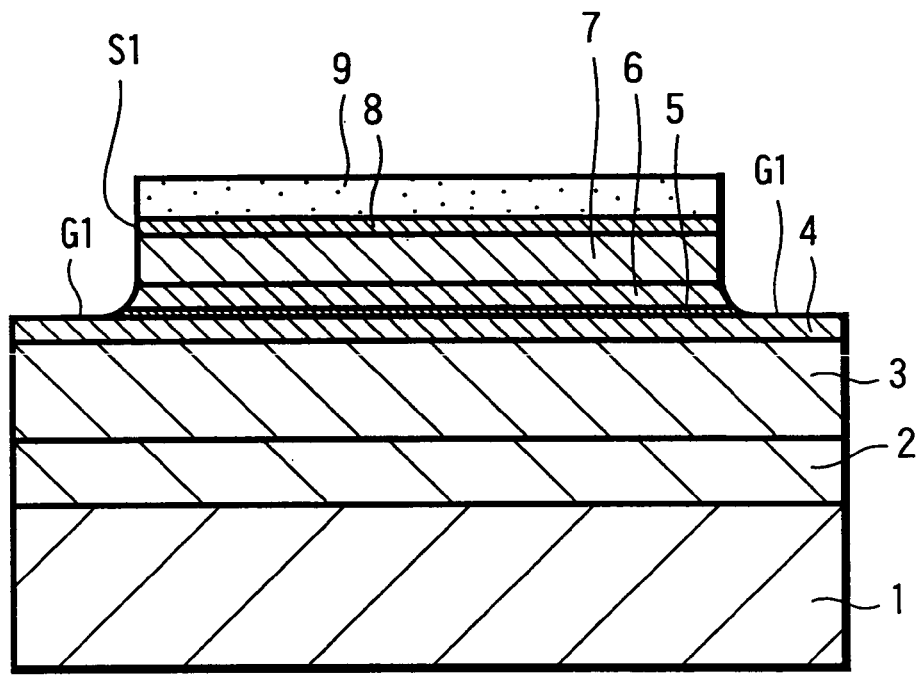
FIG. 3 is a schematic cross-sectional view in a process of an example of a manufacturing method according to the present invention.

Next, as FIG. 3 shows a cross-sectional view corresponding to the above-mentioned cross-section taken along the line A-A, while this mask 9 is being used as an etching mask in the patterning process, the protective layer 8, the antiferromagnetic layer 7, the fixed layer 6 and the spacer layer 5 are patterned by ion milling using a high-sensitivity end detector such as a SIMS (Secondary Ion Mass Spectrometer), thereby forming a stripe-like lamination layer structure portion S1 which is extended in the width direction.

Figure 4:
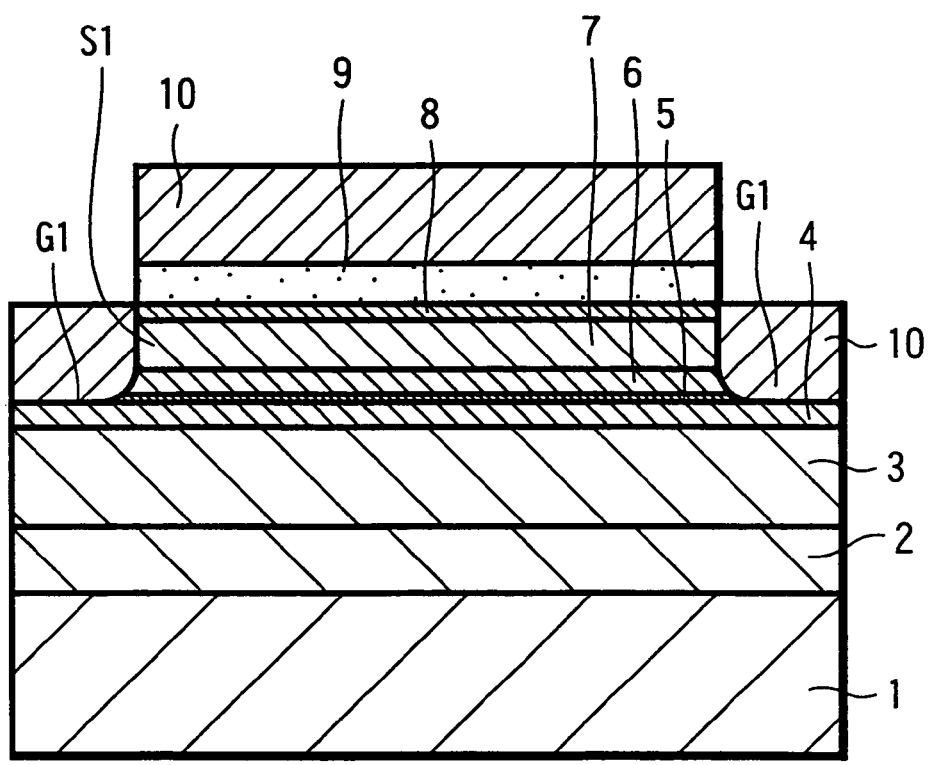
FIG. 4 is a schematic cross-sectional view in a process of an example of a manufacturing method according to the present invention.

As FIG. 4 shows a cross-sectional view corresponding to the above-mentioned cross-section taken along the line A-A, an insulating layer 10 made of $Al_2O_3$ having a thickness of 27 nm, for example, is deposited on the whole surface of a groove G1 portion in which the free layer and magnetic flux introducing layer 4 is exposed around the portion in which the stripe-like lamination layer structure portion Si is formed by sputtering. In this case, since the mask 9 is used as a liftoff mask, the thickness of this mask should, of course, be selected in such a manner that the insulating layer 10 on the free layer and magnetic flux introducing layer 4 and the insulating layer 10 on the mask 9 can be separated from each other.

Figure 5:
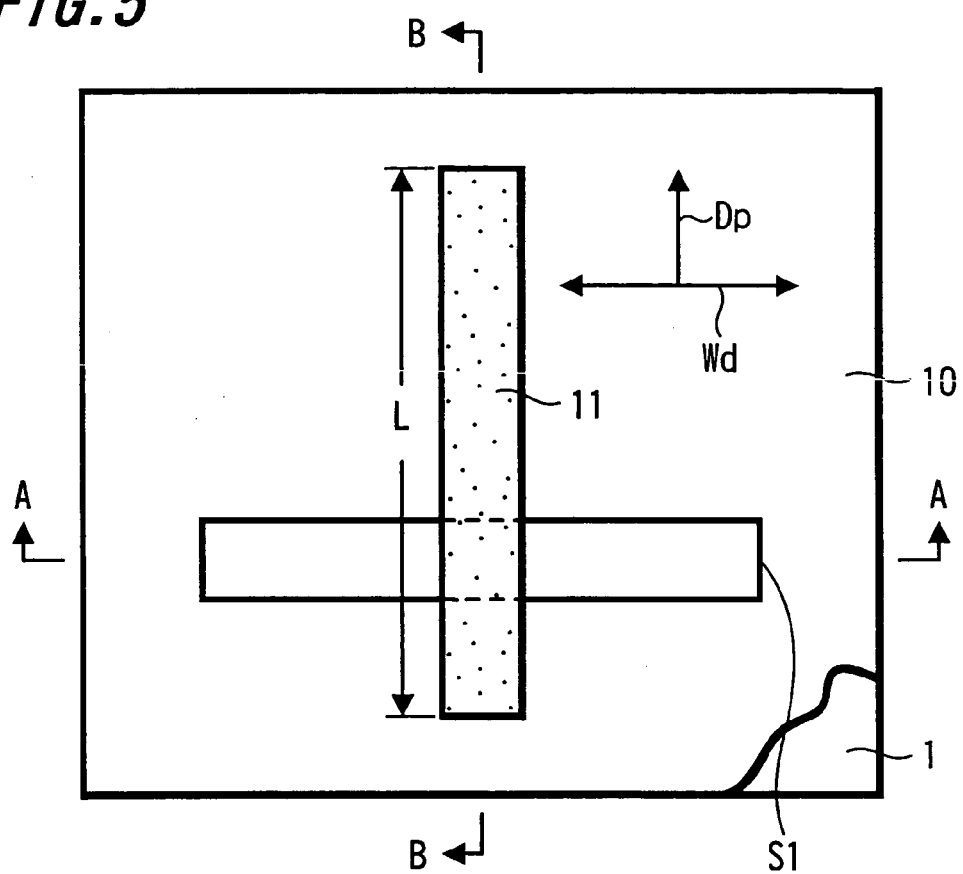
FIG. 5 is a schematic plan view in a process of an example of a manufacturing method according to the present invention.
Figure 6:
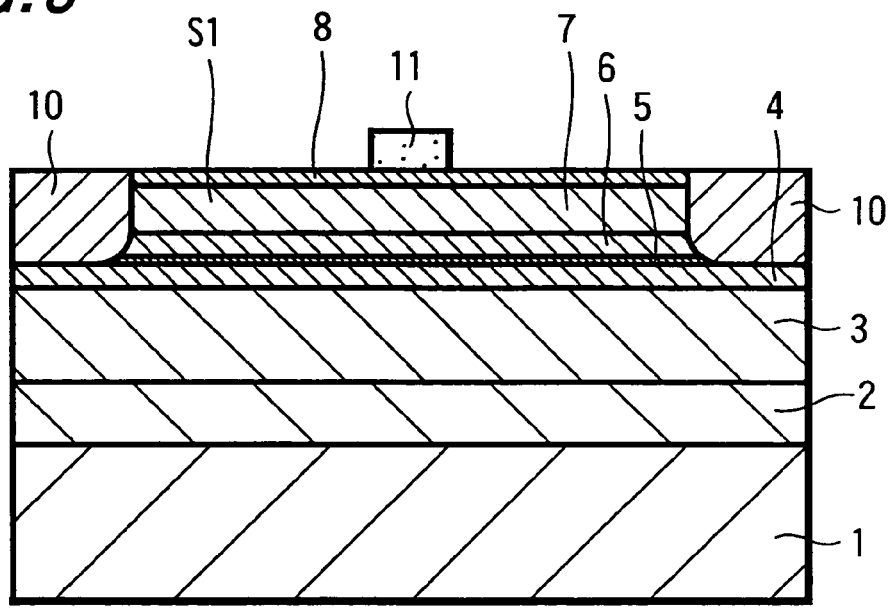
FIG. 6 is a schematic cross-sectional view taken along the line A-A in FIG. 5.
Figure 7:
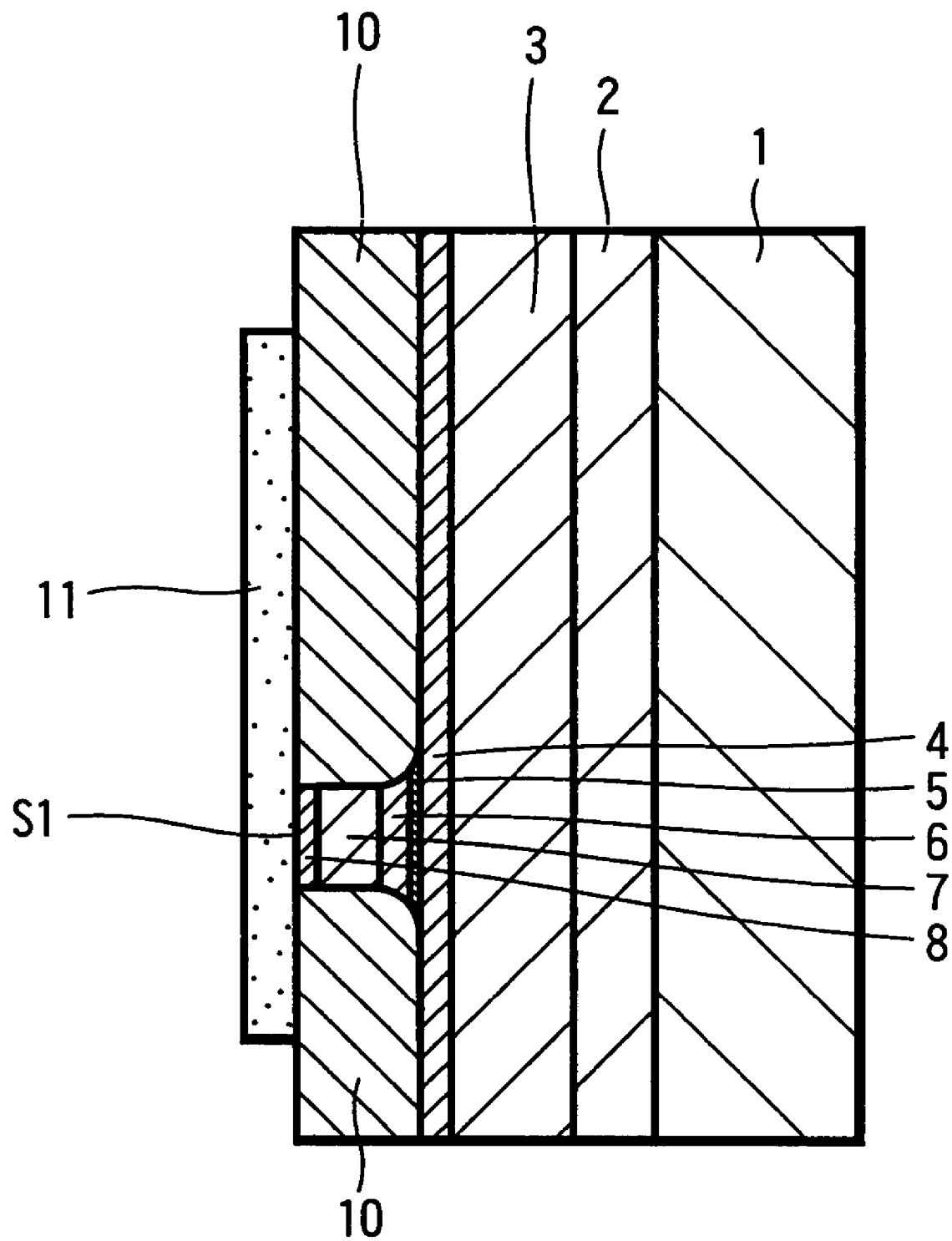
FIG. 7 is a schematic cross-sectional view taken along the line B-B in FIG. 5.

As FIG. 5 shows a schematic plan view and FIGS. 6 and 7 show schematic cross-sectional views taken along the line A-A and the line B-B in FIG. 5, first, the mask 9 is removed and the insulating layer 10 deposited on this mask 9 is lifted off, whereafter the surface is formed as a flat surface by planarization.

Then, on this flat surface, there is formed a stripe-like mask 11 serving as a mask for patterning and which serves as a mask for the later liftoff across the central portion of the stripe-like lamination layer structure portion S1 and which is extended in the depth direction perpendicular to the width direction. This mask 11 has a length L of 700 nm in the depth direction, for example, and a width of 100 nm and can expect a maximum difference of 100 nm caused by alignment accuracy of an exposure mask of an exposure system in photolithography. This mask 11 can be formed by a similar method to that of the mask 9.

Figure 8:
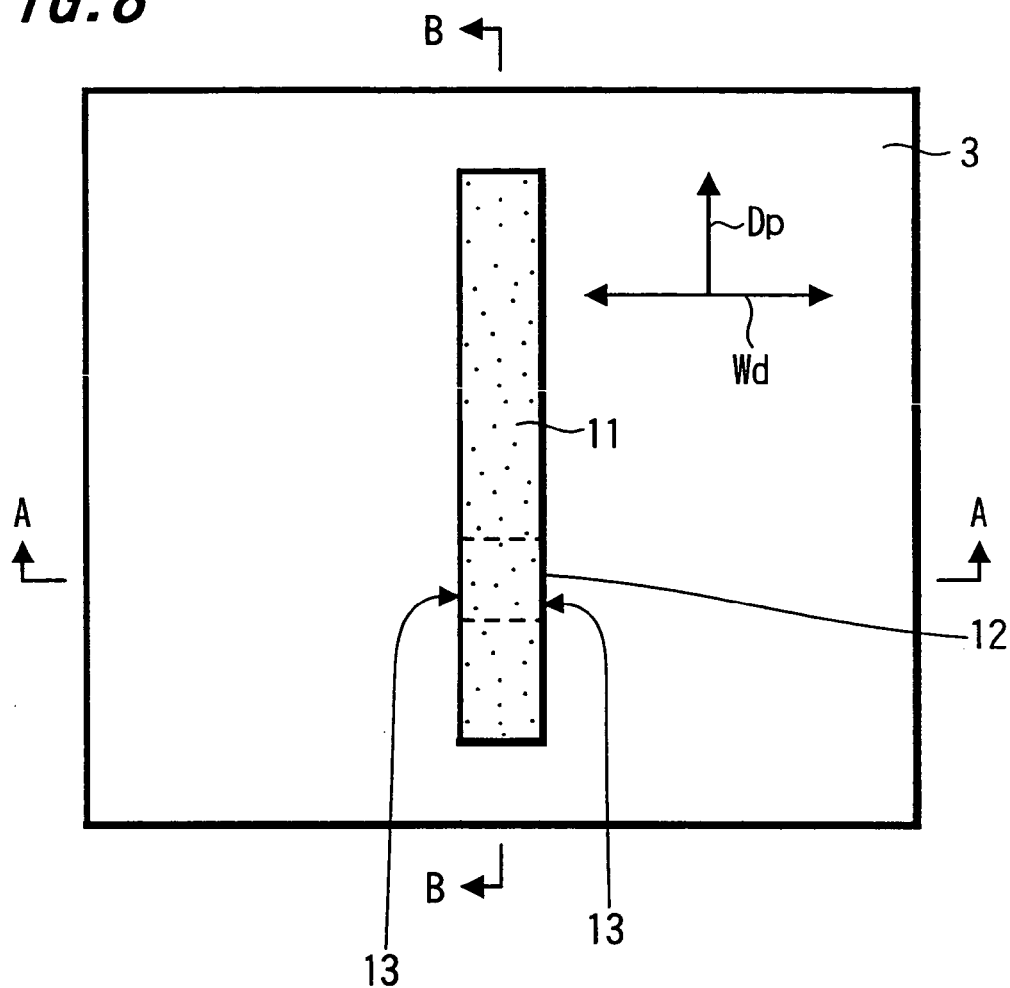
FIG. 8 is a schematic plan view in a process of an example of a manufacturing method according to the present invention.
Figure 9:
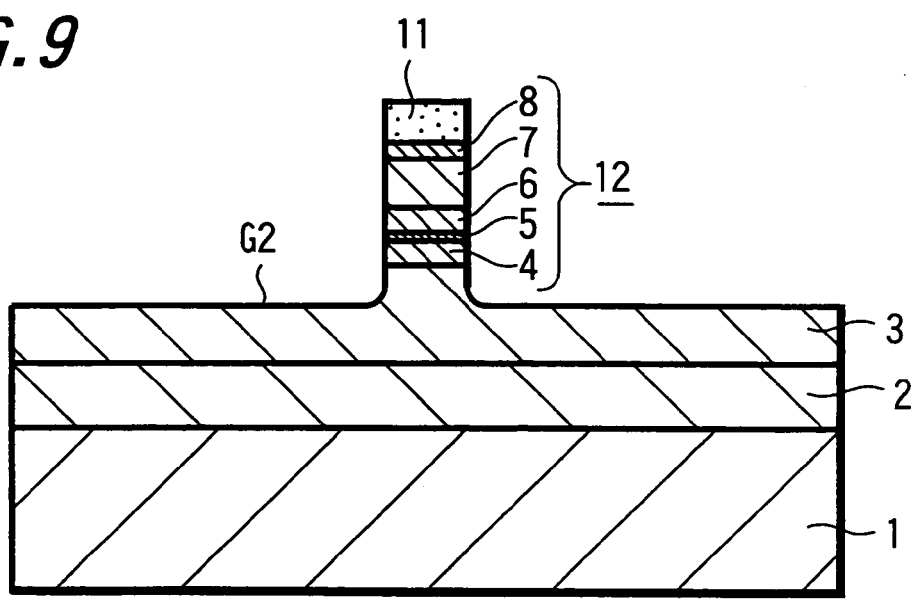
FIG. 9 is a schematic cross-sectional view taken along the line A-A in FIG. 8.
Figure 10:
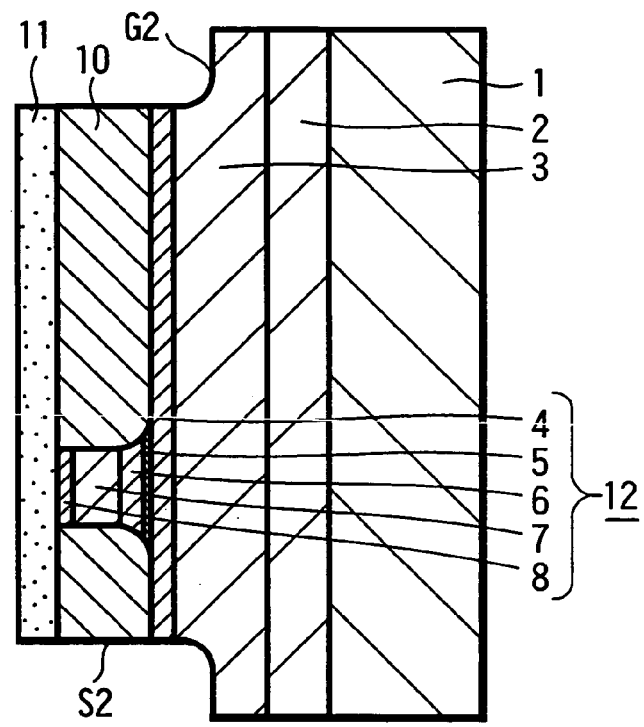
FIG. 10 is a schematic cross-sectional view taken along the line B-B in FIG. 8.

Next, as FIG. 8 shows a schematic plan view and FIGS. 9 and 10 show schematic cross-sectional views taken along the line A-A and the line B-B in FIG. 8, while the mask 11 is being employed as a patterning mask, the insulating layer 10, the protective layer 8, the antiferromagnetic layer 7, the fixed layer 6, the spacer layer 5 and further the free layer and magnetic flux introducing layer 4 are patterned by ion milling, for example, and a groove G2 with a predetermined depth is formed so as to leave the nonmagnetic layer 3 with a predetermined thickness, whereby a stripe portion S2 is formed.

When the depth of the ion milling for this nonmagnetic layer 3 is controlled, speed of this ion milling has been measured in advance so that the depth of the ion milling can be controlled by controlling a time, for example. According to the SIMS, the nonmagnetic layer 3 is formed as a bilayer structure made of materials of different kinds so that the depth of the ion milling can be controlled by controlling the thickness of the upper layer.

In this manner, while the stripe-like free layer and magnetic flux introducing layer 4 is left along the stripe portion S2, the spacer layer 5, the fixed layer 6 and the antiferromagnetic layer 7 and the protective layer 8 are left only at the portion in which the aforementioned stripe-like lamination layer structure portion S1 and the stripe portion S2 cross each other, wherein there is formed the lamination layer structure portion 12 having the SVMR configuration of small area.

Then, since the two side surfaces 13 which cross the width direction of this lamination layer structure portion 12 are formed by the patterning of the stripe portion S2, i.e., the same patterning process, by the side surface 13, the side end faces of the lamination layer structure portion 12 and which cross the respective width directions of the free layer and magnetic flux introducing layer 4, the spacer layer 5, the fixed layer 6, the antiferromagnetic layer 7 and the protective layer 8 are formed on one plane or one curved surface formed by the above-mentioned patterning. That is, although the patterning of the stripe portion S2 is formed by the patterning such as ion milling as described above, the side surface 13 is formed with an inclined surface or a curved surface based upon this patterning method, conditions and the like. This side surface 13 is formed as one plane or continuous curved surface. Specifically, the protective layer 8, the antiferromagnetic layer 7, the fixed layer 6, the spacer layer 5 and the free layer and magnetic flux introducing layer 4 in the lamination layer structure portion 12 are formed with substantially the same width.

Figure 11:
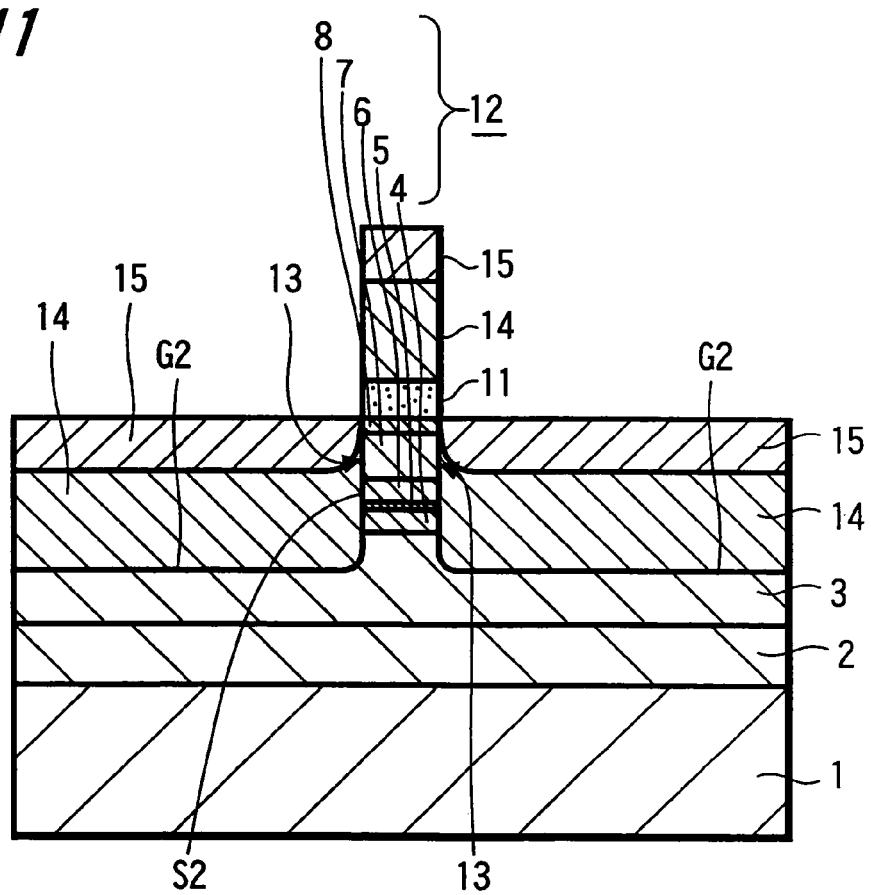
FIG. 11 is a schematic cross-sectional view in a process of an example of a manufacturing method according to the present invention.

Next, as FIG. 11 shows a schematic cross-sectional view which corresponds to the above-mentioned cross-section taken along the line A-A, a hard magnetic layer 14 made of Co—γ $Fe_2O_3$ of high resistance having a thickness of 29 nm, for example, is deposited on the whole surface of the groove G2 by sputtering.

Further, a nonmagnetic insulating layer 15 such as $Al_2O_3$ is formed on the whole surface of this hard magnetic layer 14.

Thereafter, the mask 11 is removed, the hard magnetic layer 14 and the insulating layer 15 are lifted off and the surface may be made flat by planarization.

Figure 12:
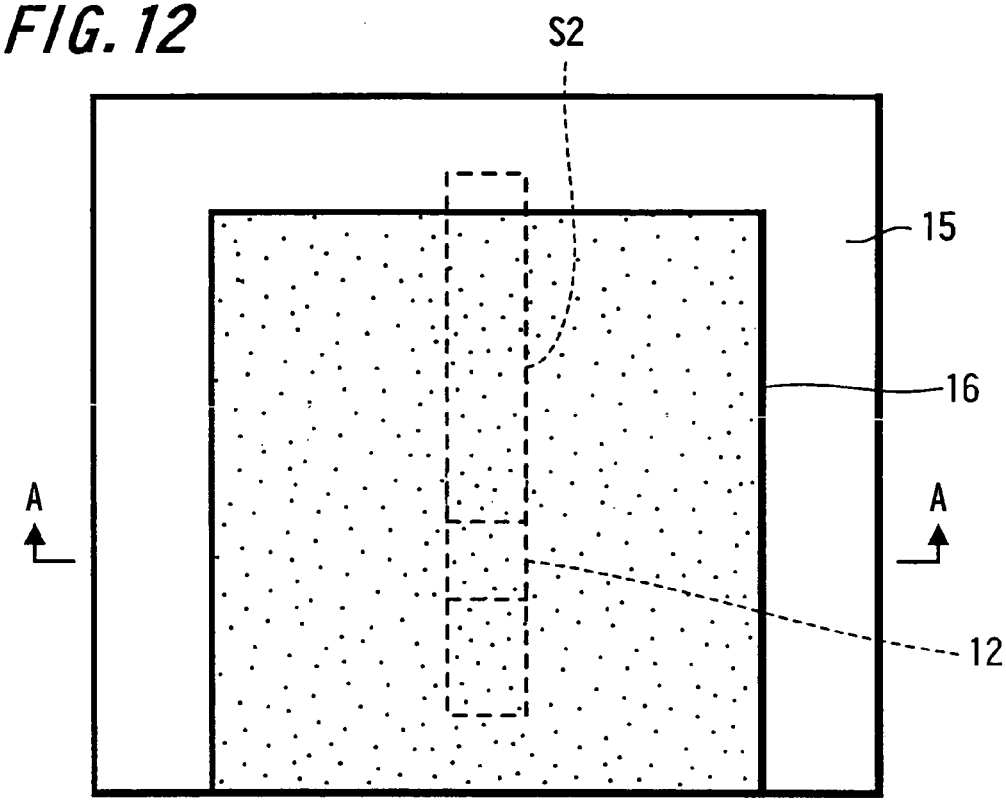
FIG. 12 is a schematic plan view in a process of an example of a manufacturing method according to the present invention.
Figure 13:
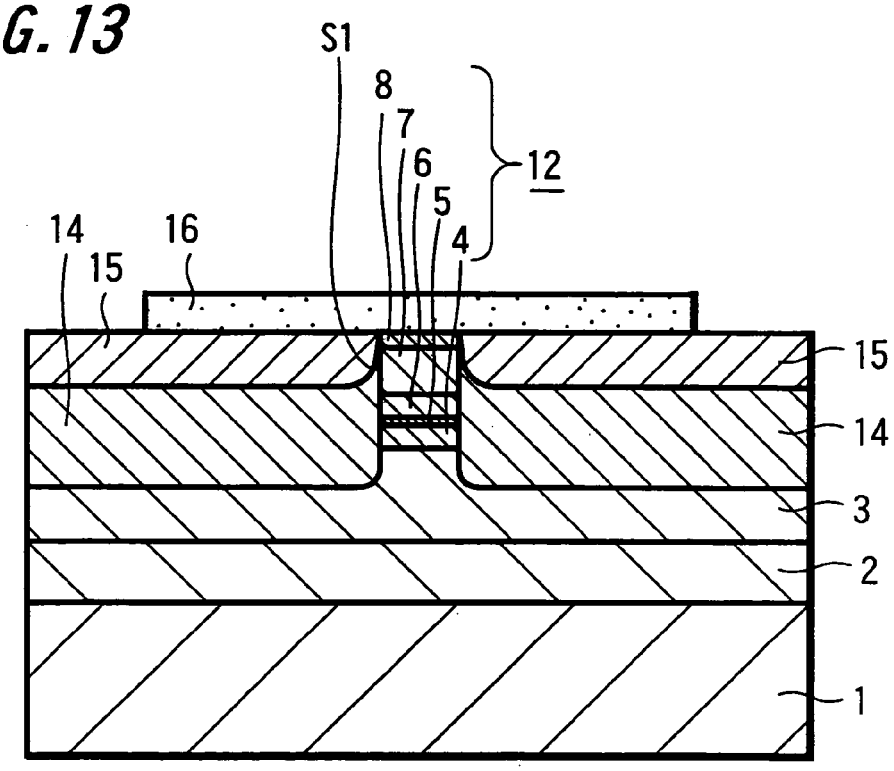
FIG. 13 is a schematic cross-sectional view taken along the line A-A in FIG. 12.

Further, as FIG. 12 shows a schematic plan view and FIG. 13 shows a schematic cross-sectional view taken along the line A-A in FIG. 12, a mask 16 having a predetermined width and a predetermined depth which serves as a similar patterning mask and which also serves as a lift-off mask is formed on the insulating layer 15 so as to cover the stripe portion S2 by photoresist of photolithography, for example.

Figure 14:
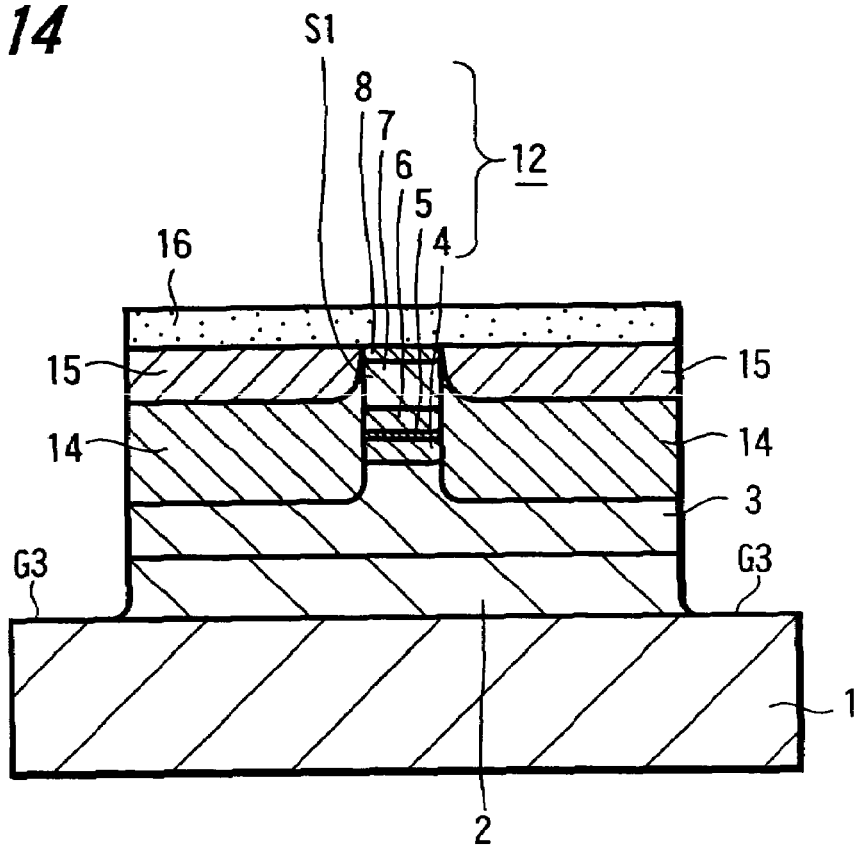
FIG. 14 is a schematic cross-sectional view in a process of an example of a manufacturing method according to the present invention.

As FIG. 14 shows a cross-sectional view corresponding to the above-mentioned cross-section taken along the line A-A, a groove G3 is formed by removing the portion which is not covered with this mask 16 according to ion milling, for example.

Figure 15:
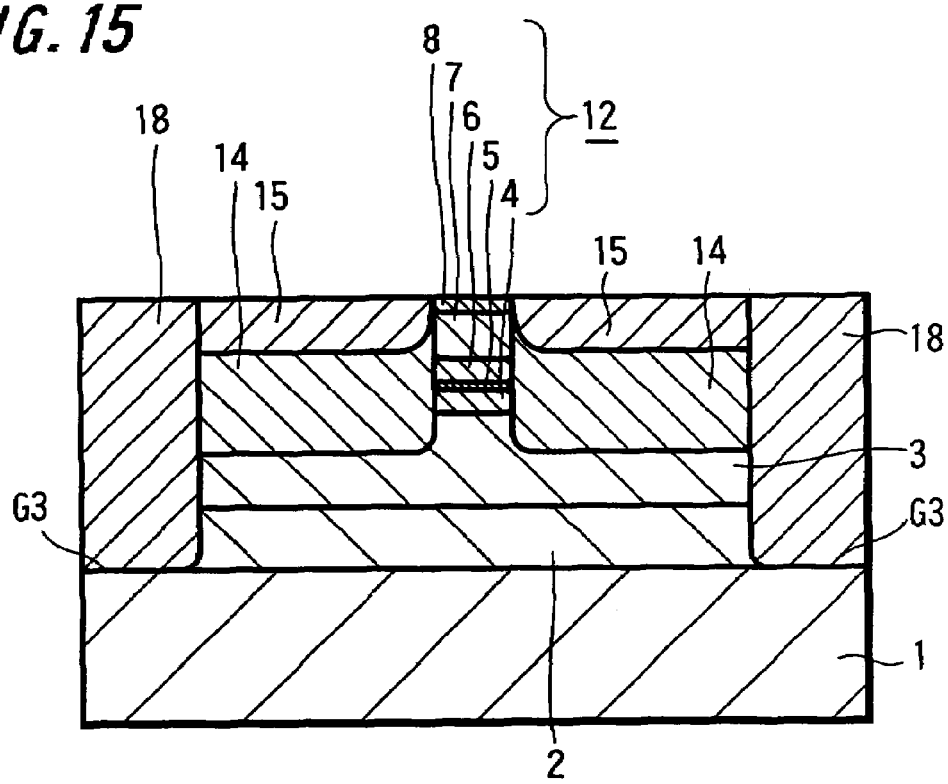
FIG. 15 is a schematic cross-sectional view in a process of an example of a manufacturing method according to the present invention.

As FIG. 15 shows a cross-sectional view corresponding to the above-mentioned cross-section taken along the line A-A, an insulating layer 18 made of $Al_2O_3$, for example, is formed on the whole surface including the groove G3 and the mask 16 is removed, on which the insulating layer 18 is lifted off and the surface is made flat by planarization.

Figure 16:
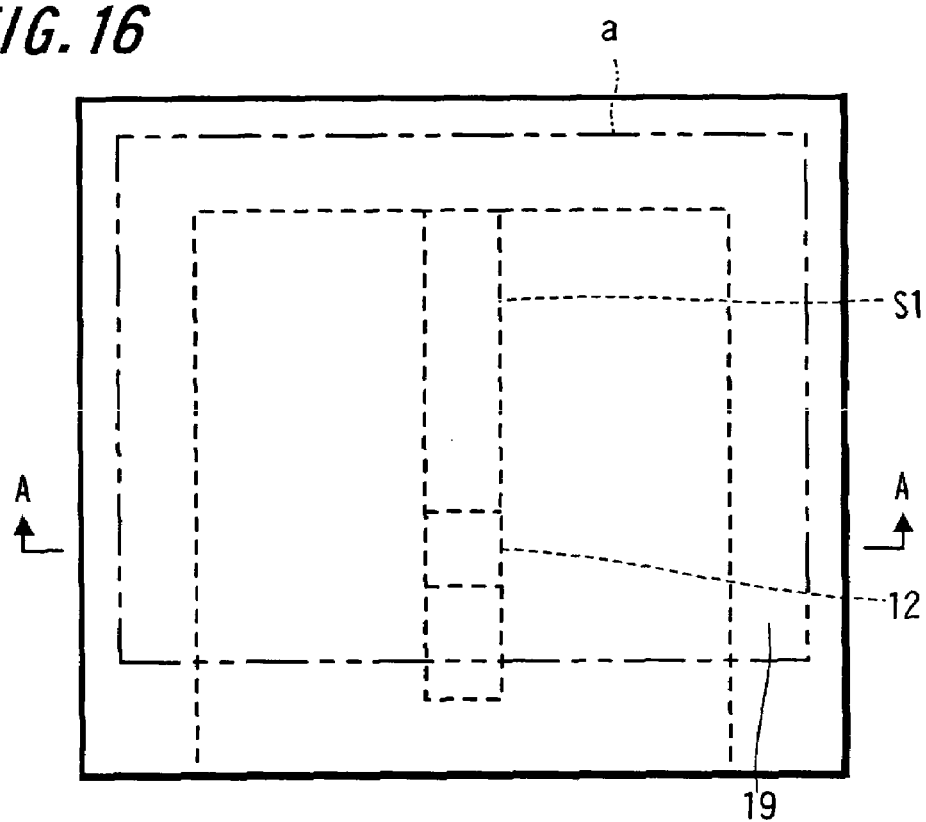
FIG. 16 is a schematic plan view in a process of an example of a manufacturing method according to the present invention.
Figure 17:
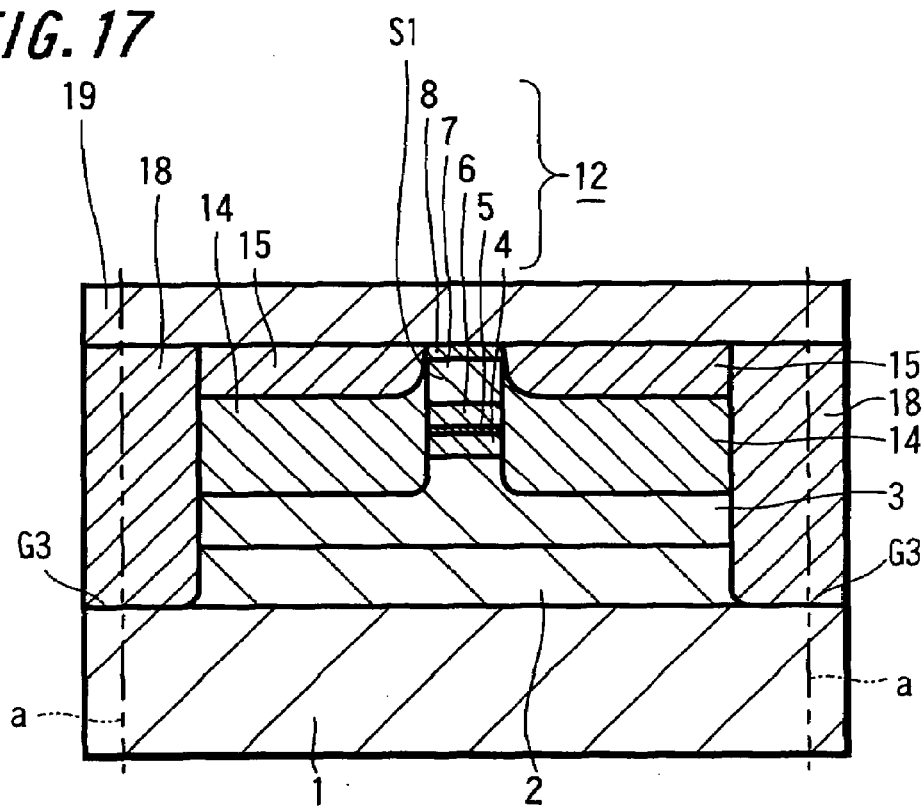
FIG. 17 is a schematic cross-sectional view taken along the line A-A in FIG. 16.

As FIG. 16 shows a schematic plan view and FIG. 17 shows a schematic cross-sectional view taken along the line A-A, a second shield and electrode layer 19 having a thickness of 2 μm, for example, is formed on the flattened surface by NiFe plating.

Figure 18:
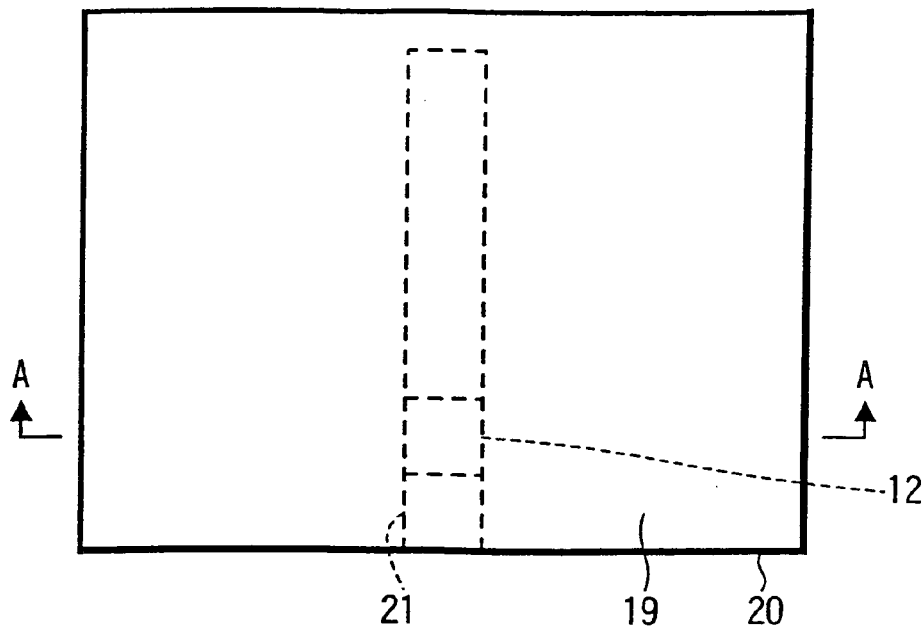
FIG. 18 is a schematic plan view of a magnetic head using magneto-resistive effect according to an embodiment of the present invention.
Figure 19:
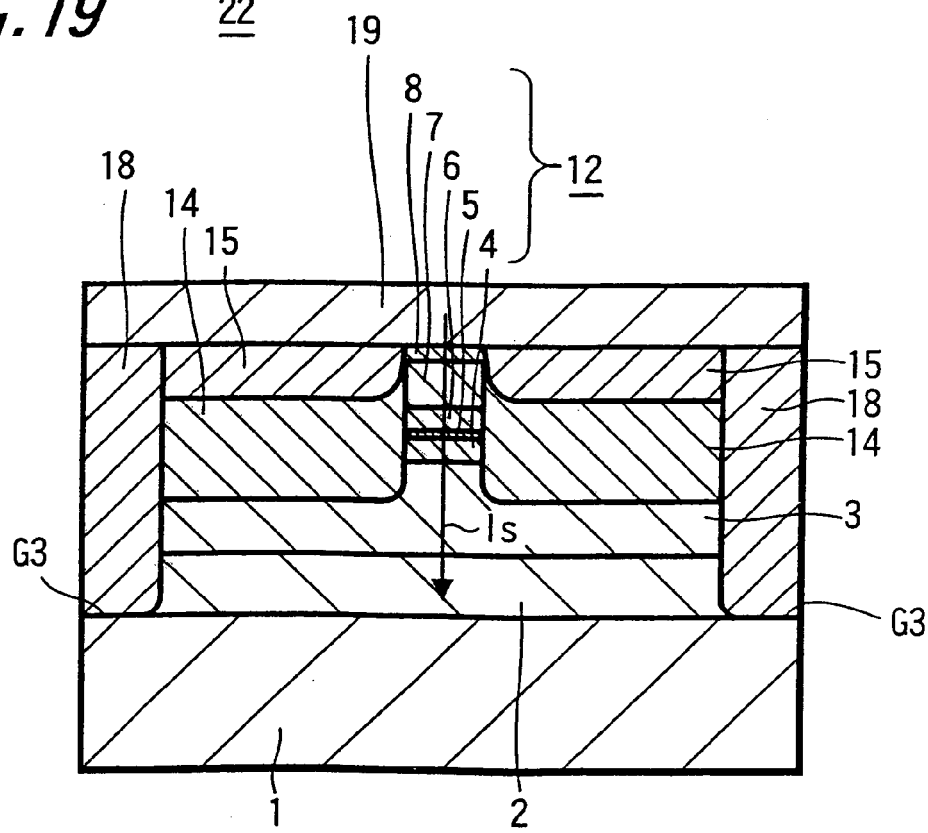
FIG. 19 is a schematic cross-sectional view taken along the line A-A in FIG. 18.

Then, the block thus formed is diced along a cutting line shown by a dot-and-dash line a in FIGS. 16 and 17, and a front surface 20 serving as a surface which is brought in contact with or is opposed to a magnetic recording medium by polishing as FIG. 18 shows a schematic plan view and FIG. 19 shows a schematic cross-sectional view taken along the line A-A.

Thereafter, the antiferromagnetic layer 7 is magnetized at its surface on the fixed layer 6 side to the magnetic flux introducing direction with application of a magnetic field of 10 kOe parallel to the magnetic flux introducing direction, i.e., external magnetic field application direction at 250° C. in the vacuum, for example.

Moreover, a uniaxial magnetic induction anisotropy is given to the free layer and magnetic flux introducing layer 4 with application of a magnetic field of 1 kOe in the direction perpendicular to the magnetic flux introducing direction at 200° C. in the atmosphere, for example.

Further, a magnetic field of 10 kOe is applied to the direction perpendicular to the magnetic flux introducing direction in the atmosphere at a room temperature, whereby the hard magnetic layer 14 is magnetized in the direction extending along the plane direction and also in the direction intersecting the direction in which the stripe portion S2 is extended.

In this manner, there is formed the GMR element 21 in which the lamination layer structure portion 12 having the SVMR configuration including the stripe-like free layer and magnetic flux introducing layer 4 and the free layer and magnetic flux introducing layer 4, the spacer layer (non- magnetic conductive layer) 5, the fixed layer 6.and the antiferromagnetic layer 7 sequentially laminated with each other in the limited area at the position entered from the front surface 20 into the depth advanced by a predetermined distance is formed. There is constructed a magnetic head using magneto-resistive effect 22 having the SVMR configuration using this element as a magnetic sensing portion according to the present invention.

The resultant hard magnetic layer 14 is formed in such a manner that the free layer, i.e., in this example, the free layer and magnetic flux introducing layer 4 may be opposed to substantially the center of the thickness direction of the hard magnetic layer 15, i.e., the central portions thereof substantially agree with each other with respect to the thickness direction by selecting the thickness of the hard magnetic layer and the depth of the groove G3. Specifically, the hard magnetic layer 14 and the surfaces in which the respective layers of the free layer and magnetic flux introducing layer 4 are formed may not agree with each other.

In this connection, $Ms_F \times t_F$ in this free layer and magnetic flux introducing layer 4 obtained when the free layer and magnetic flux introducing layer 4 is comprised of the CoFe layer having the thickness of 2 nm and the NiFe layer having the thickness of 5 nm as described above becomes 0.66 $emu/cm^3$, and $Mr_H \times t_H$ of the hard magnetic layer obtained when the hard magnetic layer 14 is comprised of a Co—γ $Fe_2O_3$ having a thickness of 29 nm becomes 0.73 $emu/cm^3$.

The GMR element according to the present invention, i.e., the magneto-resistive effect element and the magnetic head using magneto-resistive effect 22 have the CPP configuration in which a sense current Is flows through the first and second shield and electrode layers 2 and 19 from one to the other, i.e., the sense current flows through the lamination layer direction of the lamination layer structure portion 12.

Moreover, in this magnetic head 22, the front surface 20 thereof is brought in contact with or is opposed to a magnetic recording medium. This front surface 20 serves as a so-called ABS (Air Bearing Surface) when the magnetic head 22, for example, can be lifted up by air flow generated when the magnetic head is moved in a relative fashion to the magnetic recording medium.

Then, the tip end of the free layer and magnetic flux introducing layer 4 is opposed to this front surface 20. An external magnetic field, i.e., in the magnetic head, a signal magnetic field based upon magnetic recording on the magnetic recording medium is introduced from this tip end, introduced into the lamination layer structure portion 12 which is formed at the position advanced from this front surface 20 to the depth direction by the predetermined distance to cause a spin-dependence scattering to occur relative to the above-mentioned sense current Is. That is, the change of resistance is generated and this change of resistance is generated as an electrical output based upon the sense current Is.

As described above, since the magneto-resistive effect element, i.e., the magnetic head using magneto-resistive effect using the GMR element as the magnetic sensing portion can exhibit the characteristic of the CPP configuration, i.e., can decrease the resistance by causing the sense current to flow through the film thickness direction, their area can be reduced and their density can be increased. Moreover, since the first and second shield and electrode layers 2 and 19 having high heat conductivity are thermally disposed close to each other across the lamination layer structure portion 12, they have the highly-reliable configuration which is high in heat radiation effect and which can continue stable operations.

Then, further, according to the present invention, since the side surfaces of the respective layers of the lamination layer structure portion 12 are formed as the side surface 13 which substantially forms the same plane, similarly to the above-mentioned manufacturing method according to the present invention, the respective layers of the same pattern can be formed by the same process and the manufacturing can be simplified.

Moreover, as described above, since a relationship between the hard magnetic layer 14 and the free layer and magnetic flux introducing layer 4 is selected to be a positional relationship such that central portions of the hard magnetic layer and the free layer and magnetic flux introducing layer in the film thickness directions substantially agree with each other, as mentioned before, the magnetic field from the hard magnetic layer 14 can be effectively applied to the free layer and hence the stability of the free layer can be increased more.

Moreover, since the above-mentioned magnetic head configuration is the shield type configuration in which the front end faces of the first and second shield and electrode layers 2 and 19 are disposed so as to oppose to the front surface 20, introduction of the external magnetic field is limited so that the magnetic head having high resolution can be constructed.

Moreover, according to the above-mentioned configuration, since the stripe portion Si at its portion behind the lamination layer structure portion 12, i.e., the portion opposite to the front surface 20 is operated as the magnetic flux introducing layer, magnetic flux leaked from the lamination layer structure portion 12 to the magnetic shield layer, in this case, the shield and electrode layers 2 and 19 can be decreased, and hence efficiency of magneto-resistive effect can be improved.

Figure 20:
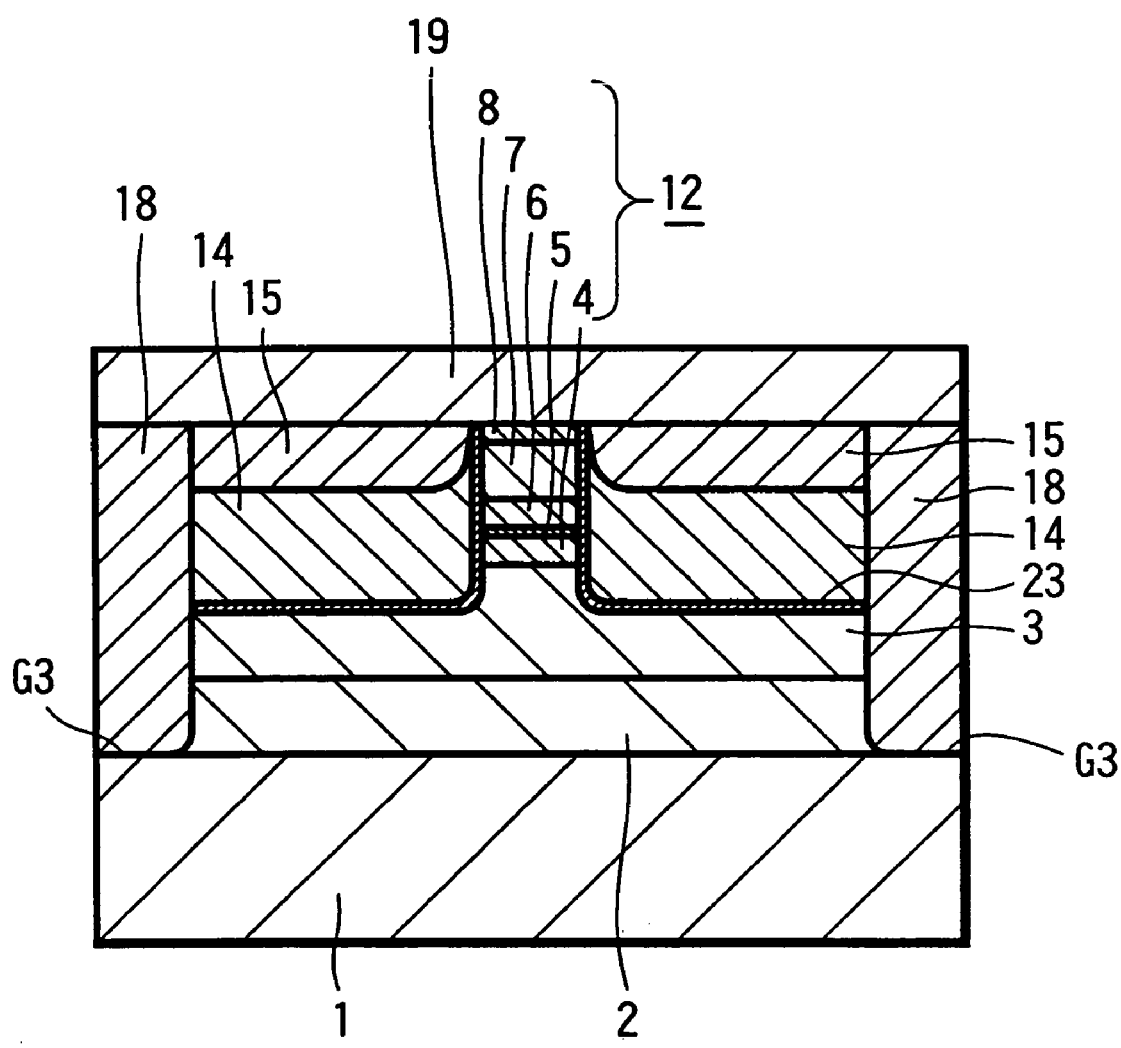
FIG. 20 is a schematic cross-sectional view of a magnetic head using magneto-resistive effect according to other embodiment of the present invention.

While the hard magnetic layer 14 is made of the high-resistance material in the above-mentioned example, when this hard magnetic layer 14 is made of a low-resistance material, e.g., CoCrPt, as FIG. 20 shows a schematic cross-sectional view corresponding to FIG. 19, after the groove G3 has been formed, an insulating layer such as $SiO_2$ and SiN is deposited, on which the hard magnetic layer 14 is deposited, thereby making it possible to avoid the sense current Is between the first and second shield and electrode layers 2 and 19 from being leaked through the hard magnetic layer 14.

Figure 21:
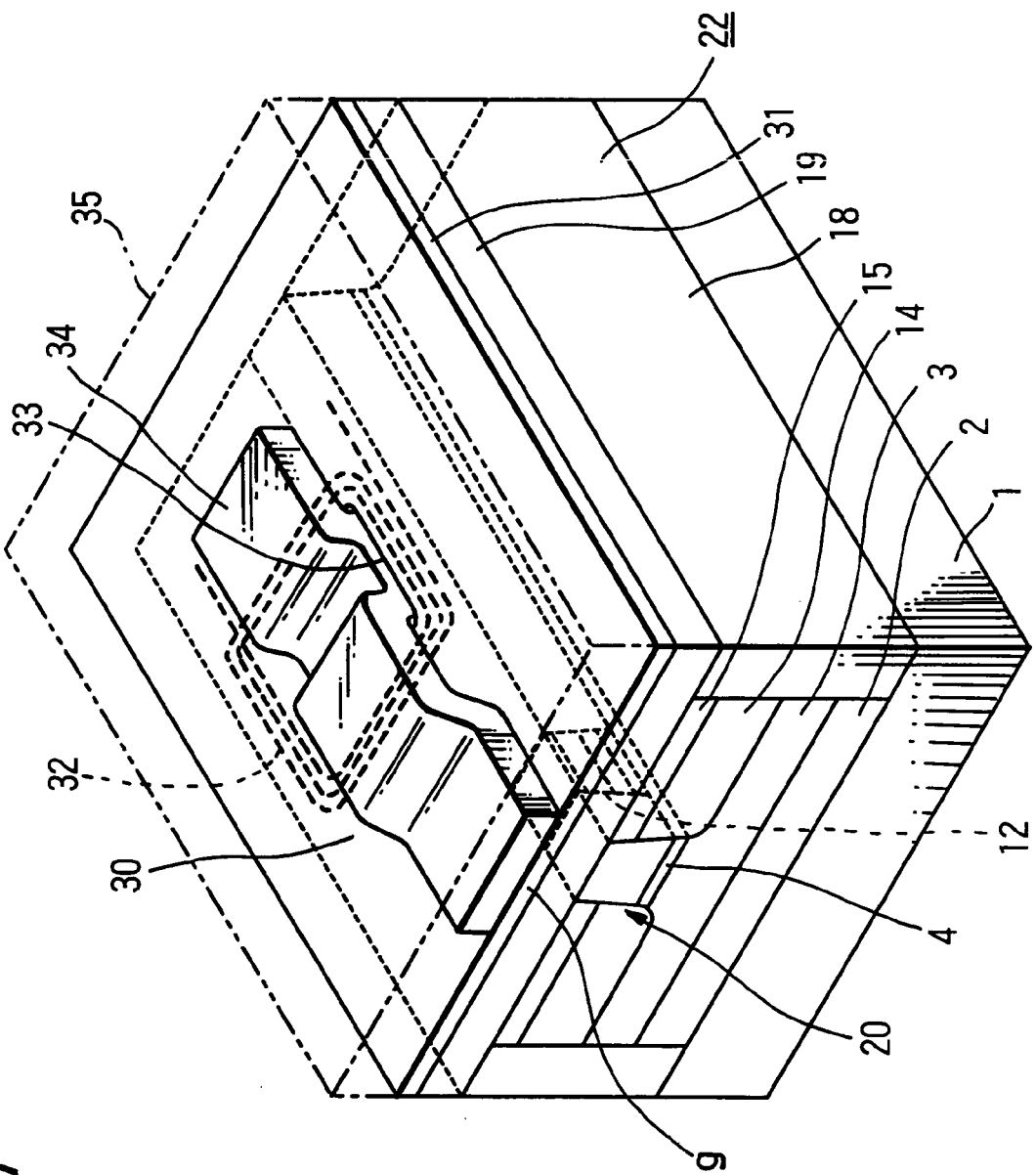
FIG. 21 is a schematic perspective view of an example of a recording and reproducing magnetic head using the magnetic head according to the present invention.

The inventive magnetic head using the inventive GMR element as the magnetic sensing portion, i.e., the reproducing magnetic head 22 can be constructed as a magnetic recording and reproducing head by laminating an electromagnetic induction type thin-film magnetic recording head 30 onto the inventive reproducing magnetic head as FIG. 21 shows a schematic perspective view. This example is the case in which there is used the magnetic head using magneto-resistive effect 22 having the configuration shown in FIGS. 18 and 19.

In this example, on the second shield and electrode layer 19, there is formed a nonmagnetic layer 31 made of $SiO_2$ or the like, for example, comprising the magnetic gap of the recording head 30 in the portion which is opposed to the front surface 20.

Then, a coil 32 which is comprised of a conductive layer, for example, by patterning is formed on the rear portion. This coil 32 is coated with an insulating layer, and a through-hole 33 is bored at the central portion of this coil 32 through the insulating layer and the nonmagnetic layer 31 to expose the second shield and electrode layer 19.

On the other hand, the front end of the front surface 20 is opposed onto the nonmagnetic layer 31, and a magnetic core layer 34 is formed in contact with the second shield and electrode layer 19 exposed through the through-hole 33 across the portion in which the coil 32 is formed.

In this manner, there is constructed the electromagnetic induction type thin-film recording magnetic head 30 in which the magnetic gap g, prescribed by the thickness of the nonmagnetic layer 31, is formed between the front end of the magnetic core layer 34 and the second shield and electrode layer 19.

A protective layer 35 formed of an insulating layer is formed on this magnetic head 30 as shown by a dot-and-dash line.

In this manner, there can be constructed the recording and reproducing magnetic head in which the magneto-resistive effect type reproducing magnetic head 22 according to the present invention and the thin-film type recording head 30 are laminated and integrated with each other.

While the free layer and the magnetic flux introducing layer for introducing an external magnetic field are comprised of the same layer in the above-mentioned example, these layers can be comprised of individual different layers.

While the magneto-resistive effect element or the magnetic head has the structure in which the free layer and magnetic flux introducing layer 4, the nonmagnetic conductive layer (spacer layer) 5, the fixed layer 6 and the antiferromagnetic layer 7 are laminated with each other from the side of the substrate 1 in the above-mentioned first embodiment, there can be constructed a magneto-resistive effect element having a lamination layer structure portion based upon a structure in which this structure is reversed and a magnetic head configuration using this magneto-resistive effect element as a magnetic sensing portion.

This embodiment will be described.

SECOND EMBODIMENT

An embodiment of this case will be described with reference to FIGS. 22 to 38 in conjunction with an example of a manufacturing method according to the present invention.

Figure 22:
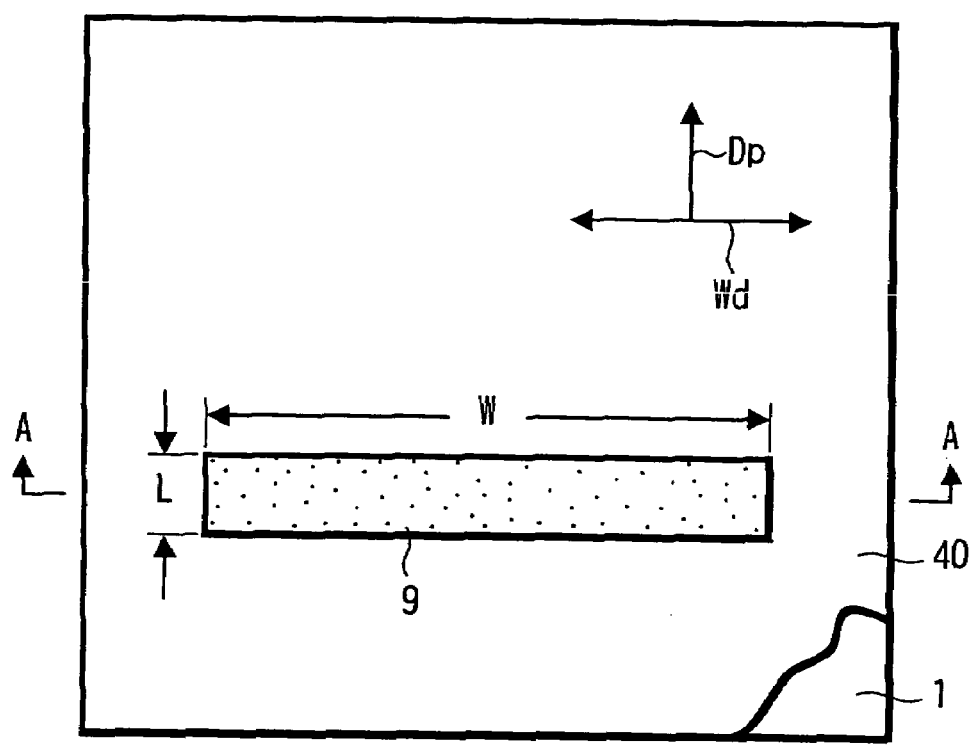
FIG. 22 is a schematic plan view of a process of other example of a manufacturing method according to the present invention.
Figure 23:
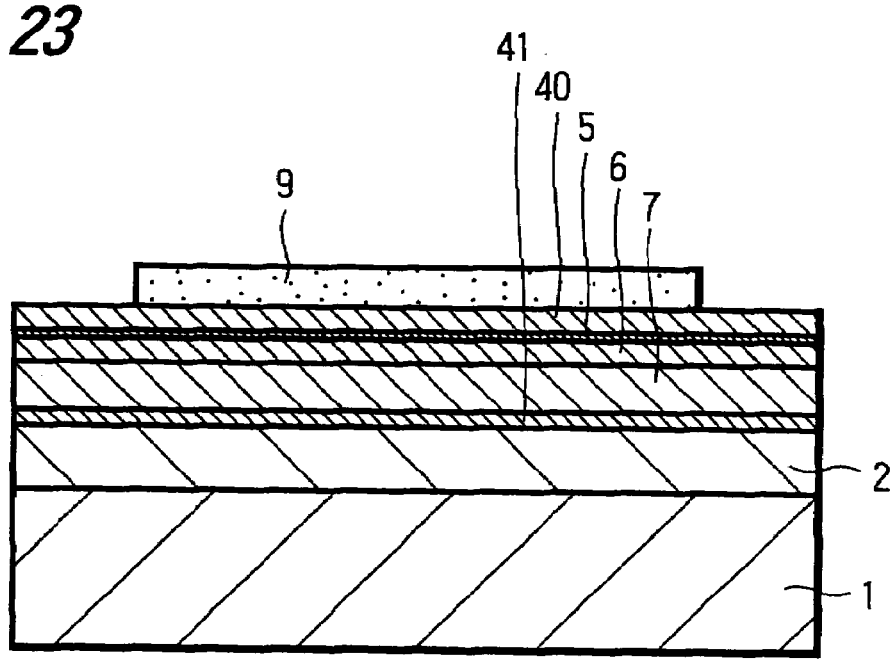
FIG. 23 is a schematic cross-sectional view taken along the line A-A in FIG. 22.

First, as FIG. 22 shows a schematic plan view and FIG. 23 shows a schematic cross-sectional view taken along the line A-A in FIG. 22, also in this case, there is prepared a substrate 1 made of AlTiC (AlTiC) having a thickness of 2 mm, for example, on which there is formed a first shield and electrode layer 2 serving as one magnetic shield layer of a finally obtained magnetic head and which comprises one electrode by plating.

Then, on this first shield and electrode layer 2, there are laminated and deposited an underlayer 41, an antiferromagnetic layer 7, a fixed layer 6, a nonmagnetic conductive layer of a spacer layer 5 and a free layer 40, each having a conductivity, in that order, by sputtering.

The first shield and electrode layer 2 can be comprised of NiFe having a thickness of 2 µm.

The underlayer 41 can be comprised of Ta having a thickness of 3 nm, for example.

The antiferromagnetic layer 7 can be comprised of a PtMn layer having a thickness of 15 nm, for example.

Moreover, the fixed layer 6 may have a trilayer structure comprising a CoFe layer having a thickness of 3 nm, an Ru layer having a thickness of 1 nm and a CoFe layer having a thickness of 2 nm, for example.

The spacer layer 5, i.e., nonmagnetic conductive layer can be comprised of a Cu layer having a thickness of 3 nm, for example.

The free layer 40 may have a bilayer structure comprising a CoFe layer having a thickness of 2 nm and an NiFe layer having a thickness of 1 nm, for example.

Then, a stripe-like mask 9 which extends in the width direction of the finally obtained magnetic head, for example, is formed on the above-mentioned lamination layer deposited film, i.e., free layer 40 similarly to the first embodiment.

This mask 9 serves as a mask for patterning and lift-off which will be executed later on and this mask having a depth L of 100 nm and a width W of 500 nm is formed of a photoresist layer by photolithography, i.e., pattern exposure and development.

Figure 24:
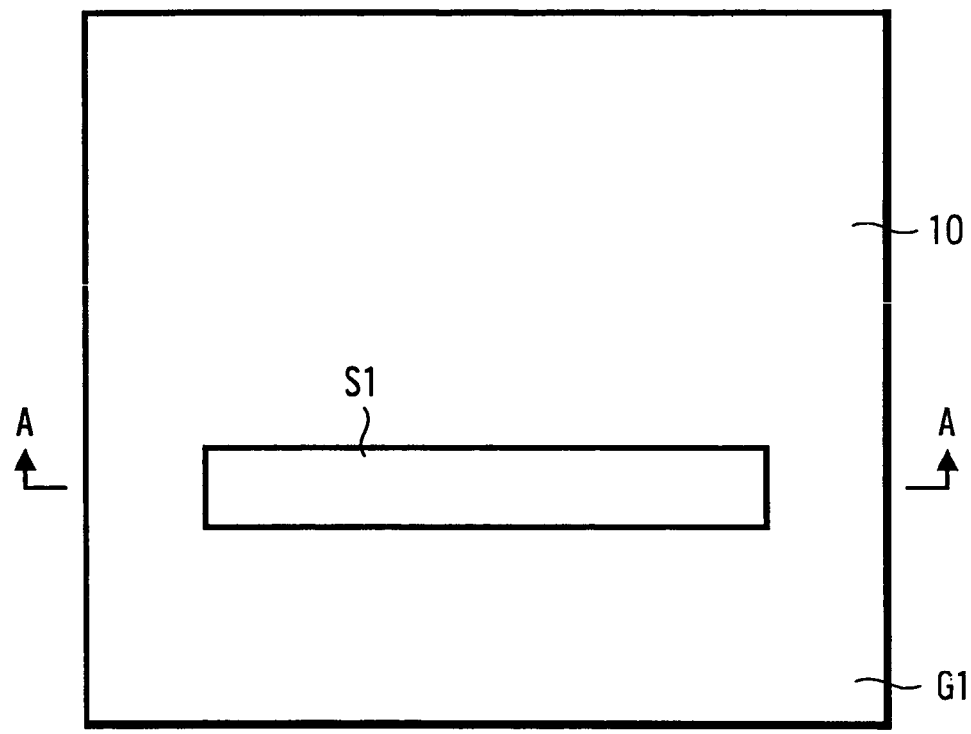
FIG. 24 is a schematic plan view of a process of other example of a manufacturing method according to the present invention.
Figure 25:
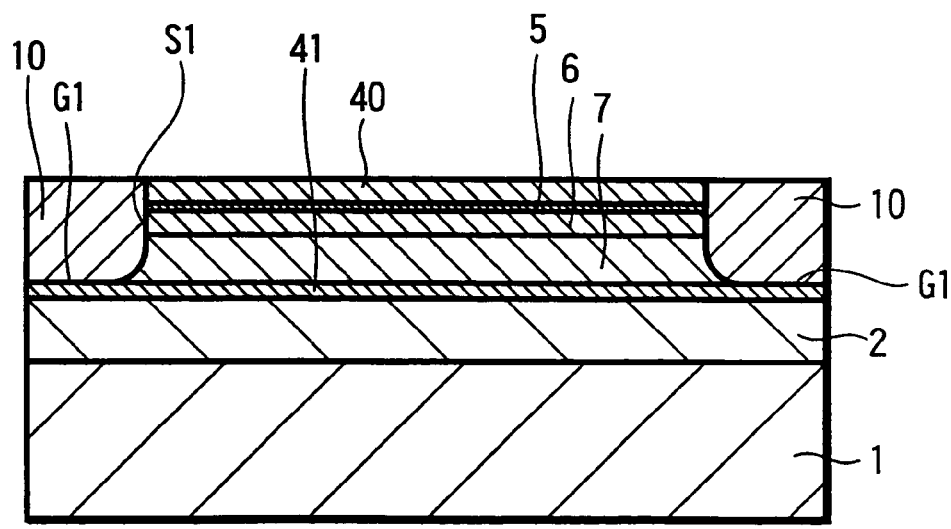
FIG. 25 is a schematic cross-sectional view taken along the line A-A in FIG. 24.

Next, as FIG. 24 shows a schematic plan view and FIG. 25 shows a schematic cross-sectional view taken along the line A-A in FIG. 24, a groove G1 is formed by patterning the free layer 40, the spacer layer 5, the fixed layer 6 and the antiferromagnetic layer 7 according to etching using the mask 9 shown in FIGS. 22 and 23 as a patterning mask, e.g., ion milling using a high-sensitivity end detector such as SIMS, and a stripe-like lamination layer structure portion S1 which is extended in the width direction encircled by this groove G1 is formed.

Then, an insulating layer 10 such as $Al_2O_3$ is formed on the whole surface so as to fill this groove G1. When the mask 9 is removed, the surface can be made flat by removing the insulating layer from the stripe-like lamination layer structure portion S1 with the insulating layer 41 in the groove G1 being left.

Figure 26:
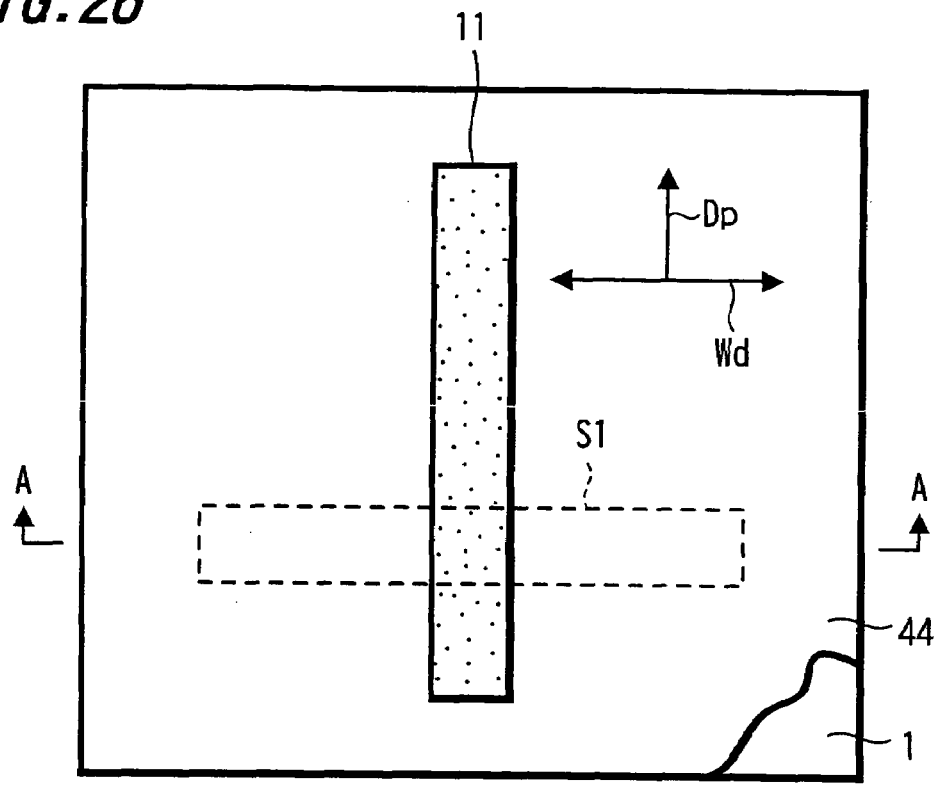
FIG. 26 is a schematic plan view of a process of other example of a manufacturing method according to the present invention.
Figure 27:
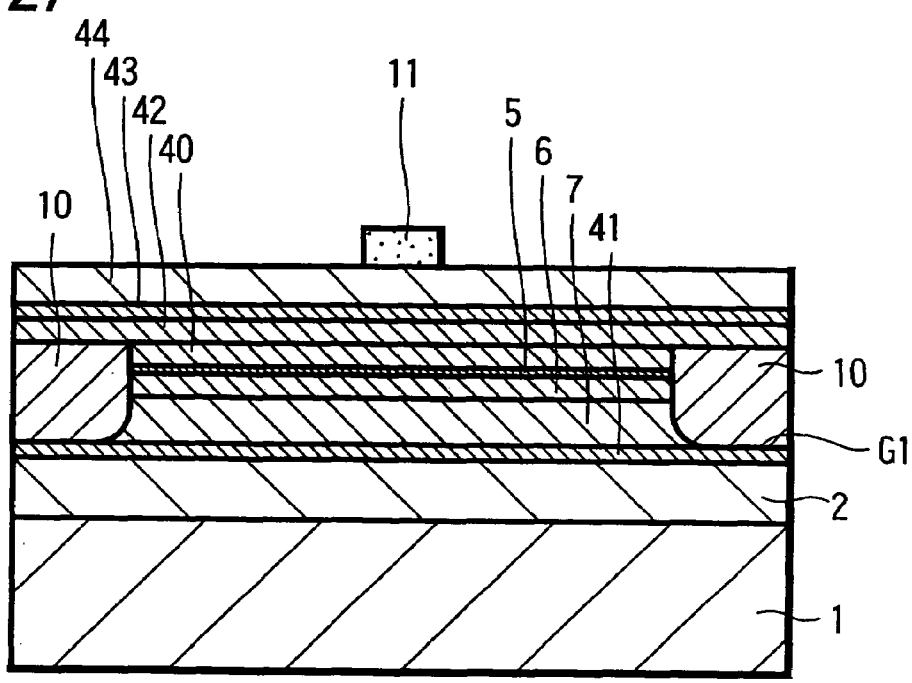
FIG. 27 is a schematic cross-sectional view taken along the line A-A in FIG. 26.

As FIG. 26 shows a schematic plan view and FIG. 27 shows a schematic cross-sectional view taken along the line A-A in FIG. 26, a magnetic flux introducing layer 42 made of NiFe having a thickness of 4 nm is deposited on the whole surface on which a protective layer 43 made of Ta having a thickness of 3 nm and a conductive nonmagnetic layer 44 made of Cu having a thickness of 27 nm which comprises a gap layer are deposited, in that order, by sputtering, for example.

Then, on the nonmagnetic layer 44, there is formed a stripe-like mask 11 which crosses, e.g., becomes perpendicular to the central portion of the extending direction of the previously formed stripe-like lamination layer structure portion and which extends in the depth direction. This mask 11 also is formed of the photoresist layer, for example, by the similar photolithography so that it may become a mask for use in patterning and lift-off which will be carried out later on.

This mask 11 has a depth of 500 nm and a width of 100 nm, for example, and there is expected a maximum difference of 100 nm in alignment accuracy of an exposure mask of an exposure system in the photolithography which is required to form the mask 11.

Figure 28:
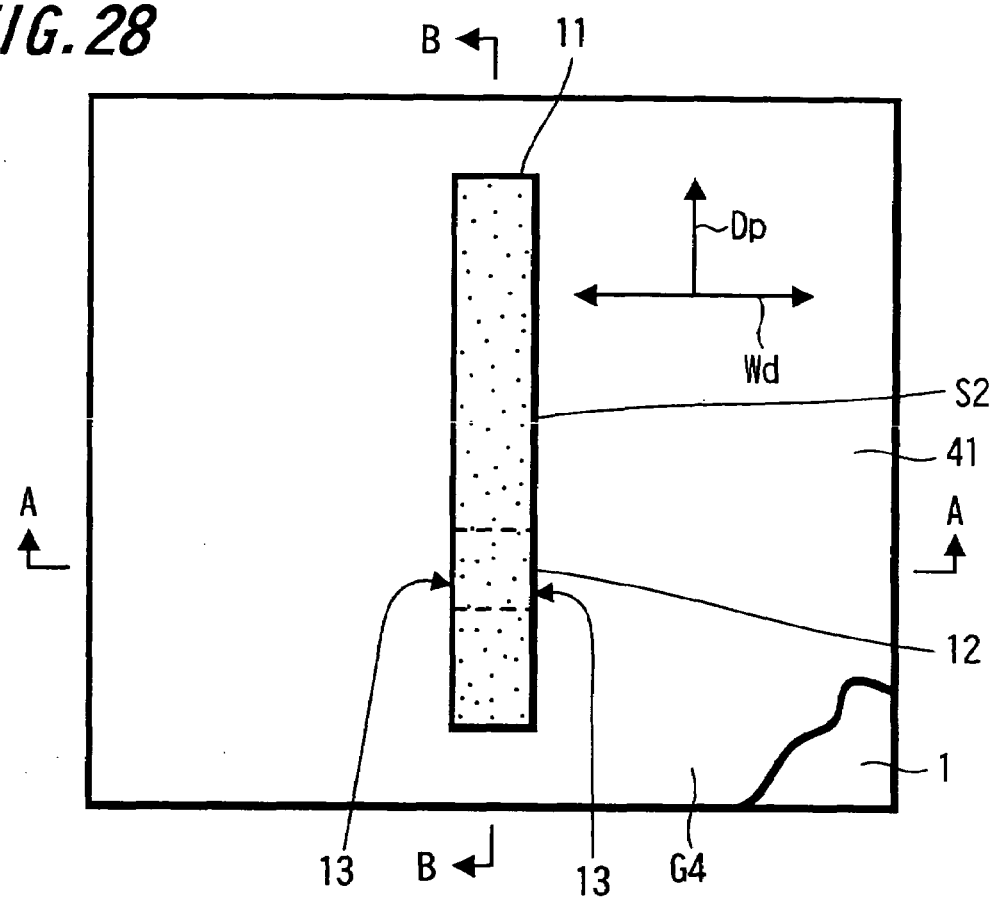
FIG. 28 is a schematic plan view of a process of an example of other embodiment according to the present invention.
Figure 29:
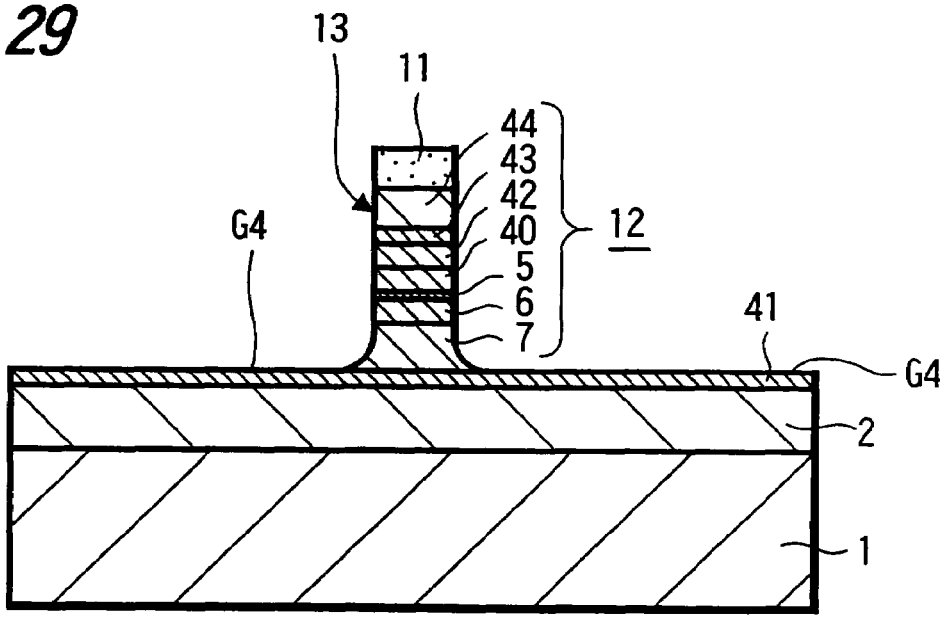
FIG. 29 is a schematic cross-sectional view taken along the line A-A in FIG. 28.
Figure 30:
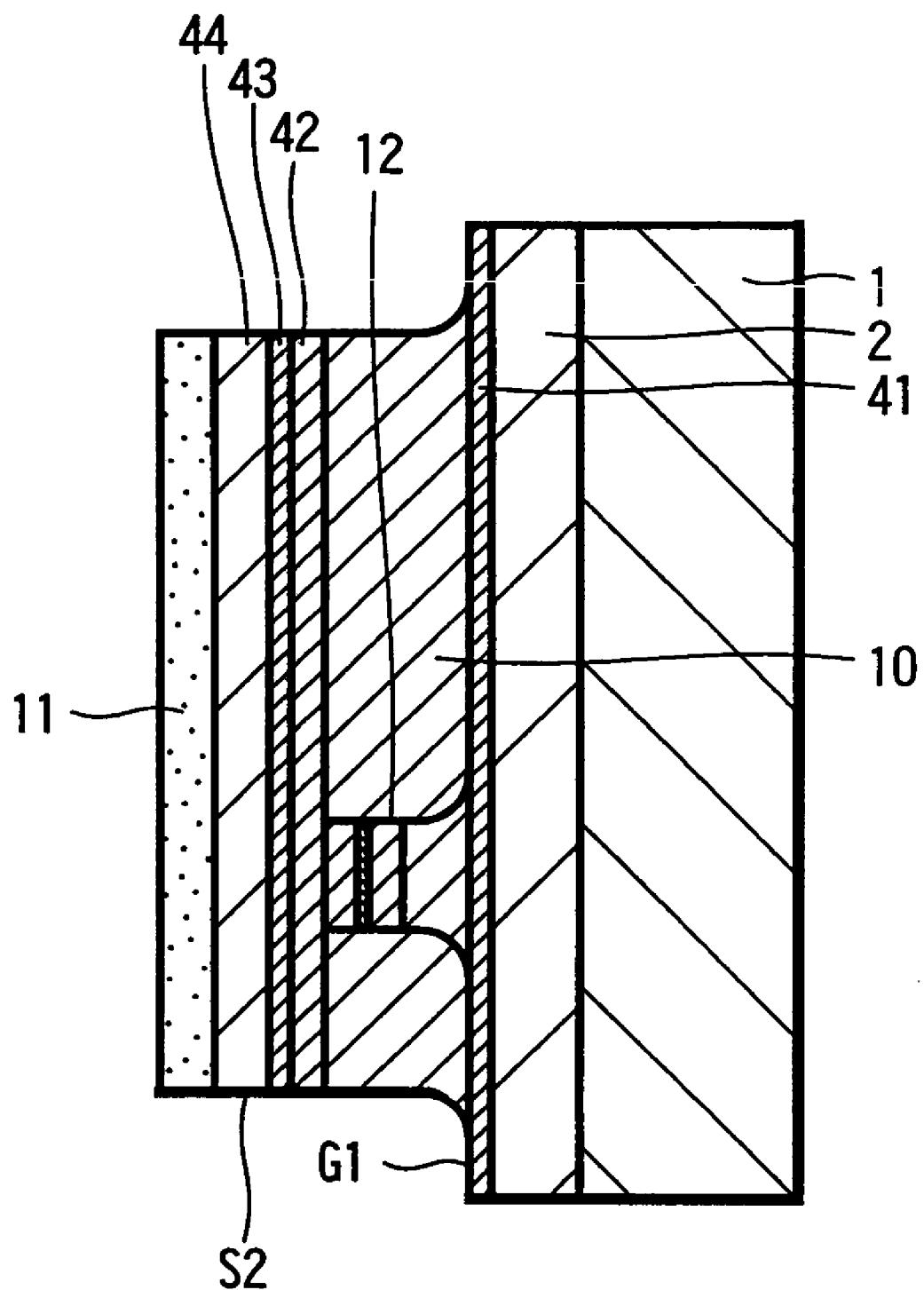
FIG. 30 is a schematic cross-sectional view taken along the line B-B in FIG. 28.

As FIG. 28 shows a schematic plan view and FIGS. 29 and 30 show schematic cross-sectional views taken along the line A-A and line B-B in FIG. 28, a groove G4 is formed by patterning the nonmagnetic layer 44, the protective layer 43, the magnetic flux introducing layer 42, the free layer 40, the spacer layer 5,.the fixed layer 6 and the antiferromagnetic layer 7 up to the surface of the underlayer 41 by patterning using the mask 11 as the patterning mask according to ion milling using the above-mentioned high-sensitivity end detector such as SIMS, for example, and a stripe portion S2 is formed.

In this manner, the stripe-like free layer 40 is left along the stripe portion S2. The spacer layer 5, the fixed layer 6, the antiferromagnetic layer 7 and the protective layer 8 are left only on the portion in which the aforementioned stripe-like lamination layer structure portion S1 and the stripe portion S2 cross each other, wherein there is constructed the lamination layer structure portion 12 having the SVMR configuration of small area.

Then, since two side surfaces 13 which cross the width direction of this lamination layer structure portion 12 are formed by the patterning of the stripe portion S2, i.e., by the same patterning process, due to the side surfaces 13, the side end faces of the lamination layer structure portion 12 and which cross the respective width directions of the free layer 40, the spacer layer 5, the fixed layer 6 and the antiferromagnetic layer 7 are formed on one flat surface or one curved surface formed by the above-mentioned patterning. Specifically, while the stripe portion S2 is formed by the patterning such as ion milling, the side surface 13 is formed as an inclined surface or a curved surface depending upon a patterning method, conditions and the like, and this side surface 13 is formed as one flat surface or a continuous curved surface. Specifically, the antiferromagnetic layer 7, the fixed layer 6, the spacer layer 5 and the free layer 40 in the lamination layer structure portion 12 are formed with nearly, i.e., substantially the same width.

In this manner, at the portion in which the stripe portion S2 crosses the aforementioned stripe-like lamination layer structure portion S1, there is formed the lamination layer structure portion 12 having the width prescribed by the width of the stripe portion S2 having the predetermined depth and which includes at least the free layer 40, the spacer layer 5, i.e., nonmagnetic layer, the fixed layer 6 and the antiferromagnetic layer 7. By the side surface 13 of the stripe portion S1, the opposing side surfaces of at least these free layer 40, spacer layer 5, i.e., nonmagnetic conductive layer, fixed layer 6 and antiferromagnetic layer 7 are formed as the same side surfaces, i.e., the continuous same surface formed of one flat surface or one curved surface formed when the stripe portion S1 is treated by patterning. Specifically, the respective layers of the lamination layer structure portion 12 are formed with substantially the same width.

Figure 31:
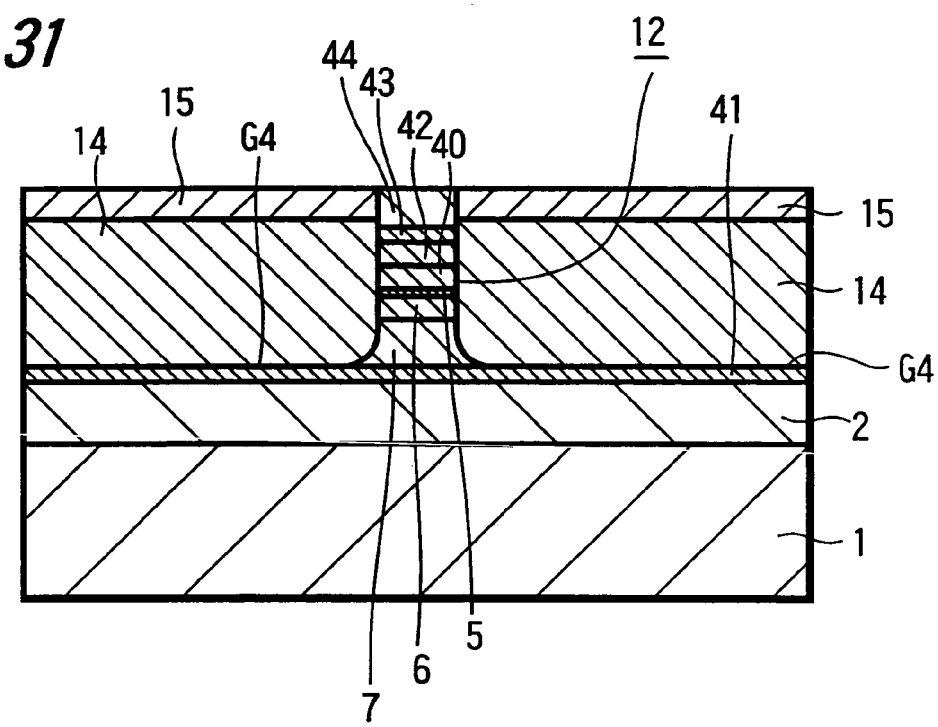
FIG. 31 is a schematic cross-sectional view of a process of other example of a manufacturing method according to the present invention.
Figure 32:
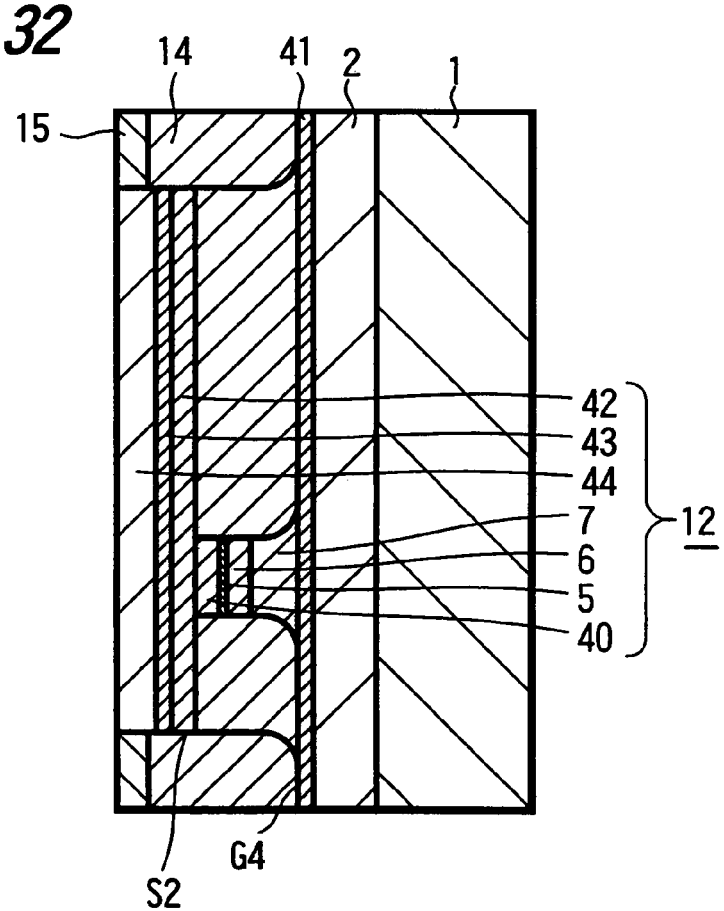
FIG. 32 is a schematic cross-sectional view of a process of other example of a manufacturing method according to the present invention.

Next, as FIGS. 31 and 32 show schematic cross-sectional views corresponding to the above-mentioned A-A cross-section and B-B cross-section, a hard magnetic layer 14 made of Co—γ $Fe_2O_3$ having a high resistance, for example, and an insulating layer 15 made of $Al_2O_3$, for example, are deposited on the whole surface by sputtering. Then, the mask 11 is removed and the hard magnetic layer 14 and the insulating layer 15 are removed from the mask 11, i.e., removed by lift-off, whereby the surfaces of the stripe portion 2 and the hard magnetic layer 14 are made flat by planarization.

At that time, although not shown, a nonmagnetic layer and the like may be deposited before the hard magnetic layer 14, for example, is deposited according to the need in such a manner that the central portion of the hard magnetic layer 14 in the thickness direction and the central portion of the free layer 40 in the thickness direction become substantially coincident with each other.

Figure 33:
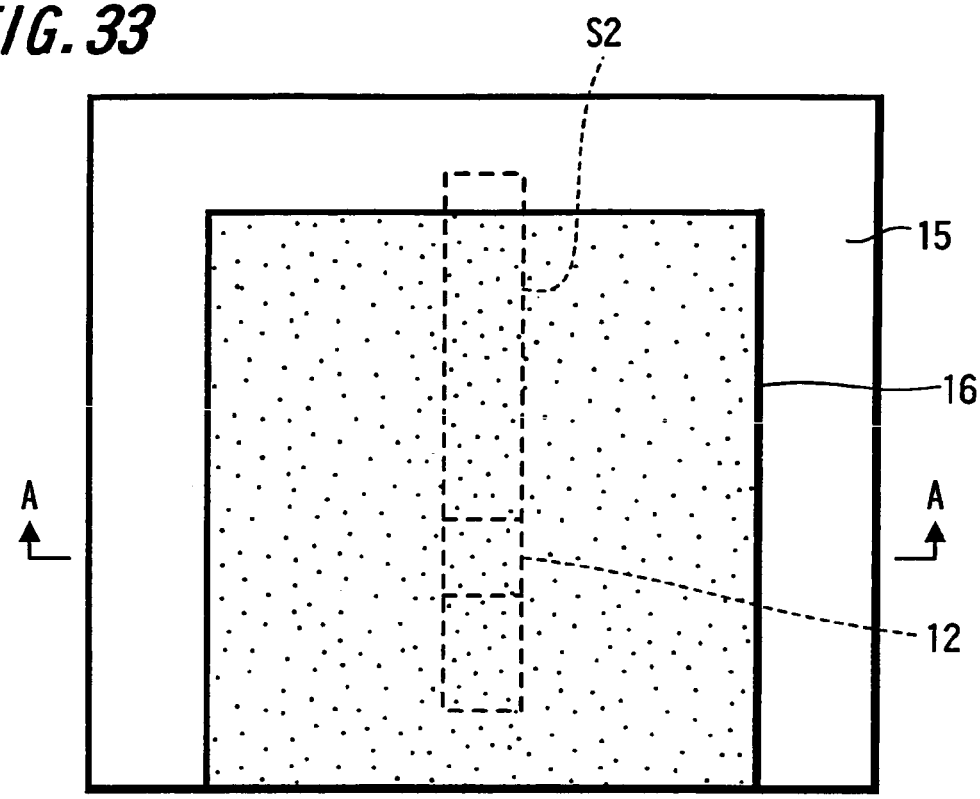
FIG. 33 is a schematic plan view of a process of other example of a manufacturing method according to the present invention.
Figure 34:
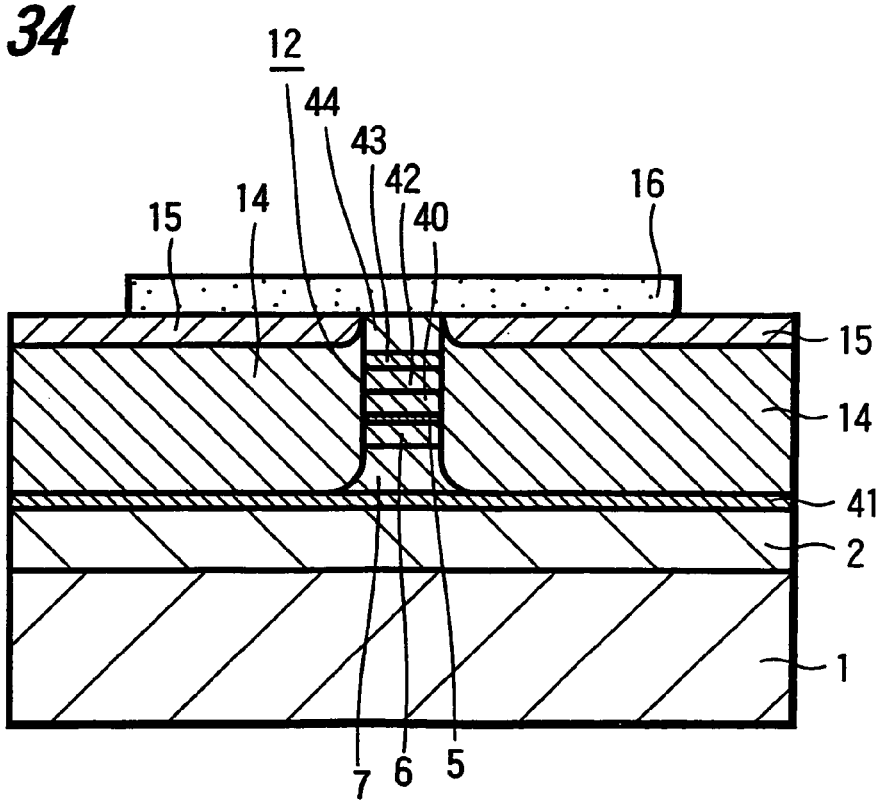
FIG. 34 is a schematic cross-sectional view taken along the line A-A in FIG. 33.

As FIG. 33 shows a schematic plan view and FIG. 34 shows a schematic cross-sectional view taken along the line A-A in FIG. 33, a mask 16 with a predetermined width and a predetermined depth serving as a similar patterning mask and which serves as a lift-off mask as well is made of a photoresist by photolithography, for example, so as to cover the stripe portion S2.

Figure 35:
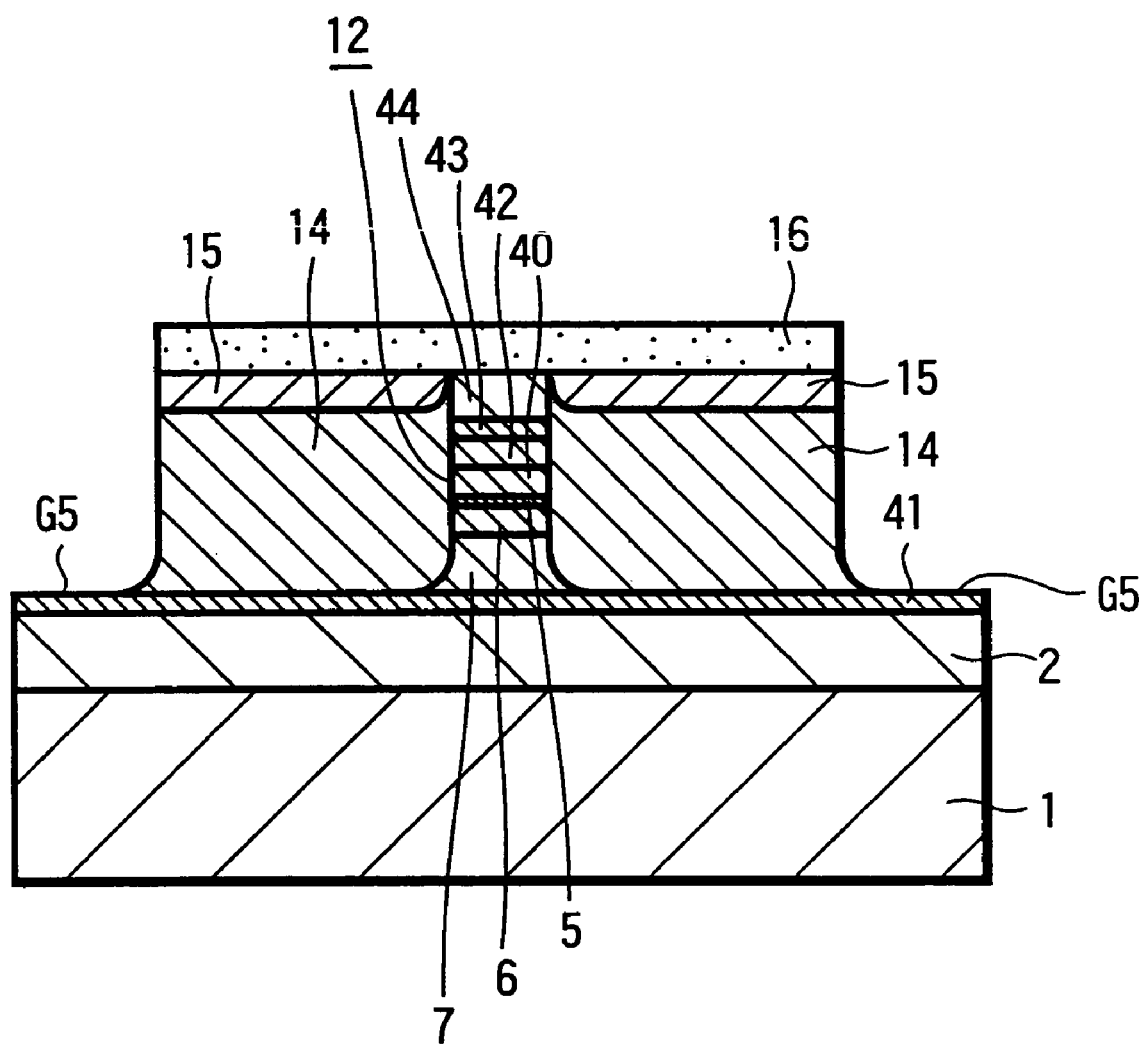
FIG. 35 is a schematic cross-sectional view of a process of other example of a manufacturing method according to the present invention.

As FIG. 35 shows a schematic cross-sectional view corresponding to the above-mentioned cross-sectional view taken along the line A-A, a groove G5 is formed by removing the portion, which is not covered with this mask 16, according to ion milling, for example.

Figure 36:
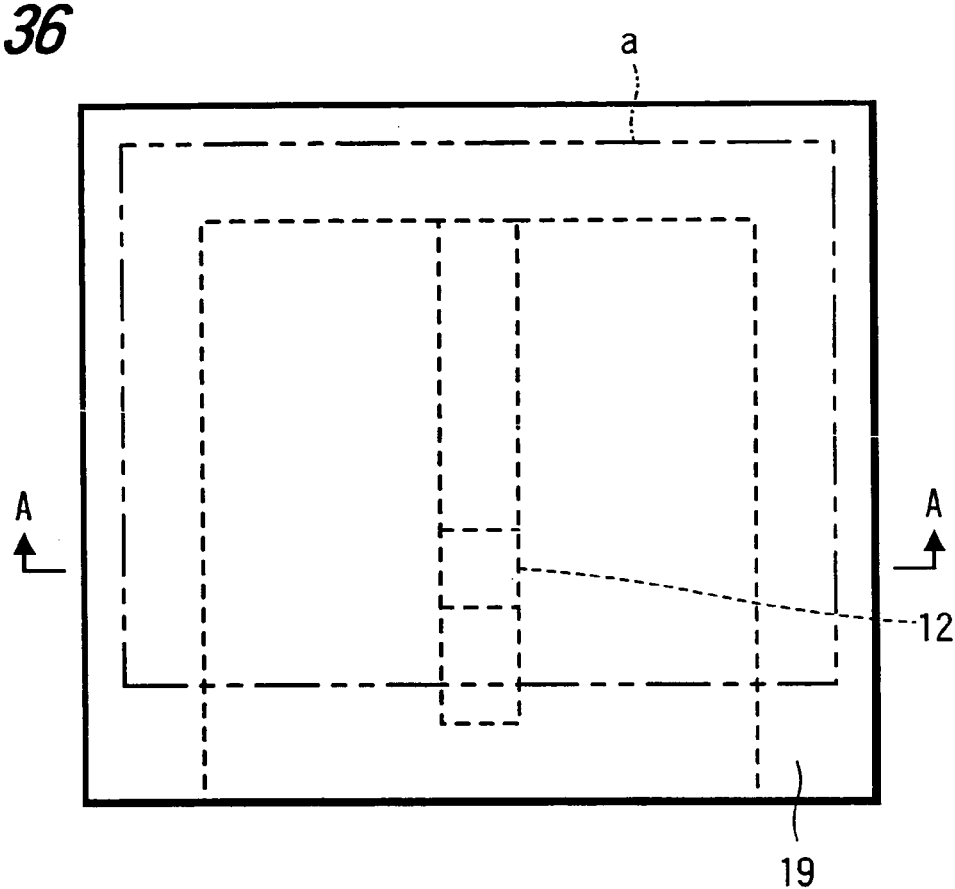
FIG. 36 is a schematic plan view of a process of other example of a manufacturing method according to the present invention.
Figure 37:
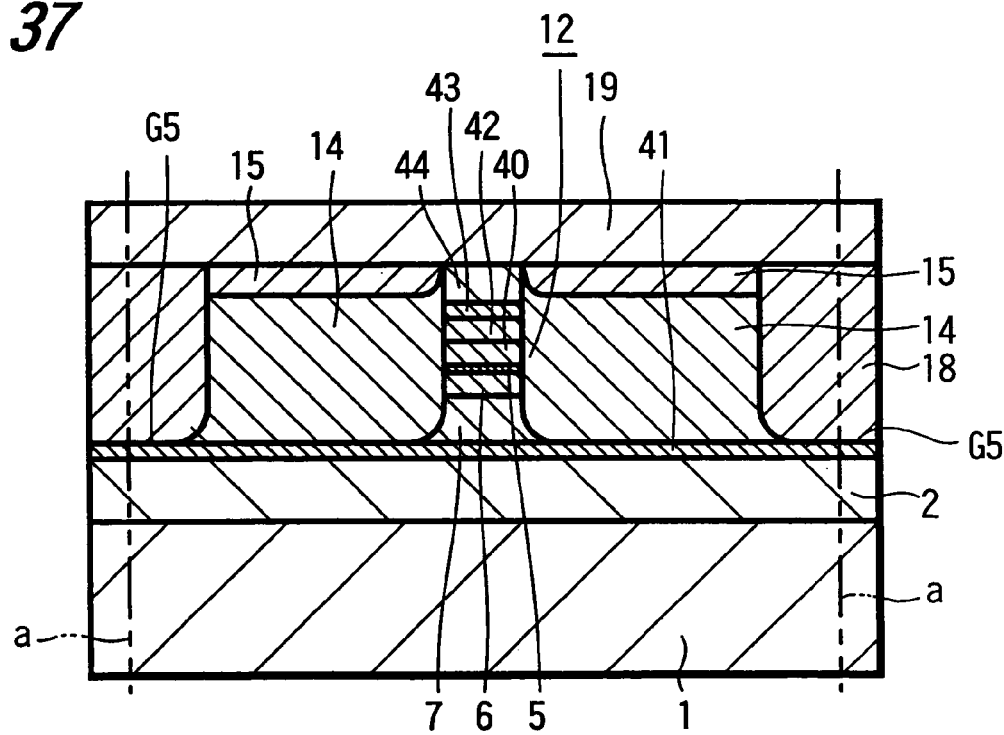
FIG. 37 is a schematic cross-sectional view taken along the line A-A in FIG. 36.

As FIG. 36 shows a schematic plan view and FIG. 37 shows a schematic cross-sectional view taken along the line A-A, an insulating layer 18 is formed within the groove G5 and the surface is made flat by planarization.

When this insulating layer 18 is formed, in FIG. 35, the insulating layer 18 made of $Al_2O_3$ is formed on the whole surface including the groove G5 and the insulating layer 18 is formed on the groove by removing the mask 16 according to lift-off, although not shown.

Then, a second shield and electrode layer 19 having a thickness of 2 μm, for example, is deposited on this flat surface by NiFe plating.

Figure 38:
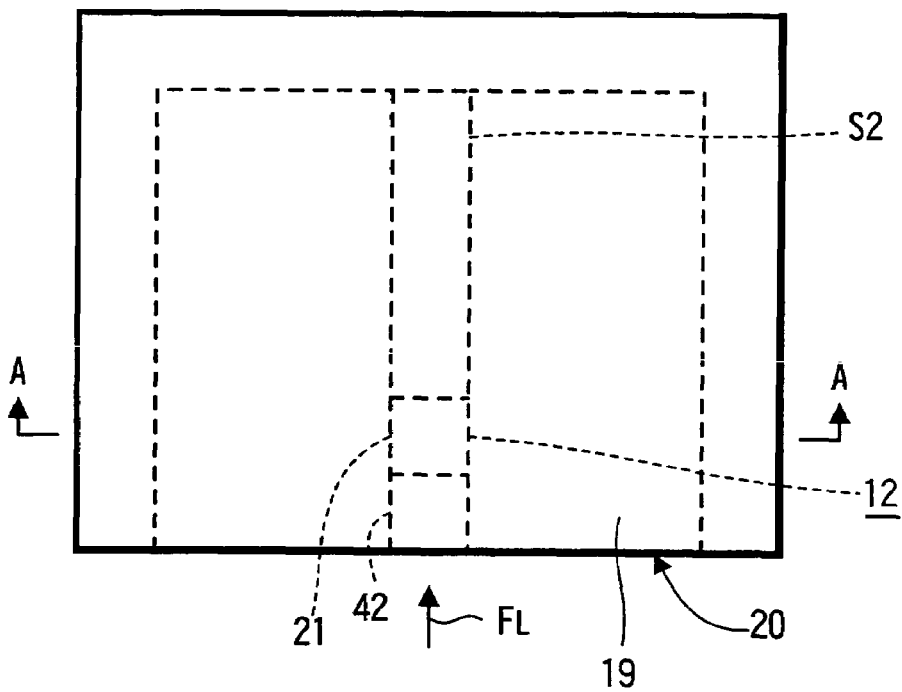
FIG. 38 is a schematic plan view of an example of a magnetic head using magneto-resistive effect according to the present invention.
Figure 39:
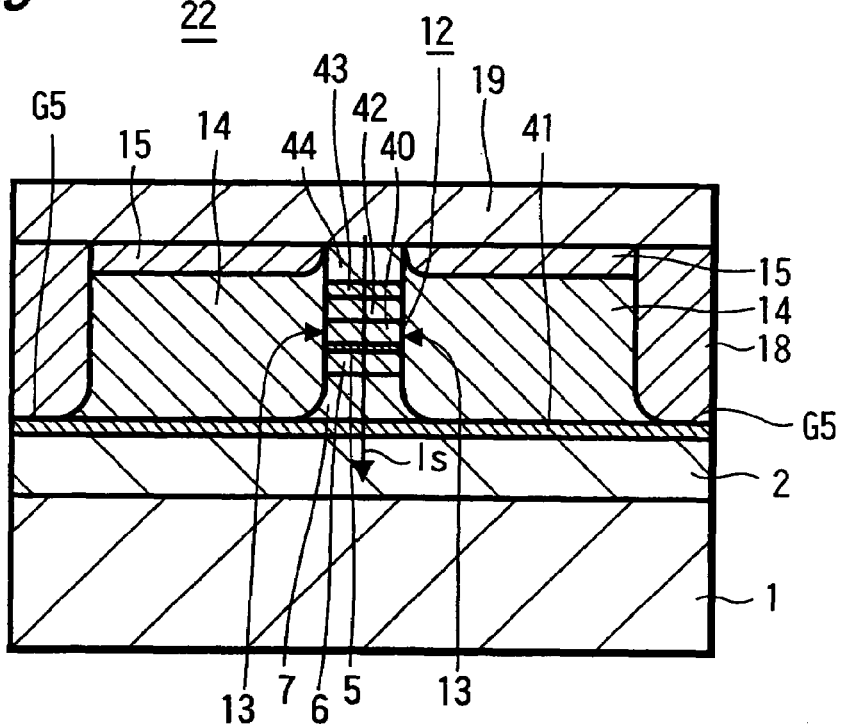
FIG. 39 is a schematic cross-sectional view taken along the line A-A in FIG. 38.

Then, the block thus formed is diced along a cutting line shown by a dot-and-dash line a in FIGS. 36 and 37. As FIG. 38 shows a schematic cross-sectional view and FIG. 39 shows a cross-sectional view taken along the line A-A in FIG. 38, a surface which is brought in contact with or is opposed to a magnetic recording medium, e.g., a front surface 20 which serves as an ABS is formed by polishing and the magnetic head using magneto-resistive effect 22 is formed.

Thereafter, with application of a magnetic field of 10 kOe parallel to a magnetic flux introducing direction shown by an arrow $F_L$, i.e., the direction in which an external magnetic field is applied at 250° C. and in the vacuum, for example, the magnetization of the antiferromagnetic layer 7 on the side of the fixed layer 6 is magnetized in the magnetic flux introducing direction.

Moreover, in the vacuum and at 200° C., with application of a magnetic field of 1 kOe to the direction perpendicular to the magnetic flux introducing direction, a uniaxial magnetic induction anisotropy is given to the free layer 40.

Further, in the atmosphere and at a room temperature, with application of a magnetic field of 10 kOe to the direction perpendicular to the magnetic flux introducing direction, the hard magnetic layer 14 is magnetized in the direction extended along its plane direction and which is the direction crossing the direction in which the stripe portion S2 is extended.

In this manner, there is formed the GMR element 21 having the SVMR configuration including the stripe-like stripe portion S2, the magnetic flux introducing layer 42 in which the front end is formed so as to oppose to the front surface 20 and in which the lamination layer structure portion 12 having the SVMR configuration magnetically coupled to this magnetic flux introducing layer 42 at the position advanced from the front surface 20 to the depth direction by the predetermined distance and which is comprised of the free layer 40, the spacer layer (nonmagnetic conductive layer) 5, the fixed layer 6 and the antiferromagnetic layer is formed below in the limited area, and there is constructed the inventive magnetic head using magneto-resistive effect 22 having the SVMR configuration which uses this element as a magnetic sensing portion thereof.

Then, the GMR element having this configuration, i.e., the magneto-resistive effect element and the magnetic head using magneto-resistive effect 22 also, as shown in FIG. 39, has a configuration in which the sense current Is flows through the first and second shield and electrode layers 2 and 19 from one to the other, i.e., the CPP configuration in which the sense current flows through the lamination layer direction of the lamination layer structure portion 12.

Moreover, in this configuration, the tip end of the magnetic flux introducing layer 40 is opposed to this front surface 20, and an external magnetic field,i.e., in the magnetic head, a signal magnetic field based upon magnetic recording on the magnetic recording medium is introduced from this tip end. This signal magnetic field is introduced into the laminator layer structure portion 12 which is formed at the position advanced from this front surface 20 to the depth direction by the predetermined distance, thereby causing a spin-dependence scattering to occur against the above-mentioned sense current Is. Specifically, the change of resistance is produced and this change of resistance is produced as an electrical output based upon the sense current Is.

Then, since this configuration is formed as the CPP type configuration, the characteristics of the CPP type configuration can be exhibited, i.e., the configuration has the low resistance because the sense current flows through the film thickness direction, whereby the configuration can decrease its area, accordingly, the configuration can increase its density. Also, since the first and second shield and electrode layer 2 and 19 having a high heat conductivity are thermally disposed close to each other across the lamination layer structure portion 12, the magneto-resistive effect element or the magnetic head using magneto-resistive effect has the highly-reliable configuration which is excellent in heat radiation effect and which can continue the stable operations.

Moreover, since the side surfaces of the respective layers of its lamination layer structure portion 12 are formed as the side surfaces 13 which form substantially the same plane, similarly to the above-mentioned manufacturing method according to the present invention, the respective layers can be formed with the same pattern by the same processes, whereby the manufacturing can be simplified.

Moreover, as described above, since the positional relationship between the hard magnetic layer 14 and the free layer 40 is selected in such a manner that the central portions of both of the hard magnetic layer and the free layer in the film thickness directions substantially agree with each other, as mentioned before, the bias magnetic field can effectively be applied to the free layer from the thick hard magnetic layer 14, whereby the stability of the free layer can be improved more.

Since $Ms_F \times t_F$ in the free layer 40 obtained when the free layer is comprised of a CoFe layer having a thickness of 2 nm and an NiFe layer having a thickness of 5 nm, for example, becomes 0.66 emu/cm³, when the hard magnetic layer 14 is comprised of a Co—γ $Fe_2O_3$ layer having a thickness sufficiently larger than that of the free layer, e.g., 34 nm, there can be obtained $Mr_H \times t_H = 0.85$ emu/cm³ which is larger than a product of the saturation magnetic field and the thickness of the free layer 40.

Moreover, since the magnetic head using magneto-resistive effect has the shield type configuration in which the front end faces of the first and second shield and electrode layers 2 and 19 are opposed to the front surface 20, the introduction of the external magnetic field can be restricted so that this magnetic head using magneto-resistive effect can be constructed as the head which is high in resolution.

Moreover, according to the above-mentioned configuration, since the stripe portion S1 is operated at its portion behind the lamination layer structure portion 12, i.e., at its portion opposite to the front surface 20 as the magnetic flux introducing layer, magnetic flux leaked from the lamination layer structure portion 12 to the magnetic shield layer, in this example, the shield and electrode layers 2 and 19 can be decreased, and the efficiency of the magneto-resistive effect can be improved.

Figure 40:
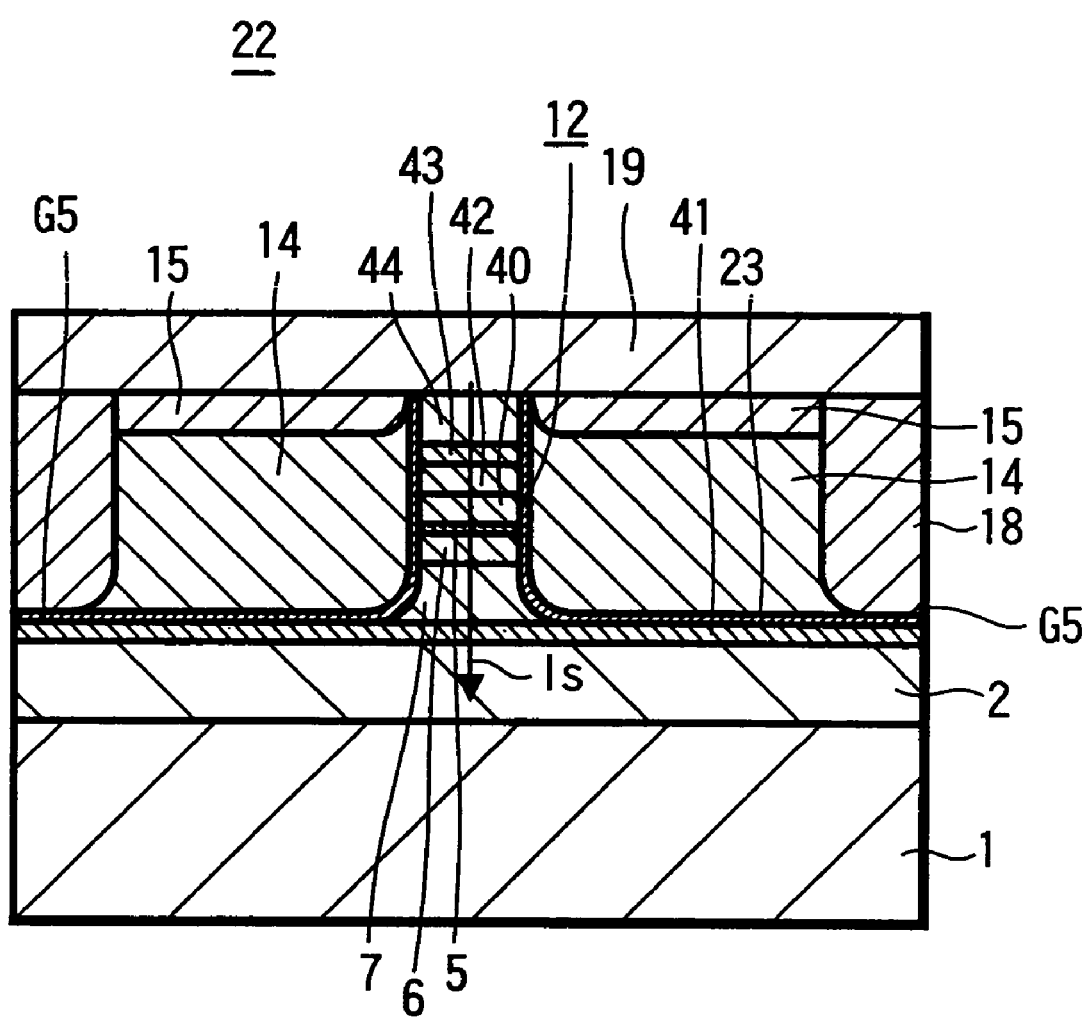
FIG. 40 is a schematic plan view of other example of a magnetic head using magneto-resistive effect according to the present invention.

Moreover, while the hard magnetic layer 14 is made of the high resistance-material in the above-mentioned example, when this hard magnetic layer 14 is made of a material of low resistance, e.g., CoCrPt, as FIG. 40 shows a schematic cross-sectional view corresponding to FIG. 39, prior to the hard magnetic layer 14 is formed, there is deposited an insulating layer 23 made of a suitable material such as $SiO_2$ and SiN on which the hard magnetic layer 14 is formed, thereby making it possible to avoid the sense current Is, flowing through the first and second shield and electrode layers 2 and 19, from being leaked from the hard magnetic layer 14.

Moreover, also in this embodiment, similarly to the description that has been so far made with reference to FIG. 21, the magnetic head using magneto-resistive effect can be constructed as a magnetic recording and reproducing head by laminating an electromagnetic induction type thin-film magnetic recording head 30 to this magnetic head using magneto-resistive effect.

While the lamination layer structure portion 12 having the SVMR configuration is formed as a single SV configuration, free layers of the pair of SVMR configurations may be made common and the lamination layer structure portions having the respective SVMR configurations may be constructed on both surfaces of the free layer, whereby the detection output of the external magnetic field can be increased.

This embodiment will be described.

THIRD EMBODIMENT

An example of this case will be described with reference to FIGS. 41 to 63.

Figure 41:
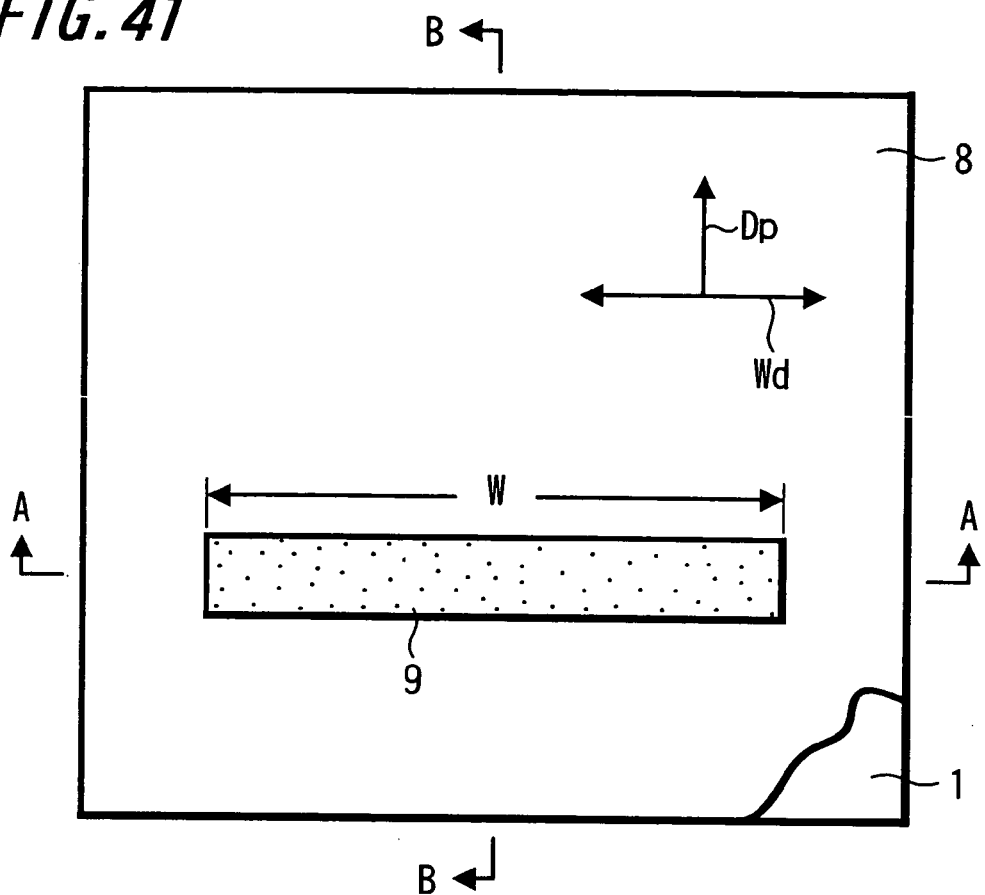
FIG. 41 is a schematic plan view of a process of a further example of a manufacturing method according to the present invention.
Figure 42:
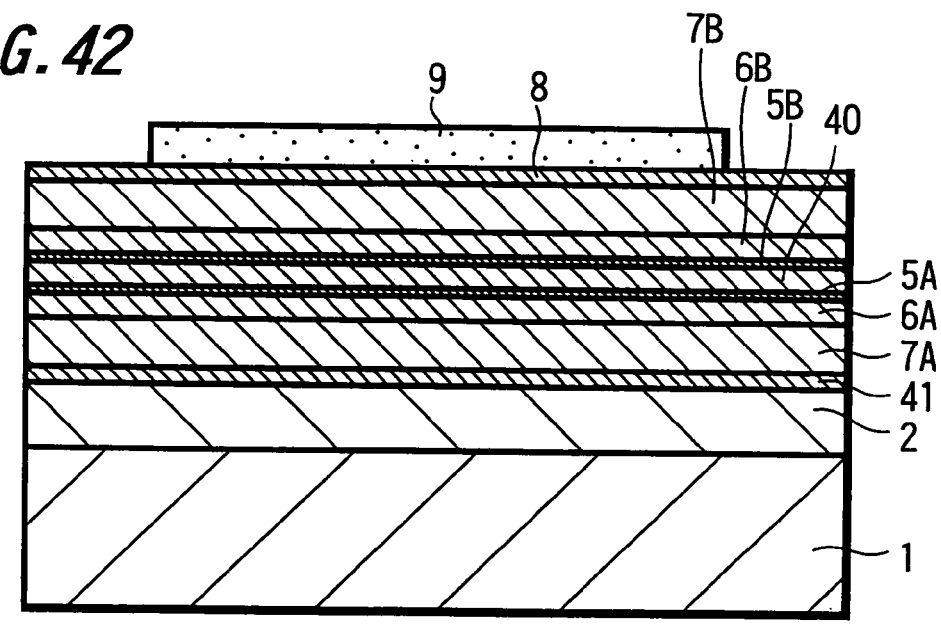
FIG. 42 is a schematic cross-sectional view taken along the line A-A in FIG. 4.1.

Also in this case, as FIG. 41 shows a schematic plan view and FIG. 42 shows a schematic cross-sectional view taken along the line A-A in FIG. 41, there is prepared a substrate 1 made of AlTiC (AlTiC) having a thickness of 2 nm on which there is deposited a first shield and electrode layer 2 made of NiFe having a thickness of 2 μm, for example, serving as one magnetic shield layer of a finally obtained magnetic head and which comprises one electrode by plating, for example.

Then, an underlayer 41, an antiferromagnetic layer 7A, a fixed layer 6, a spacer layer 5A, i.e., nonmagnetic conductive layer, a common free layer 40, each having conductivity, comprising one SVMR element and a spacer 5B, i.e., nonmagnetic conductive layer, a fixed layer 6B, an antiferromagnetic layer 7B, a protective layer 8, i.e., capping layer comprising the other SVMR element are sequentially laminated and deposited on this first shield and electrode layer 2 by sputtering.

The underlayer 41 can be comprised of Ta having a thickness of 3 nm, for example.

The antiferromagnetic layers 7A and 7B can be comprised of PtMn having a thickness of 15 nm, for example.

Each of the fixed layers 6A and 6B can be made up of a trilayer structure of a CoFe layer, an Ru layer having a thickness of 1 nm and a CoFe layer. Then, in this case, the CoFe layer may have at its side in which it is brought in contact with the respective spacer layers 5A and 5B of the fixed layers 6A and 6B a thickness of 2 nm, and the CoFe layer may have at its opposite side a thickness of 3 nm.

Each of the spacer layers 5A and 5B can be comprised of Cu having a thickness of 3 nm.

Moreover, the free layer 41 can be made up of a trilayer structure of a CoFe layer having a thickness of 2 nm, an NiFe layer having a thickness of 3 nm and a CoFe layer having a thickness of 2 nm, for example.

Moreover, the protective layer 8 can be comprised of Ta having a thickness of 3 nm, for example.

On this lamination layer film, i.e., the protective layer 8, there is formed a mask 9 made of photoresist, for example, having a depth of 100 nm and a width of 500 nm serving as a patterning mask and a lift-off mask which will be described later on by photolithography.

Figure 43:
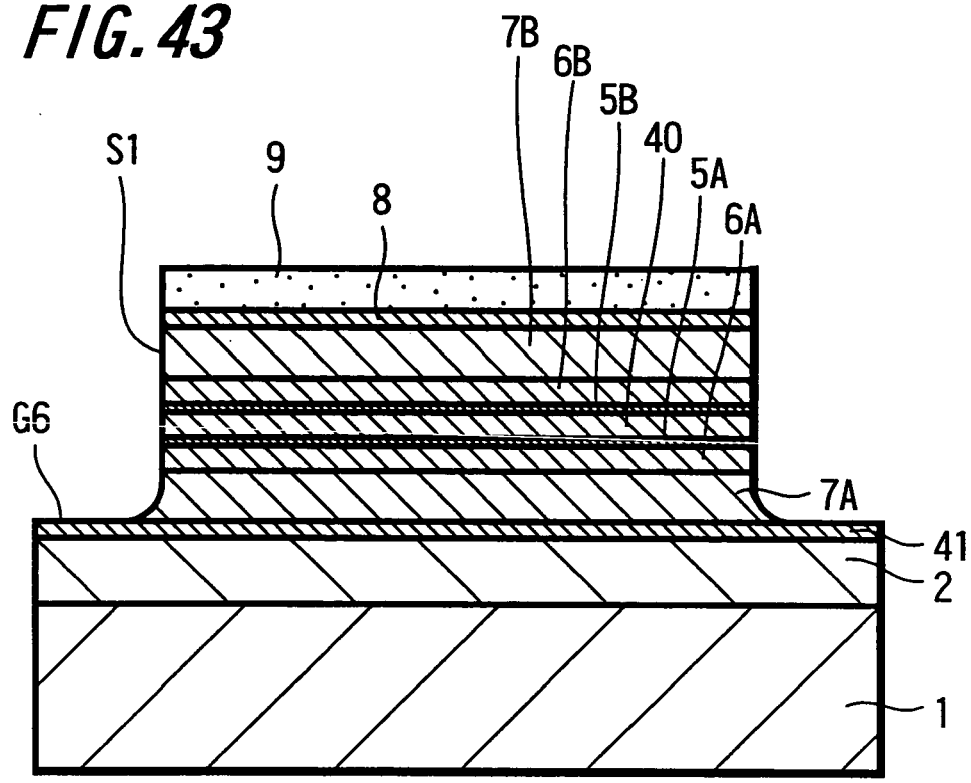
FIG. 43 is a schematic cross-sectional view of a process of a further example of a manufacturing method according to the present invention.
Figure 44:
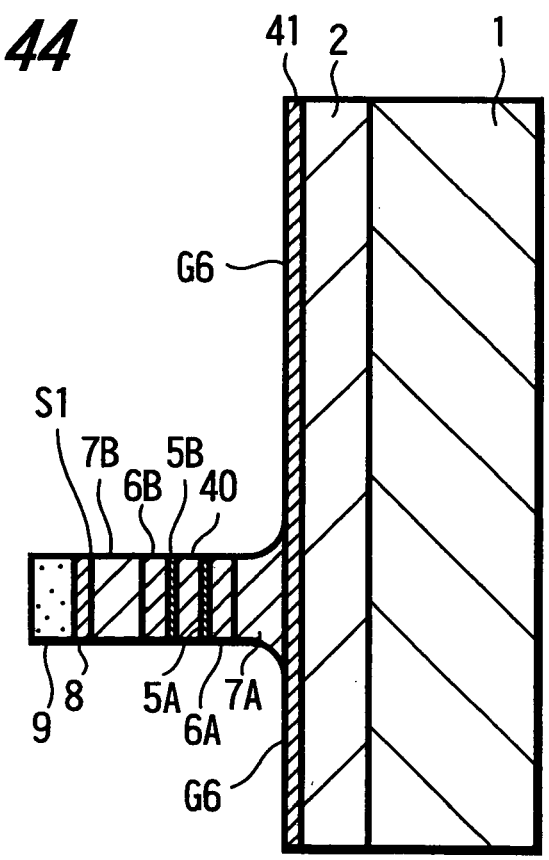
FIG. 44 is a schematic cross-sectional view of a process of a further example of a manufacturing method according to the present invention.

As FIGS. 43 and 44 show schematic cross-sectional views corresponding to the above-mentioned cross-sections taken along the line A-A and the line B-B, a groove G6 is formed by removing the layer portion up to above the underlayer 41 by using the mask 9 according to patterning, e.g., ion milling using high-sensitivity end detector such as SIMS, and a stripe-like lamination layer portion S1 surrounded by this groove G6 is formed.

Figure 45:
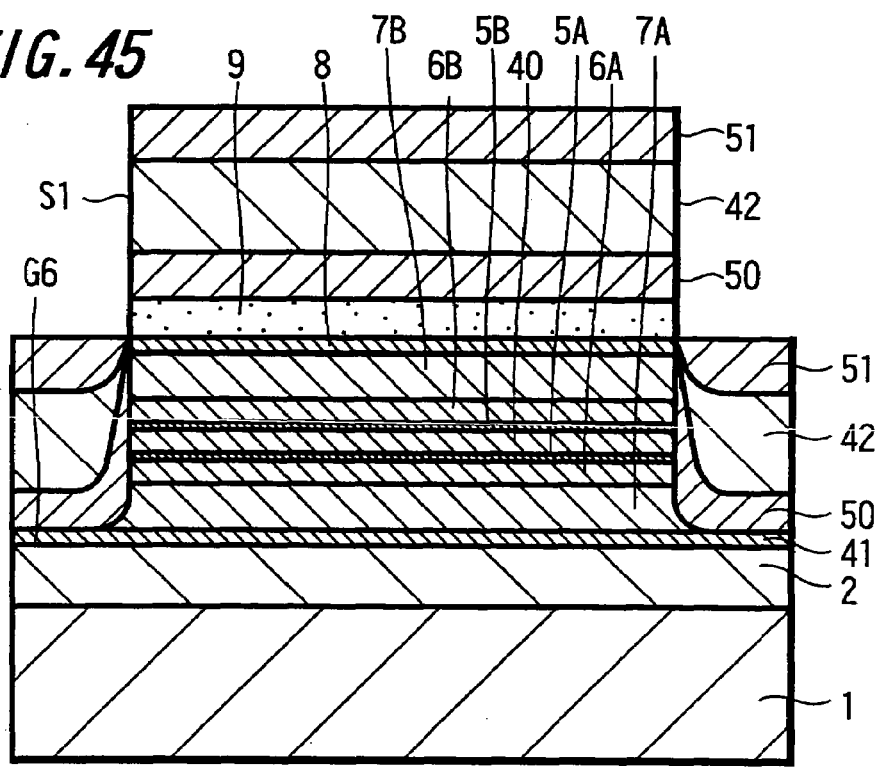
FIG. 45 is a schematic cross-sectional view of a process of a further example of a manufacturing method according to the present invention.
Figure 46:
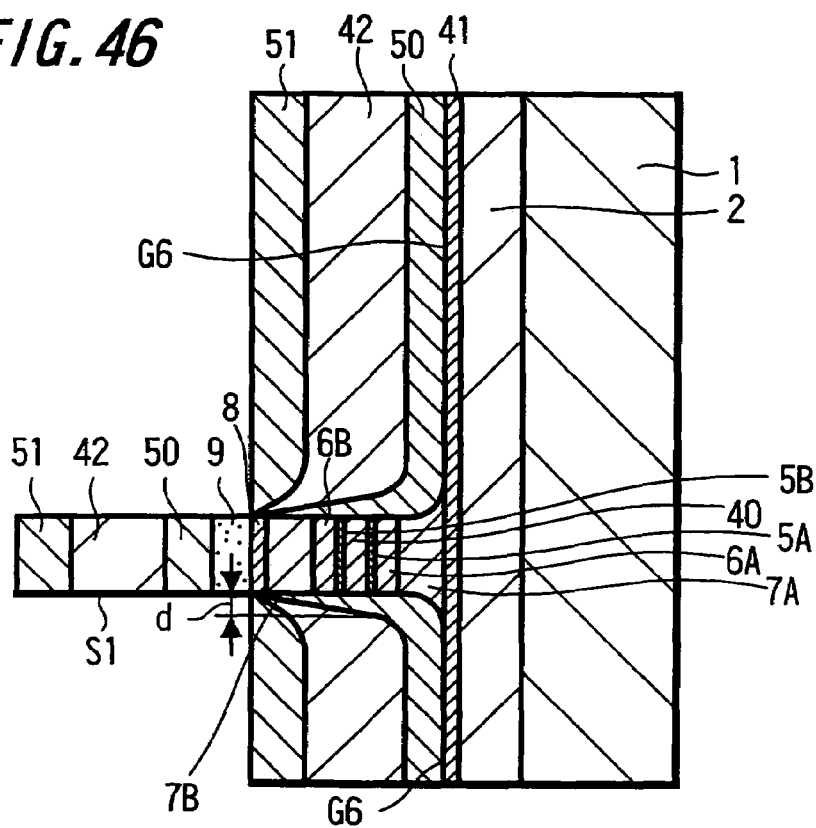
FIG. 46 is a schematic cross-sectional view of a process of a further example of a manufacturing method according to the present invention.

Thereafter, as FIGS. 45 and 46 show schematic cross-sectional views corresponding to the above-mentioned cross-sections taken along the line A-A and the line B-B, an insulating layer 50 made of $Al_2O_3$ having a thickness of 22 nm, for example, a magnetic flux introducing layer 42 made of NiFe having a thickness of 11 nm, for example, and an insulating layer 51 made of $Al_2O_3$ having a thickness of 25 nm, for example, are laminated on the whole surface covering the inside of the groove G6, in that order, by sputtering, for example.

In this case, the insulating layer 50, in particular, is deposited on the side surface of the stripe-like lamination layer portion S1 with a predetermined depth d by selecting sputtering conditions and by sputtering from the oblique direction.

Figure 47:
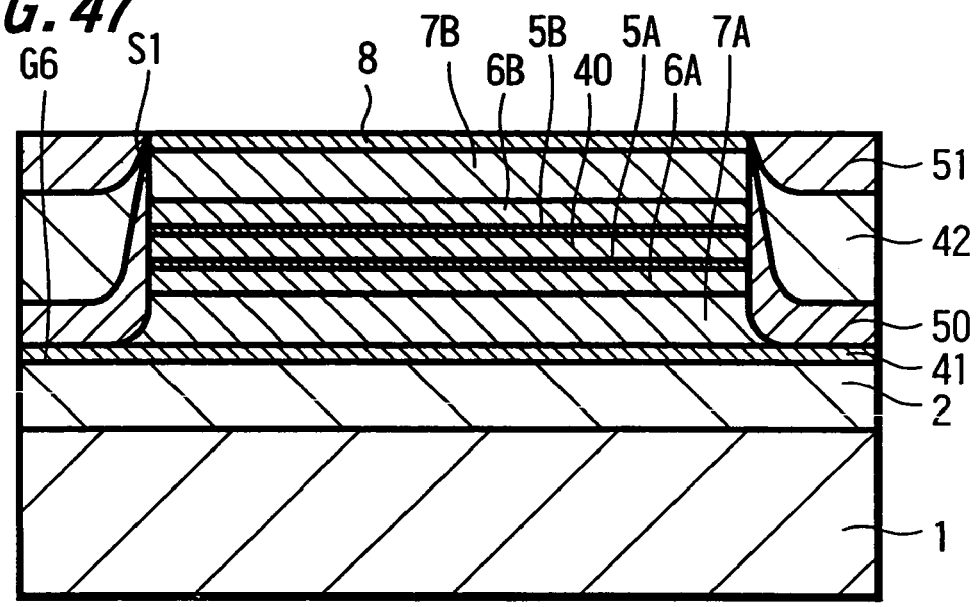
FIG. 47 is a schematic cross-sectional view of a process of a further example of a manufacturing method according to the present invention.
Figure 48:
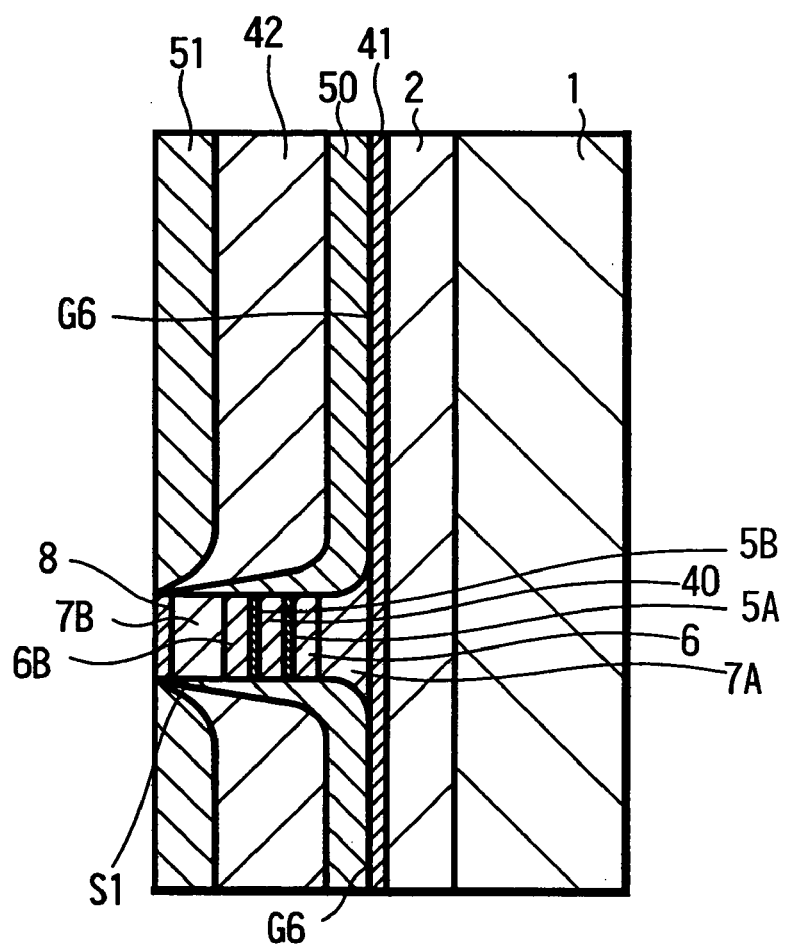
FIG. 48 is a schematic cross-sectional view of a process of a further example of a manufacturing method according to the present invention.

As FIGS. 47 and 48 show schematic cross-sectional views corresponding to the above-mentioned cross-sections taken along the line A-A and the line B-B, the mask 9 is removed, the above-mentioned insulating layer 50, magnetic flux introducing layer 42 and insulating layer 51 formed on this mask are lifted off, and the insulating layer 50, the magnetic flux introducing layer 42 and the insulating layer 51 are filled into the groove G6 around the stripe-like lamination layer portion S1, whereafter the surface is made flat by planarization.

Figure 49:
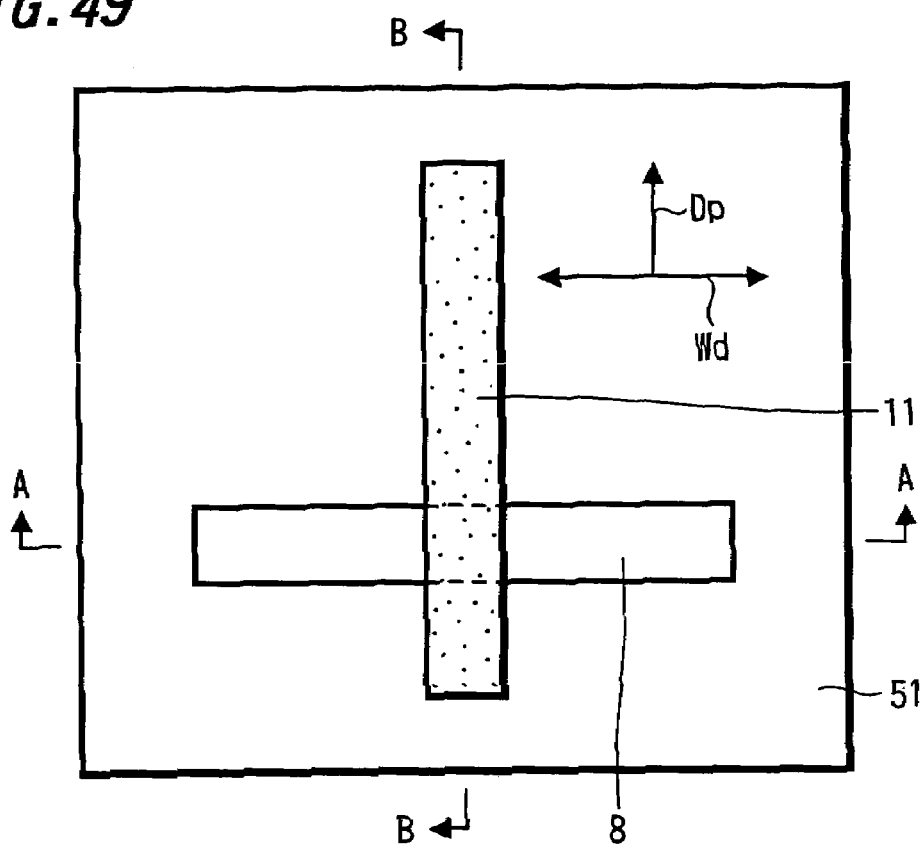
FIG. 49 is a schematic plan view of a process of a further example of a manufacturing method according to the present invention.
Figure 50:
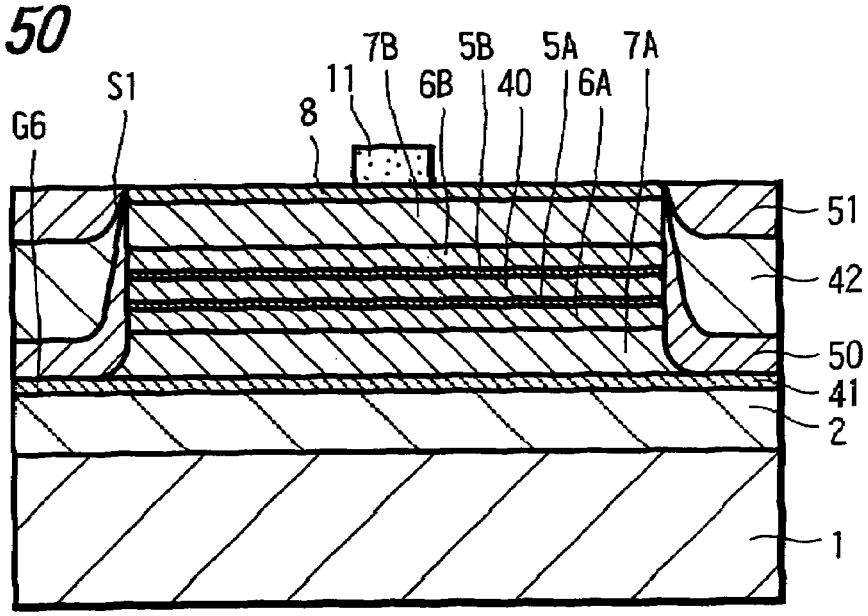
FIG. 50 is a schematic cross-sectional view taken along the line A-A in FIG. 49.
Figure 51:
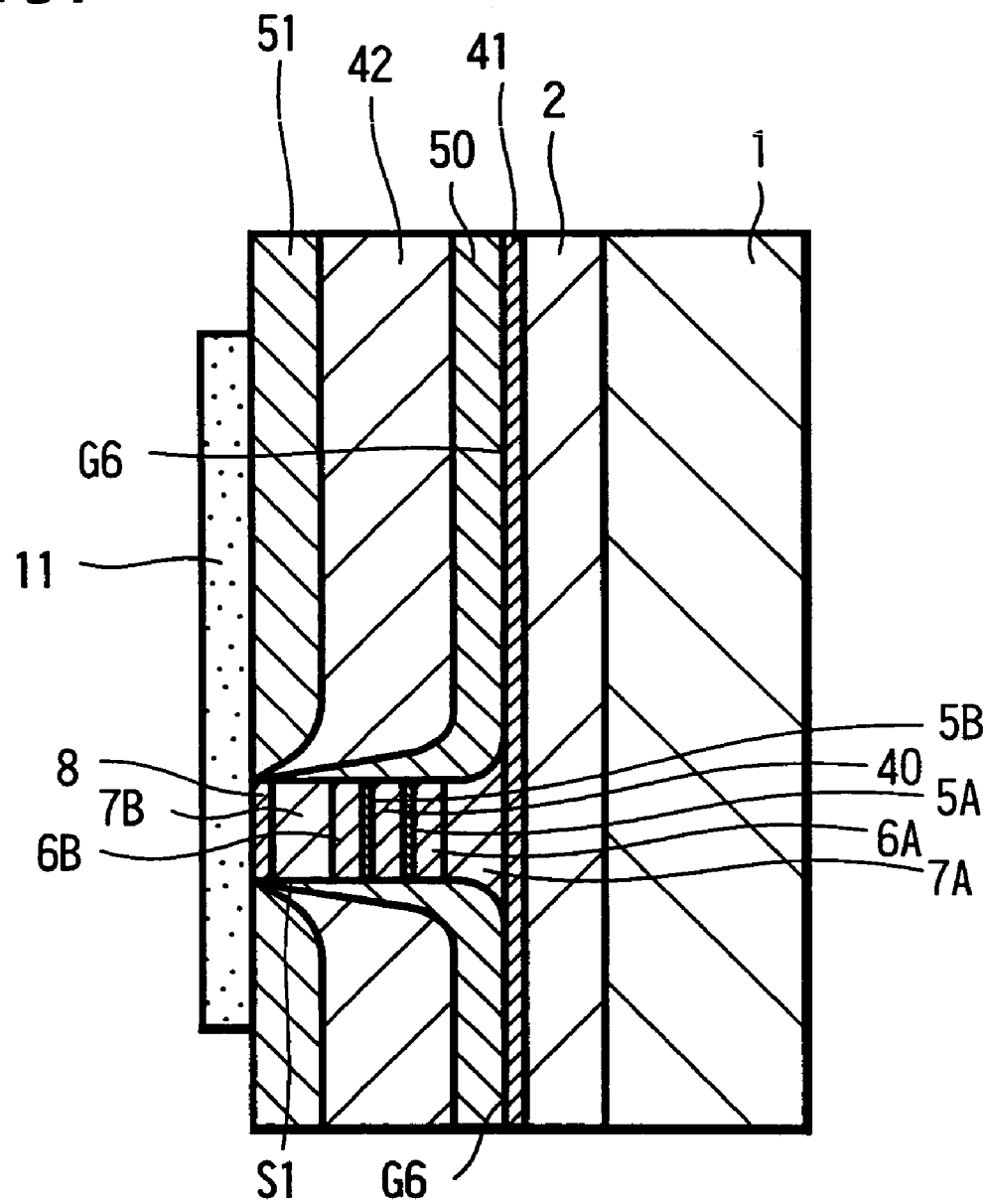
FIG. 51 is a schematic cross-sectional view taken along the line B-B in FIG. 49.

As FIG. 49 shows a schematic plan view and FIGS. 50 and 51 show cross-sectional views taken along the line A-A and the line B-B in FIG. 49, a mask 11 having a depth of 700 nm and a width of 100 nm serving similarly as a patterning mask and a lift-off mask is formed of photoresist, for example, across the central portion of the stripe-like lamination layer portion by photolithography.

In this case, since a maximum difference of 100 nm of the pattern alignment accuracy is produced in the exposure system in the photolithography, the widths of the masks 9 and 11 should be selected taking such difference into consideration.

Figure 52:
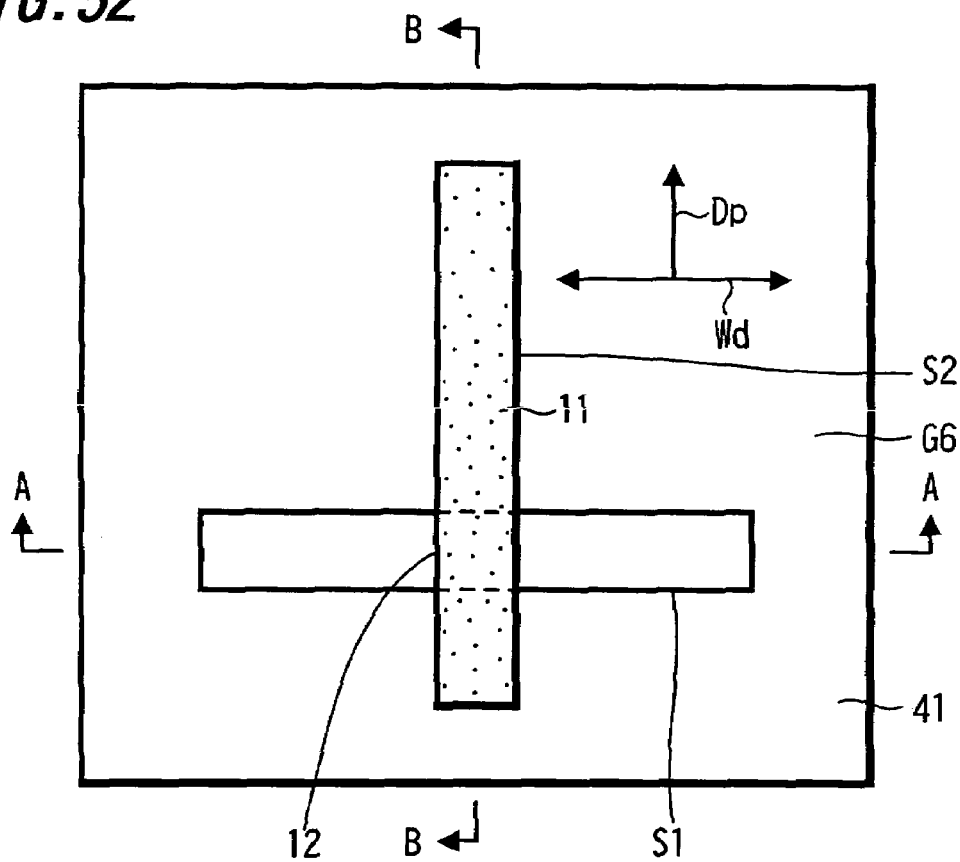
FIG. 52 is a schematic plan view of a process of a further example of a manufacturing method according to the present invention.
Figure 53:
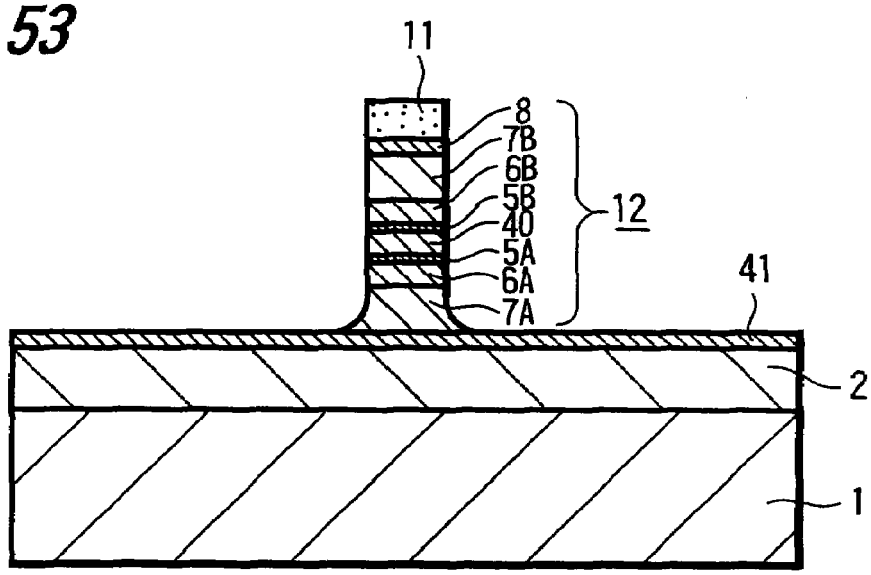
FIG. 53 is a schematic cross-sectional view taken along the line A-A in FIG. 52.
Figure 54:
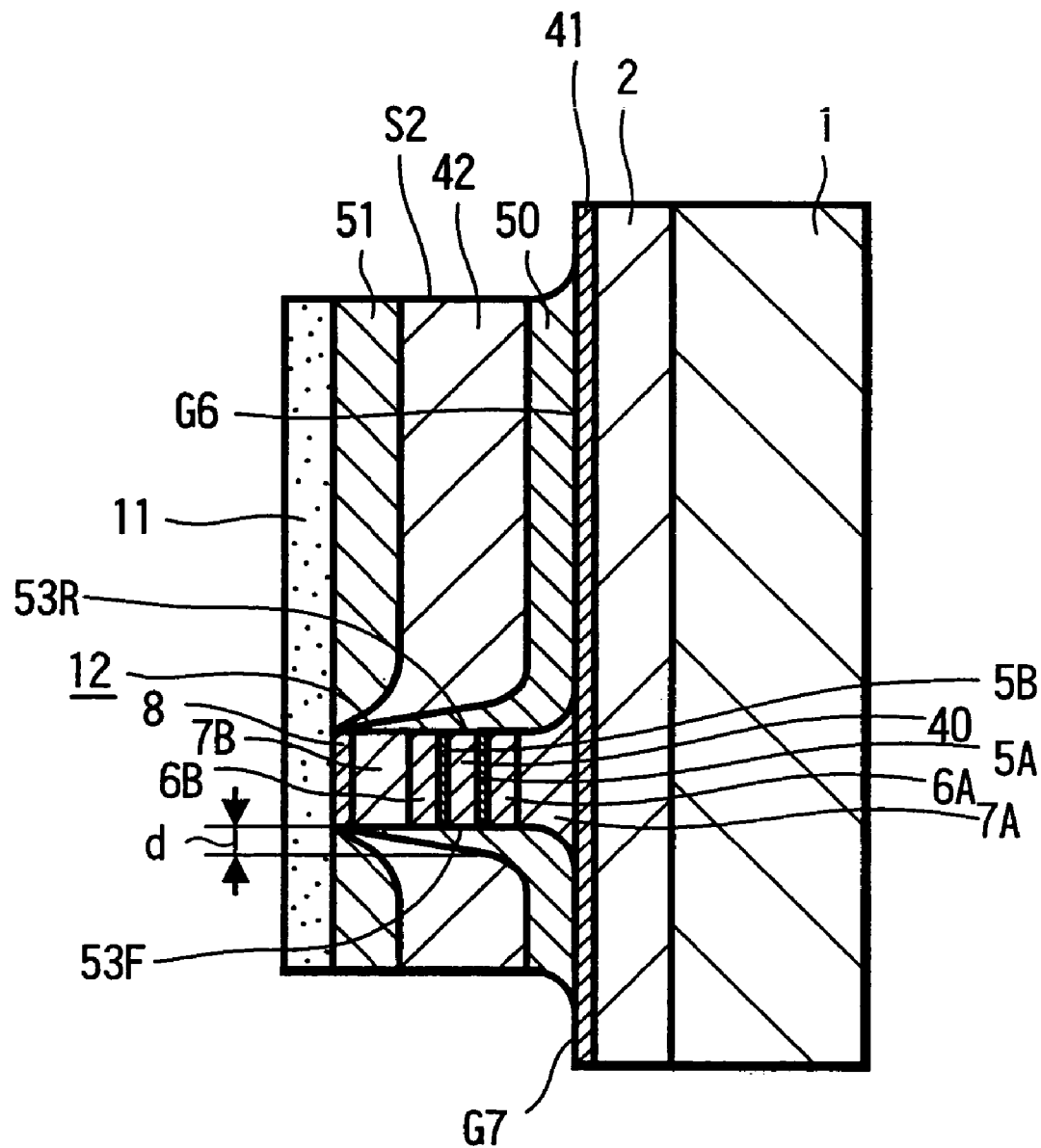
FIG. 54 is a schematic cross-sectional view taken along the line B-B in FIG. 52.

As FIG. 52 shows a schematic plan view and FIGS. 53 and 54 show schematic cross-sectional views taken along the line A-A and the line B-B in FIG. 52, respectively, while the mask 11 is being used as a patterning mask, a groove G7 is formed by etching the portion up to just above the underlayer 41 by ion milling using a high-sensitivity end detector such as SIMS, for example.

In this manner, there is formed the stripe portion S2 encircled by the groove G7 and which is extended in the depth direction.

Figure 56:
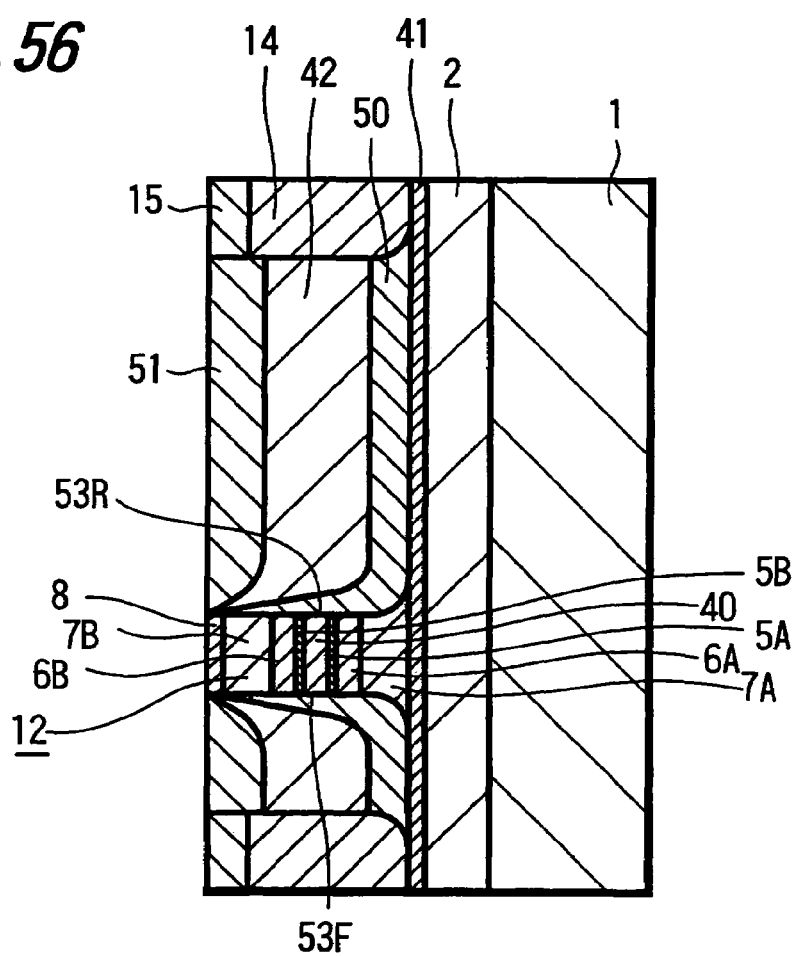
FIG. 56 is a schematic cross-sectional view of a process of a further example of a manufacturing method according to the present invention.

In the stripe portion S2 thus formed, there is formed a lamination layer structure portion 12 having a pair of SVMR configurations in which the above-mentioned antiferromagnetic layer 7A, the fixed layer 6A, the spacer 5A, i.e., the nonmagnetic conductive layer, the common free layer 40, the spacer 5B, i.e., nonmagnetic conductive layer, the fixed layer 6B, the antiferromagnetic layer 7B and the protective layer 8 are laminated with each other is formed at the portion in which this stripe portion S2 and the stripe-like lamination layer structure portion obtained before this stripe portion is formed cross each other. As shown in FIG. 56, there is formed a magnetic flux introducing layer 42 which is extended in the depth direction with a spacing corresponding to a thickness d of the insulating layer 50 deposited on the front and rear side surfaces 53F and 53R of the depth direction of the lamination layer structure portion 12 across the lamination layer structure portion 12.

Figure 55:
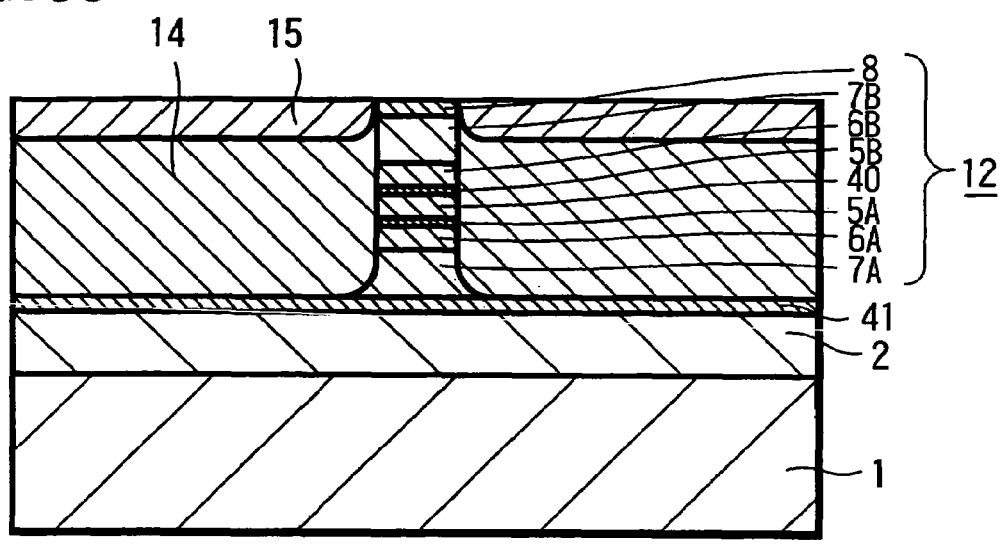
FIG. 55 is a schematic cross-sectional view of a process of a further example of a manufacturing method according to the present invention.

Thereafter, as FIGS. 55 and 56 show schematic cross-sectional views corresponding to the above-mentioned cross-sections taken along the line A-A and the line B-B, the hard magnetic layer 14 made of Co—γ Fe$_2$O$_3$ having a thickness of 53 nm, for example, and the insulating layer 15 made of Al$_2$O$_3$ having a thickness of 35 nm, for example, are deposited on the whole surface covering the groove G6 around the stripe portion 12 by sputtering, for example, the mask 11 is removed and the hard magnetic layer 14 and the insulating layer 15 are lifted off, whereafter the surface is made flat by planarization.

Figure 57:
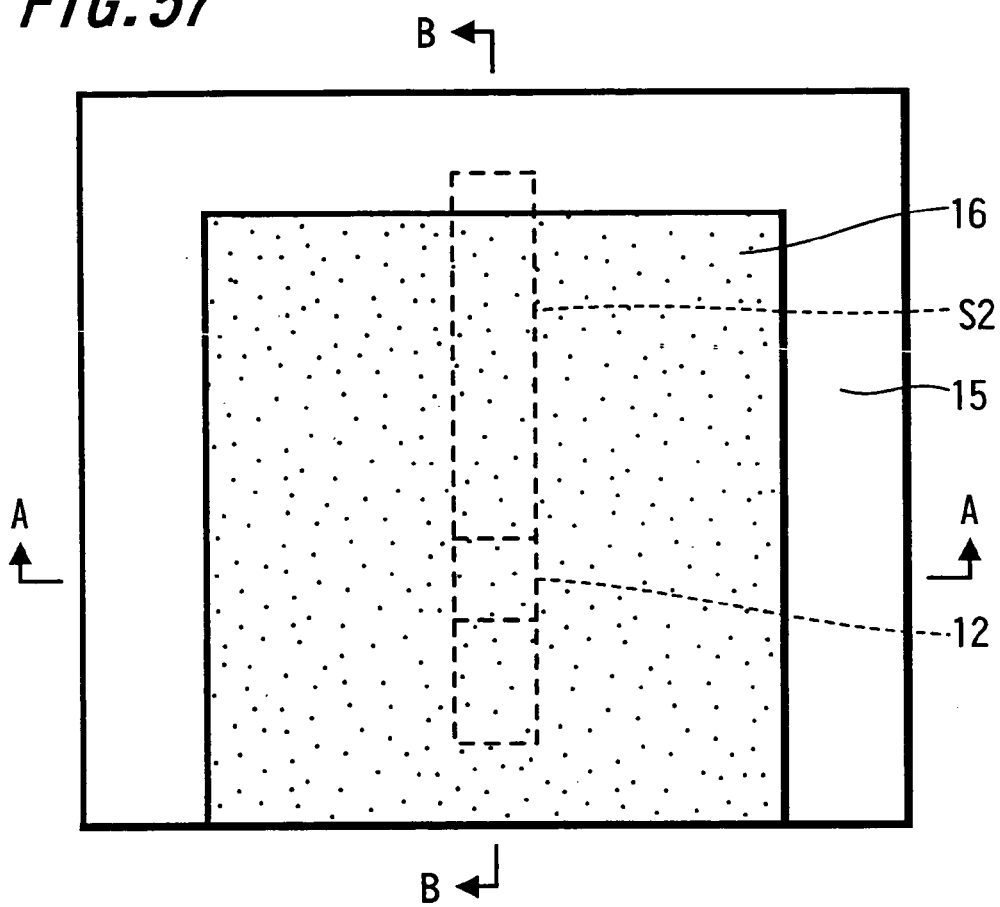
FIG. 57 is a schematic plan view of a process of a further example of a manufacturing method according to the present invention.
Figure 58:
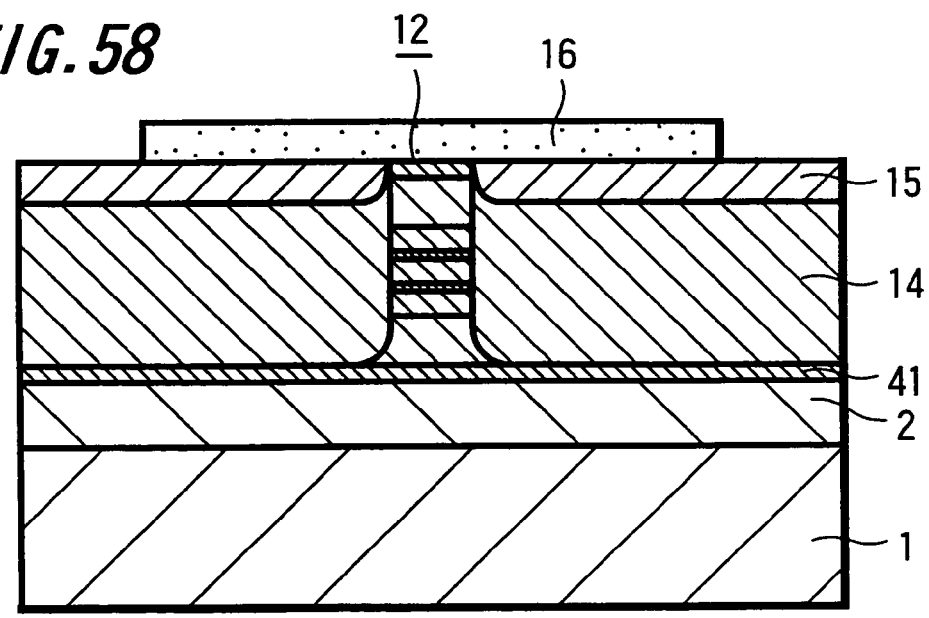
FIG. 58 is a schematic cross-sectional view taken along the line A-A in FIG. 57.
Figure 59:
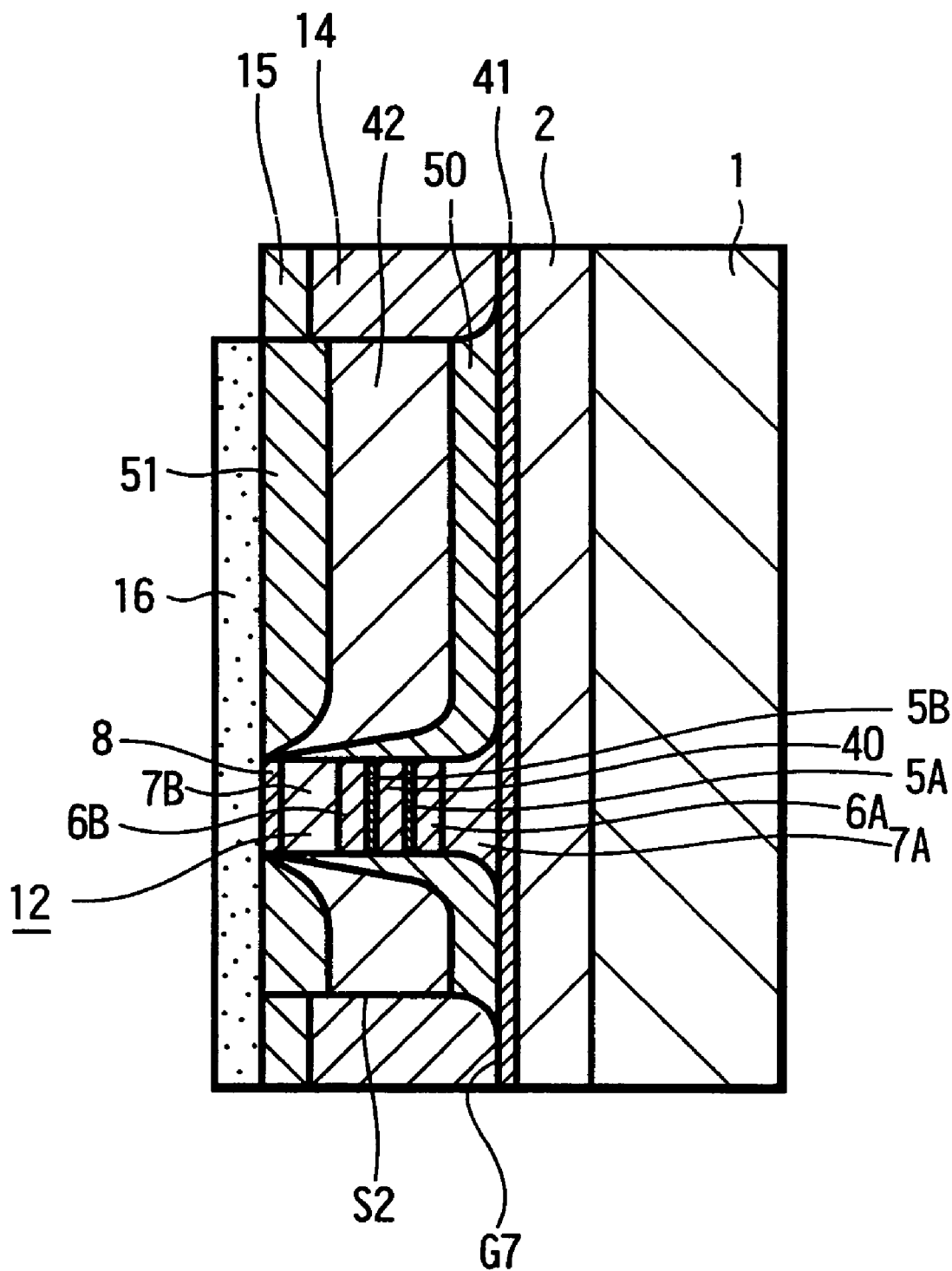
FIG. 59 is a schematic cross-sectional view taken along the line B-B in FIG. 57.

As FIG. 57 shows a schematic plan view and FIGS. 58 and 59 show schematic cross-sectional views taken along the line A-A and the line B-B in FIG. 57, a mask 16 which is used to leave the hard magnetic layer 14 on a predetermined portion of this flat surface and which is used to remove other portions is formed by photolithography using a photoresist, for example.

Figure 60:
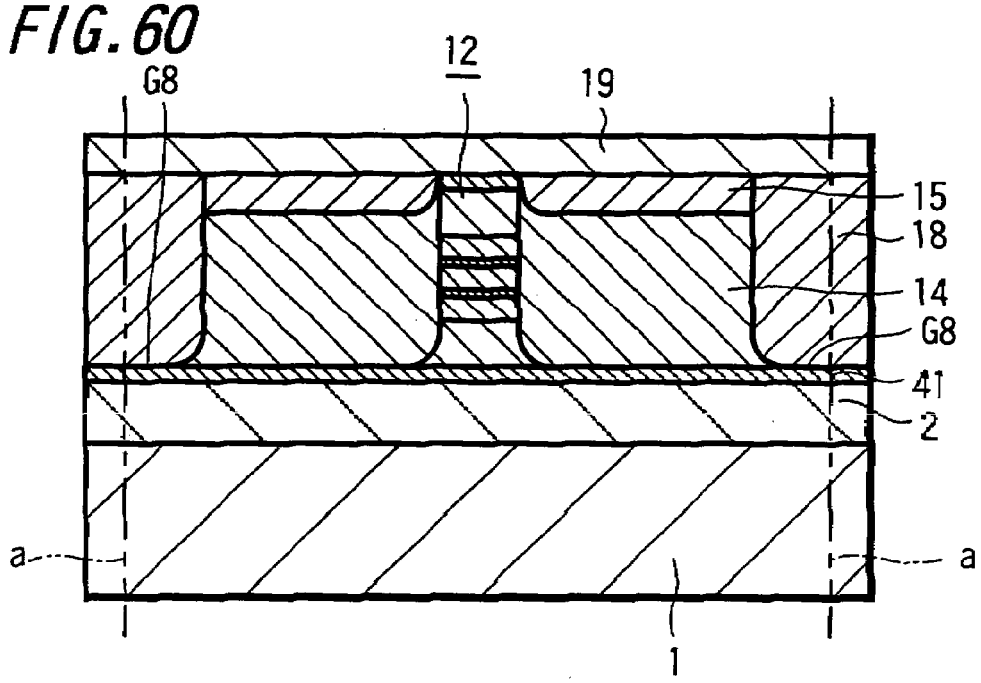
FIG. 60 is a schematic cross-sectional view of a process of a further example of a manufacturing method according to the present invention.
Figure 61:
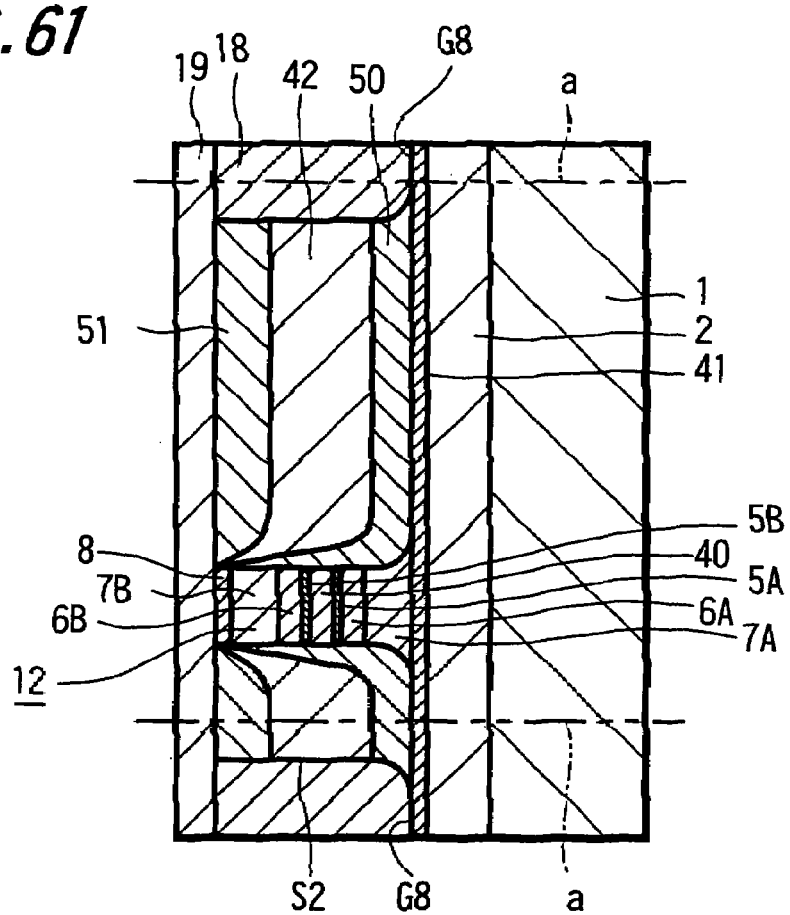
FIG. 61 is a schematic cross-sectional view of a process of a further example of a manufacturing method according to the present invention.

A portion exposed to the outside other than the portion in which the mask 16 is formed is removed by ion milling using this mask 16 and a groove G8 is formed as FIGS. 60 and 61 show schematic cross-sectional views corresponding to the cross-sections taken along the line A-A and the line B-B. An insulating layer 18 made of Al$_2$O$_s$, for example, is deposited on the whole surface including this groove G8 by sputtering or the like, the mask 16 is removed and the insulating layer 18 on this mask is lifted off, whereafter the surface is made flat by planarization.

Thereafter, a second shield and electrode layer 19 made of NiFe having a thickness of 2 µm, for example, is formed on this flat surface formed by planarization.

Figure 62:
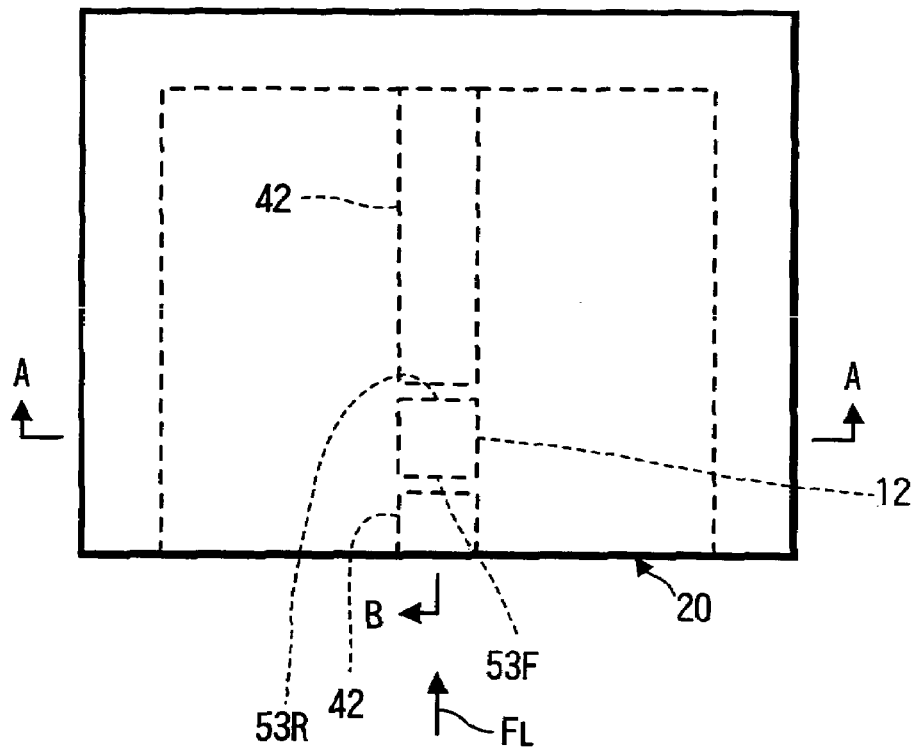
FIG. 62 is a schematic plan view of a process of a further example of a manufacturing method according to the present invention.
Figure 63:
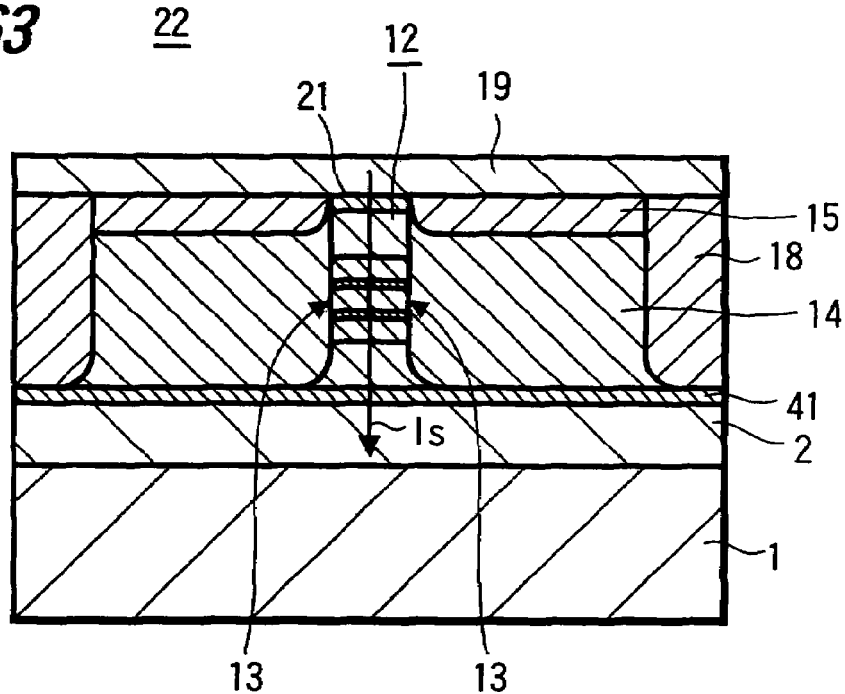
FIG. 63 is a schematic cross-sectional view taken along the line A-A in FIG. 62.
Figure 64:
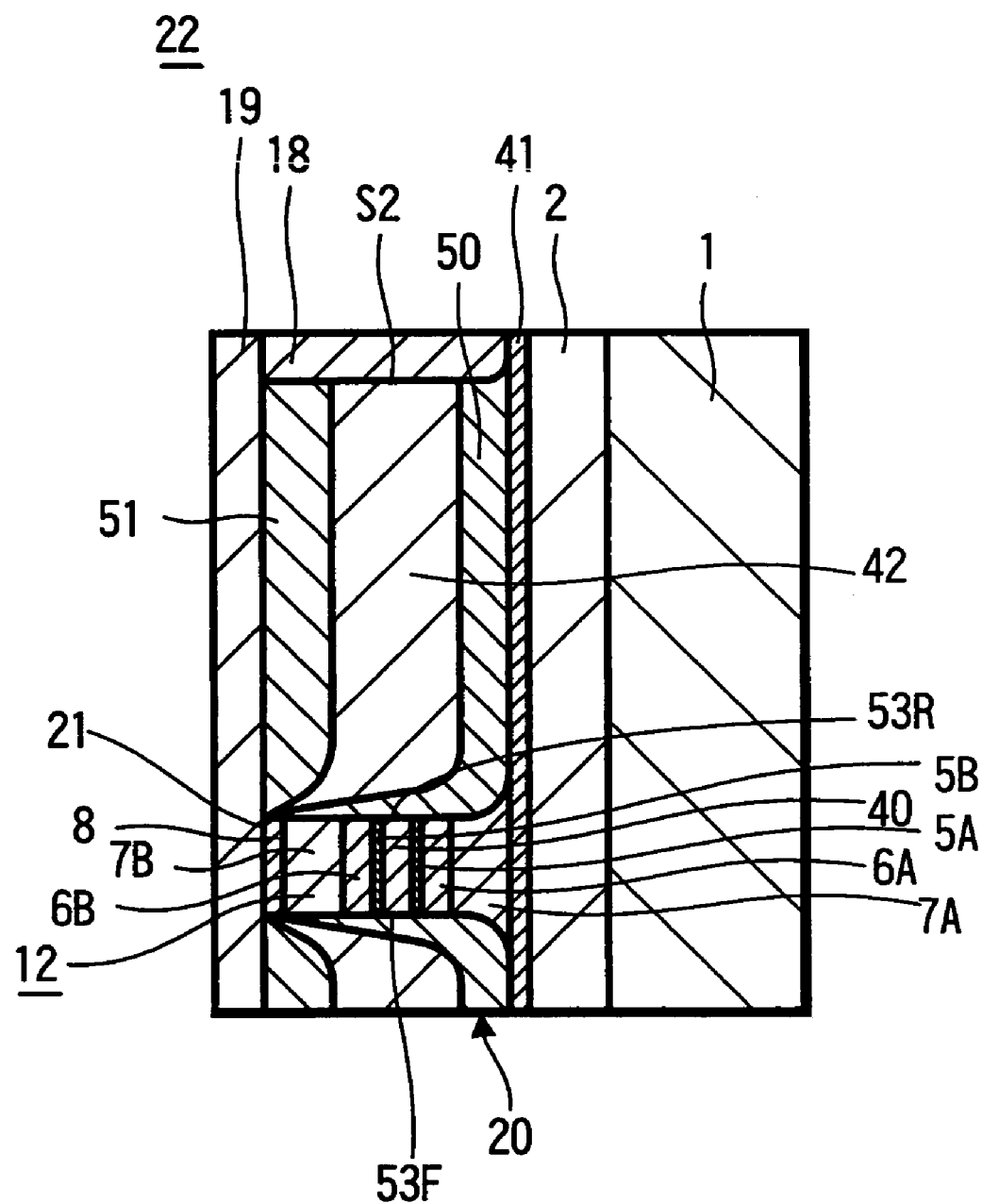
FIG. 64 is a schematic cross-sectional view taken along the line B-B in FIG. 62.

Then, the block thus formed is diced along a cutting line shown by a dot-and-dash line a in FIGS. 60 and 61. As FIG. 62 shows a schematic plan view and FIGS. 63 and 64 show schematic cross-sectional views taken along the line A-A and the line B-B in FIG. 62, there is polished a front surface 20 which becomes a surface which is brought in contact with or is opposed to a magnetic recording medium, e.g., ABS.

Thereafter, in the vacuum and at 250° C., with application of a magnetic field of 10 kOe parallel to the magnetic flux introducing direction, i.e., the direction in which the external magnetic field is applied, the surface of the antiferromagnetic layer 7 on the side of the fixed layer 6 is magnetized in the magnetization magnetic flux introducing direction, for example.

Moreover, in the vacuum and at 200° C., with application of a magnetic field of 1 kOe in the direction perpendicular to the magnetic flux introducing direction, a uniaxial magnetic induction anisotropy is given to the free layer 40.

Further, in the atmosphere and at a room temperature, a magnetic field of 10 kOe is applied to the direction perpendicular to the magnetic flux introducing direction and the hard magnetic layer 14 is magnetized in the direction extending along its plane direction and which direction is crossing the direction in which the stripe portion S2 is extended.

In this manner, the lamination layer structure portion 12 having the pair of SVMR configurations in which the spacer layers (nonmagnetic conductive layers) 5A and 5B, the fixed layers 6A and 6B and the antiferromagnetic layers 7A and 7B are sequentially laminated with each other across the common free layer 40 is limitedly formed at the portion in which the stripe portion S2 and the aforementioned stripe-like lamination layer structure portion S2 cross each other, i.e., the lamination layer structure portion is limitedly formed at the position advanced from the front surface 20 to the depth direction by a predetermined distance.

Then, in the forward and the rearward of this lamination layer structure portion 12, the magnetic flux introducing layers 42 are formed at a front side surface 53F and a rear side surface 53R of the lamination layer structure portion 12 through the insulating layer 50 in such a manner that the front side surface and the rear side surface may be coupled together from a magnetic standpoint and that they may be insulated from each other from an electrical standpoint.

In this manner, the GMR element 21 is formed, and there is constructed the inventive magneto-resistive effect head 22 having the SVMR configuration using this element as the magnetic sensing portion thereof.

Then, also in the GMR element having this configuration, i.e., the magneto-resistive effect element and the magnetic head using magneto-resistive effect 22, as shown in FIG. 63, the sense current Is flows through the first and second shield and electrode layers 2 and 19 from one to the other. That is, the magneto-resistive effect element has the CPP configuration in which the sense current flows through the lamination layer direction of the lamination layer structure portion 12.

Then, the tip end of the magnetic flux introducing layer 40 is opposed to the front surface 20. An external magnetic field, i.e., in the magnetic head, a signal magnetic field based upon magnetic recording on the magnetic recording medium is introduced from this tip end and introduced into the lamination layer structure portion 12 formed at the position advanced from this front surface 20 to the depth direction by the predetermined distance, thereby causing a spin-dependence scattering to occur relative to the above-mentioned sense current Is. Specifically, the change of resistance is produced and this change of resistance is produced as an electrical output based upon the sense current Is.

Then, in the third embodiment, while the external magnetic field is introduced into the lamination layer structure portion 12 having the SVMR configuration by the magnetic flux introducing layer 42, since the magnetic flux introducing layers 42 are opposed to the front side surface 53F and the rear side surface 53R of the lamination layer structure portion 12 through the insulating layer 50 having the depth d in an electrically isolated opposing fashion, when the magneto-resistive effect element has the CPP configuration in which the sense current flows through the film thickness direction of the lamination layer structure portion 12 and the magnetic flux introducing layer 42 is made of the above-mentioned conductive NiFe, it is possible to avoid efficiency from being lowered due to the leakage of the sense current to the magnetic flux introducing layer 42.

Then, also in the case of this configuration, since the magneto-resistive effect element has the CPP type configuration, the characteristics in this CPP configuration can be demonstrated, i.e., the area of the magneto-resistive effect type element can be reduced by the low resistance presented when the sense current flows through the film thickness direction, accordingly, the magneto-resistive effect element can increase its density. Also, since the first and second shield and electrode layers 2 and 19 which are high in heat conductivity are thermally disposed close to each other, the magneto-resistive effect element has the highly-reliable configuration which is excellent in heat radiation effect and which can continue stable operations.

Moreover, since the side surfaces of the respective layers of the lamination layer structure portion 12 are formed as the side surfaces 13 which form substantially the same surface, similarly to the above-mentioned manufacturing method according to the present invention, the respective layers can be formed with the same pattern by the same process, and the manufacturing can be simplified.

Moreover, as described above, since the positional relationship between the hard magnetic layer 14 and the free layer 40 is selected in such a manner that the central portions of both of the hard magnetic layer and the free layer in the film thickness directions substantially agree with each other, as mentioned before, the bias magnetic field can effectively be applied to the free layer from the hard magnetic layer 14 and hence the stability of the free layer can be improved more.

For example, when the free layer 40 has the trilayer structure comprised of CoFe having a thickness of 2 nm, NiFe having a thickness of 3 nm and CoFe having a thickness of 2 nm, its $Ms_F \times t_F$ becomes 0.76 emu/cm$^3$. In the case of the hard magnetic layer 14 made of Co—γ Fe$_2$O$_3$, its thickness is made sufficiently larger than that of the free layer 40, e.g., 53 nm and $Ms_H \times t_H$ becomes 1.33 emu/cm$^3$.

Moreover, since the magneto-resistive effect element has the shield type configuration in which the front end faces of the first and second shield and electrode layers 2 and 19 are opposed to the front surface 20, the introduction of the external magnetic field can be restricted and hence the magnetic head using magneto-resistive effect can be constructed as a head which is high in resolution.

Further, since the stripe portion 21 is operated at its portion behind the lamination layer structure portion 12, i.e., at its portion opposite to the front surface 20 as a magnetic flux induction portion, magnetic flux leaked from the lamination layer structure portion 12 to the shield portion, in this example, the shield and electrode layers 2 and 19 can be reduced, and hence the magneto-resistive effect can be improved.

Figure 65:
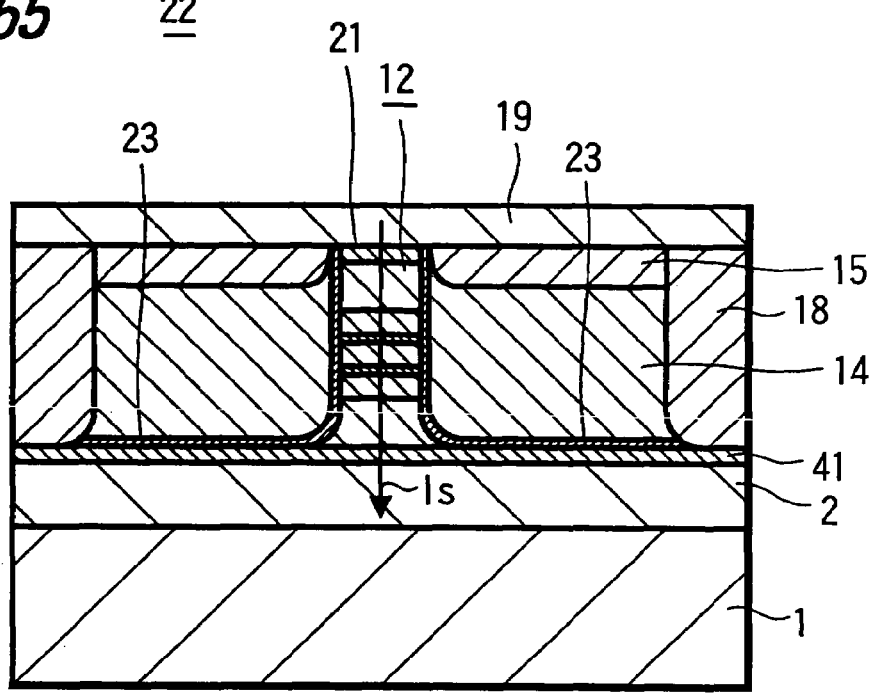
FIG. 65 is a schematic cross-sectional view of a further example of a magnetic head using magneto-resistive effect according to the present invention.

While the hard magnetic layer 4 is made of the high-resistance material in the above-mentioned example, when this hard magnetic layer 14 is made of a material of low resistance, e.g., CoCrPt, as FIG. 65 shows a schematic cross-sectional View corresponding to FIG. 63, before the hard magnetic layer 14 is formed, an insulating layer 23 such as SiO$_2$ and SiN is deposited on which there is formed the hard magnetic layer 14, whereby the sense current Is between the first and second shield and electrode layers 2 and 19 can be avoided from being leaked through the hard magnetic layer 14.

Moreover, also in this embodiment, similarly to the description that has been so far made with reference to FIG. 21, the magnetic head using magneto-resistive effect can be constructed as a magnetic recording and reproducing head by laminating an electromagnetic induction type thin-film magnetic recording head 30, for example, onto-the magnetic head using magneto-resistive effect.

While the magneto-resistive effect element having the SVMR configuration and the magnetic head using magneto-resistive effect using this magneto-resistive effect element as the magnetic sensing portion are constructed in the above-mentioned respective embodiments as other embodiment, a magneto-resistive effect element having a tunnel type magneto-resistive effect, i.e., TMR configuration and a magnetic head using magneto-resistive effect using this magneto-resistive effect element as a magnetic sensing portion can be constructed.

In this TMR configuration, the TMR configuration can be obtained by replacing the spacer layers 5, 5A, 5B with a tunnel barrier layer formed of an Al$_2$O$_3$ layer having a thickness of 0.7 nm, for example, in the aforementioned respective embodiments and their examples.

Figure 66:
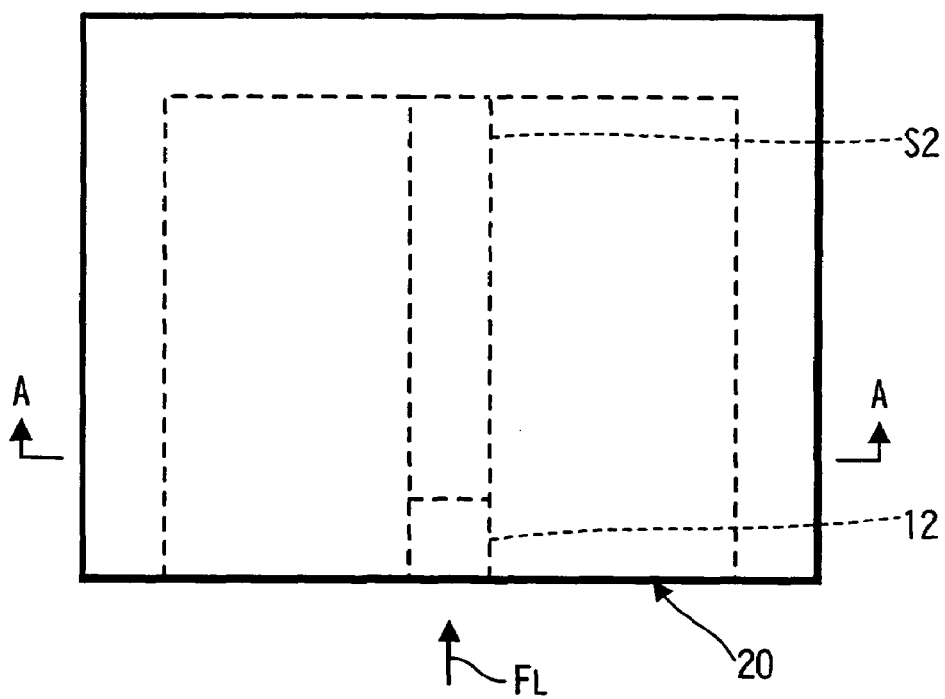
FIG. 66 is a schematic plan view of other example of a magnetic head using-magneto-resistive effect according to the present invention.

Moreover, while the lamination layer structure portion 12 is located behind the front surface 20 in the above-mentioned respective embodiments and examples, as shown in FIG. 66, the lamination layer structure portion can be formed at the position in which it is opposed to the front surface 20.

The magneto-resistive effect element and the magnetic head using magneto-resistive effect using this magneto-resistive effect element as its magnetic sensing portion and the manufacturing methods thereof are not limited to the above-mentioned respective embodiments and these examples and can be variously modified and changed in the configuration of the present invention.

Since the magnetic head including the magnetic sensing portion formed of the above-mentioned magneto-resistive effect element having the SVMR configuration or the TMR configuration according to the present invention have opposing side surfaces which are formed as one flat surface or continuous one curved surface with substantially the same width at least in the free layer into which the external magnetic field is introduced, the nearby layers, i.e., the spacer layer which serves as the substantial operating portion which can achieve the magneto-resistive effect, i.e., the nonmagnetic conductive layer or the tunnel barrier layer and in the fixed layer, the width of this portion can be reduced necessarily and sufficiently, and hence the sense current can be concentrated on this SVMR configuration portion or the TMR configuration portion, thereby making it possible to increase the magneto-resistive effect. Accordingly, there can be constructed the magneto-resistive effect element which can detect the external magnetic field with high sensitivity or the magnetic head which can increase the detection output of the signal magnetic field from the magnetic recording medium.

Further, as described above, in the magneto-resistive effect element, when the positional relationship between the hard magnetic layer and the free layer is selected in such a manner that the central portions of both of the hard magnetic layer and the free layer in the film thickness directions substantially agree with each other, the magnetic field can be effectively applied to the free layer from the hard magnetic layer, and hence the stability of the free layer can be improved more.

Specifically, the hard magnetic layer can reliably cancel the magnetic domain produced at the end portion of the free layer and hence a Barkhausen noise which causes the magnetization rotation in the free layer to become discontinuous against the external magnetic field can be improved.

Therefore, the magnetic head using magneto-resistive effect using the above-mentioned magneto-resistive effect element as the magnetic sensing portion thereof can, as has been so far described in the preamble, achieve the characteristics of the CPP type configuration, i.e., the area can be reduced and the density can be increased. Moreover, since the first and second shield and electrode layers which are high in heat conductivity are thermally disposed close to each other across the lamination layer structure portion, the magnetic head using magneto-resistive effect has the highly-reliable configuration which is high in heat radiation effect and which can continue stable operations.

Then, furthermore, according to the present invention, since the side surfaces of the respective layers of its lamination layer structure portion 14 are formed as the side surfaces 13 which form substantially the same plane, similarly to the above-mentioned manufacturing method according to the present invention, the respective layers can be formed with the same pattern by the same process and hence the manufacturing can be simplified.

The invention claimed is:

1. A magnetic head using magnetoresistive effect comprising:
   a magnetic sensing portion formed of a magnetoresistive effect element, wherein:
   said magnetic sensing portion includes a lamination layer structure portion in which at least a free layer made of a soft magnetic material in which the magnetization is rotatable in response to an external magnetic field, a fixed layer made of a ferromagnetic material, an antiferromagnetic layer for fixing the magnetization of said fixed layer, and a spacer layer interposed between said free layer and said fixed layer are laminated together in a thickness direction of the magnetic sensing portion;
   said lamination layer structure portion further includes a magnetic flux introducing layer of which a side end surface is opposed to a surface of the magnetic head which is brought in contact with or opposed to a magnetic recording medium, and said magnetic flux introducing layer formed directly on said free layer;
   said lamination layer structure portion has along the thickness direction opposing side surfaces of at least said free layer, said magnetic flux introducing, said spacer layer and said fixed layer formed of one flat surface or one continuous curved surface;
   a hard magnetic layer for maintaining a magnetic stability of said free layer is disposed in direct contact with said opposing surfaces or through an insulating layer;
   a sense current for said lamination layer structure portion flows through said lamination layer structure portion in the thickness direction; and
   an external magnetic field is applied to the direction extended along the plane direction of said lamination layer structure portion and which is extended substantially along said opposing side surfaces.

2. A magnetic head using magnetoresistive effect comprising:
   a magnetic sensing portion formed of a magnetoresistive effect element, wherein;
   said magnetic sensing portion includes a lamination layer structure portion in which at least first and second fixed layers made of ferromagnetic materials, first and second antiferromagnetic layers for fixing the magnetizations of said fixed layers and first and second spacer layers interposed between free layers and said first and second fixed layers are laminated together in a thickness direction of the magnetic sensing portion across both surfaces of said free layers made of soft magnetic materials of which the magnetizations are rotatable in response to an external magnetic field;
   said lamination layer structure portion further includes a magnetic flux introducing layer of which a side end surface is opposed to a surface of the magnetic head which is brought in contact with or opposed to a magnetic recording medium, and said magnetic flux introducing layer formed along the thickness direction on opposing side surfaces of at least said free layer, said spacer layer and said fixed layer;
   said lamination layer structure portion has along the thickness direction opposing side surfaces of at least said free layer, said spacer layer and said fixed layer formed of one flat surface or one continuous curved surface;
   a hard magnetic layer for maintaining a magnetic stability of said layer is disposed in direct contact with said opposing surfaces or through an insulating layer;
   a sense current for said lamination layer structure portion flows through said lamination layer structure portion in the thickness direction; and
   an external magnetic field is applied to the direction extended along the plane direction of said lamination layer structure portion and which is extended substantially along said opposing side surfaces.

3. A magnetic head using magnetoresistive effect according to claim 1 or 2, wherein said spacer layer is formed of a nonmagnetic conductive layer.

4. A magnetic head using magnetoresistive effect according to claim 1 or 2, wherein said spacer layer is made of a tunnel barrier layer.

5. A magnetic head using magnetoresistive effect according to clam 1 or 2, wherein said hard magnetic layer and said free layer are disposed in such a manner that a central portion in a thickness direction of said hard magnetic layer substantially agrees with a central portion in a thickness direction of said free layer.

6. A magnetic head using magnetoresistive effect comprising:
   a magnetic sensing portion formed of a magnetoresistive effect element, wherein,
   said magnetic sensing portion includes a lamination layer structure portion in which at least a magnetic flux introducing layer made of a soft magnetic material of which the magnetization is rotatable in response to an external magnetic field, a fixed layer made of a ferromagnetic material, an antiferromagnetic layer for fixing the magnetization of said fixed layer, a spacer layer interposed between said magnetic flux introducing layer and said fixed layer and a free layer formed directly on said magnetic flux introducing layer are laminated together in a thickness direction of the magnetic sensing portion, wherein a side end surface of said magnetic flux introducing layer is opposed to a surface which is brought in contact with or opposed to a magnetic recording medium;
   said lamination layer structure portion has at the thickness direction opposing side surfaces of at least said magnetic flux introducing layer, said free layer, said spacer layer and said fixed layer formed of one flat surface or one continuous curved surface;
   a hard magnetic layer for maintaining a magnetic stability of said magnetic flux introducing layer is disposed in direct contact with said opposing surfaces or through an insulating layer;
   a sense current for said lamination layer structure portion flows through said lamination layer structure portion in the thickness direction; and
   an external magnetic field is applied to the direction extended along the plane direction of said lamination layer structure portion and which is extended substantially along said opposing side surfaces.

7. A magnetic head using magnetoresistive effect comprising:

a magnetic sensing portion formed of a magnetoresistive effect element, wherein, said magnetic sensing portion includes a lamination layer structure portion in which at least first and second fixed layers made of ferromagnetic materials, first and second antiferromagnetic layers for fixing the magnetizations of said fixed layers and first and second spacer layers interposed between magnetic flux introducing layers and said first and second fixed layers are laminated with together in a thickness direction of the magnetic sensing portion across both surfaces of said magnetic flux introducing layers made of soft magnetic materials of which the magnetizations are rotatable in response to an external magnetic field, and one of said magnetic flux introducing layers formed directly on one of said first and second spacer layers, wherein a side end surface of said magnetic flux introducing layer is opposed to a surface which is brought in contact with or opposed to a magnetic recording medium;

said lamination layer structure portion has at the thickness direction opposing side surfaces of at least said magnetic flux introducing layer, said spacer layer and said fixed layer formed of one flat surface or one continuous curved surface;

a hard magnetic layer for maintaining a magnetic stability of said layer is disposed in direct contact with said opposing surfaces or through an insulating layer;

a sense current for said lamination layer structure portion flows through said lamination layer structure portion in the thickness direction; and an external magnetic field is applied to the direction extended along the plane direction of said lamination layer structure portion and which is extended substantially along said opposing side surfaces.

* * * * *